(12) United States Patent
Ito et al.

(10) Patent No.: US 6,223,328 B1
(45) Date of Patent: *Apr. 24, 2001

(54) WIRE PROCESSING METHOD, WIRE PROCESSING EQUIPMENT, AND RECORDING MEDIUM FOR WIRE PROCESSING PROGRAM USED IN DESIGNING A LARGE SCALE INTEGRATED CIRCUIT

(75) Inventors: Noriyuki Ito; Tomoyuki Isomura; Hiroshi Ikeda; Toshihiko Tada, all of Kawasaki (JP)

(73) Assignee: Fujitsu, Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/896,079

(22) Filed: Jul. 17, 1997

(30) Foreign Application Priority Data

Dec. 3, 1996 (JP) ..................................................... 8-323100

(51) Int. Cl.[7] ...................................................... G06F 17/50
(52) U.S. Cl. ................................................... 716/6; 716/12
(58) Field of Search .................................... 364/488–491; 716/6, 2, 5, 7, 12

(56) References Cited

U.S. PATENT DOCUMENTS

| 5,109,168 | * | 4/1992 | Rusu ........................... 326/47 |
| 5,198,987 | * | 3/1993 | Shindo et al. .................. 716/16 |
| 5,375,069 | * | 12/1994 | Satoh et al. .................... 716/14 |

(List continued on next page.)

FOREIGN PATENT DOCUMENTS

| 3-76144 | 4/1991 | (JP) . |
| 5-54100 | 3/1993 | (JP) . |
| 5-128214 | 5/1993 | (JP) . |

OTHER PUBLICATIONS

Sato et al "Post–Layout Optimization for Deep Submicron Design," ACM, pp. 1–6, Jan. 1996.*

Yamakoshi et al "Generalised Elmore Delay Expression for Distributed RC Tree Networks," Electronics Letters, vol. 29, No. 7, pp. 617–618, Apr. 1993.*

Fishburn et al "A Distributed RC Line to Minim IZE Elmore Delay," IEEE, pp. 1020–1022, Dec. 1995.*

(List continued on next page.)

*Primary Examiner*—Matthew Smith
*Assistant Examiner*—Vuthe Siek
(74) *Attorney, Agent, or Firm*—Armstrong Westerman Hattori McLeland & Naughton, LLP

(57) ABSTRACT

The invention concerns a technique of a wiring processing method used in designing, for example, a large scale integrated circuit. The wiring processing method of the invention is provided with: a segment dividing step for dividing a wiring connecting between two receivers of a clock net into three or more segments; an equal delay branch segment determining step for comparing a first delay time from one branch point on one end of the segment to one receiver with a second delay time from the one branch point to the other receiver, and comparing a third delay time from the other branch point on the other end of the segment to the one receiver with a fourth delay time from the other branch point to the other receiver, and determining a segment in which a magnitude of the first delay time against the second delay time and a magnitude of the third delay time against the fourth delay time are inverted as an equal delay branch segment; and an equal delay branch point determining step for determining an equal delay branch point in the equal delay branch segment. Thus, the equal delay branch point is accurately determined, and thereby the clock skew on the clock distributing circuit in a clock synchronous circuit is reduced.

21 Claims, 36 Drawing Sheets

U.S. PATENT DOCUMENTS

| | | | | |
|---|---|---|---|---|
| 5,410,491 | * | 4/1995 | Minami | 716/6 |
| 5,557,779 | * | 9/1996 | Minami | 716/6 |
| 5,651,012 | * | 7/1997 | Jones, Jr. | 714/724 |
| 5,656,963 | * | 8/1997 | Masleid et al. | 327/297 |
| 5,784,289 | * | 7/1998 | Wang | 716/8 |
| 5,787,268 | * | 7/1998 | Sugiyama et al. | 716/11 |

OTHER PUBLICATIONS

Cong et al "Optimal Wiresizing Under Elmore Delay Model," IEEE, pp. 321–336, Mar. 1995.*

Peter R. O'Brien et al.; IEEE; pp. 512–515; 1989.

Ren–Song Tsay; IEEE; pp. 336–339; 1991.

* cited by examiner

EXTRA SOURCE GATE DELAY

SOURCE INTERCONNECT LOAD
(LENGTH=L)

SEARCH SEGMENT

AVAILABLE FLAG (1=AVAILABLE)

ARRIVAL STATE FLAG (1=ARRIVED)

XY-DIRECTION FLAG (1=X-DIRECTION)

POSITIVE-NEGATIVE DIRECTION FLAG (1=POSITIVE DIRECTION)

SEARCH SEGMENT

AVAILABLE FLAG    (1=AVAILABLE)

ARRIVAL STATE FLAG    (1=ARRIVED)

XY-DIRECTION FLAG    (1=X-DIRECTION)

POSITIVE-NEGATIVE DIRECTION FLAG    (1=POSITIVE DIRECTION)

SEARCH SEGMENT

AVAILABLE FLAG (1=AVAILABLE)

ARRIVAL STATE FLAG (1=ARRIVED)

XY-DIRECTION FLAG (1=X-DIRECTION)

POSITIVE-NEGATIVE DIRECTION FLAG (1=POSITIVE DIRECTION)

SEARCH SEGMENT

AVAILABLE FLAG  (1=AVAILABLE)

ARRIVAL STATE FLAG  (1=ARRIVED)

XY-DIRECTION FLAG  (1=X-DIRECTION)

POSITIVE-NEGATIVE DIRECTION FLAG  (1=POSITIVE DIRECTION)

SEARCH SEGMENT

SEARCH PATH

AVAILABLE FLAG (1=AVAILABLE)

ARRIVAL STATE FLAG (1=ARRIVED)

XY-DIRECTION FLAG (1=X-DIRECTION)

POSITIVE-NEGATIVE DIRECTION FLAG (1=POSITIVE DIRECTION)

SEARCH SEGMENT

SEARCH PATH

SEARCH SEGMENT

SEARCH PATH

— LEVEL 0
--- LEVEL 1
-·- LEVEL 2

WIRE PROCESSING METHOD, WIRE PROCESSING EQUIPMENT, AND RECORDING MEDIUM FOR WIRE PROCESSING PROGRAM USED IN DESIGNING A LARGE SCALE INTEGRATED CIRCUIT

BACKGROUND OF THE INVENTION

1. Field of the Invention

The present invention relates to a wiring processing method, wiring processing equipment, and recording medium for a wiring processing program suitable for use in designing a large scale integrated circuit (LSI) using the computer aided design (CAD) system.

In clock nets on a clock distributing circuit of a clock synchronous circuit, to equalize the delay time (propagation delay time of a clock) from a clock generator (driver) to each of clock receivers, namely, to decrease a clock skew being a difference of a clock propagation delay time is a very important technique for stabilizing the operation of the clock distributing circuit. If the clock skew is large, the receivers on the nets will have a problem with synchronizing operation on the nets; and therefore, the clock skew of the clock distributing circuit has to be reduced.

Further, to minimize the lengths of wirings to connect circuit elements on an LSI and to enhance quality of wiring is necessary to speed up the processes in the LSI.

In this case, to estimate a possibility of a wiring before executing the wiring and from the possibility to improve a layout of the circuits and to optimize a wiring area should also be considered.

Especially at present, a wiring objective is inclined to have a gigantic scale, and an early estimation and evaluation of the possibility of wirings has increased the need.

2. Description of the Related Art

There have been many reports on the wiring processing method for reducing the clock skew, namely, a difference of a clock propagation delay time in the clock synchronous circuit.

The IBM method will hereunder be described which is a typical wiring processing method for reducing the clock skew. This method is detailed in 'Ren-Song Tsay, "Exact zero skew", Proc. IEEE Int. Conference on CAD, pp336–339, 1991'.

Before explaining the wiring processing method for reducing a clock skew, first, FIG. 34 illustrates a configuration of a clock tree in a clock net on a clock distributing circuit of a clock synchronous circuit.

A clock tree 130 comprises a sub-clock tree consisting of a clock receiver (receiving circuit) 112 and a wiring 118 and another sub-clock tree consisting of a clock receiver (receiving circuit) 115 and a wiring 121, which are connected at an equal delay branch point (tapping point) "x" where the sub-clock trees have an equal delay.

Thus, in the clock tree 130, a clock driver (clock generator) not illustrated in FIG. 34 supplies a clock signal to the receiver 112 and 115 through the equal delay branch point "x".

Here, the receiver 112 is composed of a flip-flop (time constant $t_1$) 113 and a capacitor (capacitance $C_1$) 114, and the receiver 115 is composed of a flip-flop (time constant $t_2$) 116 and a capacitor (capacitance $C_2$) 117.

The wire 118 forms a Π type RC circuit consisting of one resistor (resistance $r_1$) 119 and two capacitors (capacitance $c_1/2$) 120.

Further, in the same manner as the wire 118, the wire 121 also forms the Π type RC circuit consisting of one resistor (resistance $r_2$) 122 and two capacitors (capacitance $c_2/2$) 123.

Here, the reason that a wiring between the receiver 112 and 115 is represented by means of the one Π type RC circuit in FIG. 34 will now be described.

First, a close look at one sub-clock tree is requested.

FIG. 32 illustrates a model for a clock tree with a buffer, and as shown in this figure, the clock tree with a buffer 100 comprises a clock generator (clock source) 101 as the driver, a clock receiver (latch) 103 as the receiver, and a buffer 102 through which the former two are connected.

Here, the clock source 101 is connected to the buffer 102 through a wire 104 and the buffer 102 is connected to the latch 103 through the wire 105.

This clock tree 100 has a configuration as shown in FIG. 33 in detail.

The clock source 101 has a resistor (resistance $r_s$) 106; the buffer 102 has a delay circuit (internal delay time $d_b$) 111, a resistor (resistance $r_b$) 107, and a capacitor (capacitance $c_b$) 109; the latch 103 has a capacitor (capacitance $c_1$) 110.

The delay time from the clock source 101 to the latch 103 includes the delay time due to the wiring resistors and capacitors of the wiring 104 and 105, and the internal delay time $d_b$ by the delay circuit 111 of the buffer 102.

The wiring resistor has become a big problem as not negligible, since the size of transistors and the cross-sectional area of wirings have decreased owing to the recent progress in the semiconductor microstructuring technique.

Accordingly, it has become necessary to deal with the wiring 104 and 105 as a distributed constant circuit from accuracy for estimating the delay time. Generally, as shown in FIG. 33, the wiring 104 and 105 have been evaluated by means of the Π type RC circuit composed of one resistor (resistance $r_s$) 106 and two capacitors (capacitance $c_1/2$) 108 as a concentrated constant circuit being a typical form of the distributed constant circuit.

Incidentally, the equal delay branch point "x" is an input point of a clock from the driver (clock generator) not illustrated in FIG. 34.

In the clock tree 130 shown in FIG. 34, the clock skew by the two sub-clock trees of the clock tree 130 varies depending on the position of the equal delay branch point "x". Therefore, the position of the equal delay branch point "x" has to be set very accurately so as to reduce the clock skew in the clock tree 130.

According to the method (zero-skew-merge) to determine the equal delay branch point "x" in the wiring between the two sub-clock trees, the equal delay branch point "x" is known to satisfy the following equation.

$$r_1 (c_1/2+C_1)+t_1=r_2 (c_2/2+C_2)+t_2.$$

Where L, α, β are given as below,
L: wiring length between the two sub-clock trees
α: resistance for unit length of the line
β: capacitance for unit length of the line the equal delay branch point "x" is determined by the following:

$$x=[(t_2-t_1)+\alpha L (C_2+\beta L/2)]/[\alpha L (\beta L+C_1+C_2)].$$

Incidentally, circuits on an LSI are connected through optimum wiring paths searched by means of an automatic wiring system.

There have been many reports on the automatic searching method for wiring paths, and the Mikami-Tabuchi method as a kind of the line segment searching method will hereafter be described.

The line segment searching method is a method to search wiring paths while sequentially generating vertical or horizontal probes, which has an advantage in a high speed processing with a small storage capacity.

In the Mikami-Tabuchi method, as shown in FIG. 35, first, temporal line segments of level 0 are generated in the horizontal direction from the search start point S and the search end point T. Where there is no overlapping with these temporal line segments, next, temporal line segments of level 1 intersecting vertically to the line segments of level 0 are generated.

And, repeating these steps, when the temporal line segments from both sides intersect, the intersecting line segments are searched backward, thereby finding a wiring path, for example, as shown in FIG. 36.

The Mikami-Tabuchi method can find a wiring path invariably where there is a wiring path, however, the number of the temporal line segments increases rapidly as the level increases, and in the worst case, as many temporal line segments as the number of the grids have to be searched. Thus, the method is applied wherein the level number of the temporal line segments is limited to, for example, 2 or 3.

However, in the clock tree 130 as shown in FIG. 34, the foregoing wiring 118 and 121 each are evaluated by means of a single Π type RC circuit (Π type RC model).

This is because the resistance and capacitance for each unit grid in the wiring on both sides of the equal delay branch point x are assumed equal regardless of the position in determining the equal delay branch point "x".

However in reality, it is impossible that the resistance and capacitance for each unit grid are equal regardless of the position; and therefore, it becomes necessary to determine the equal delay branch point "x" from the evaluation of a series Π type RC circuit (series Π type RC model) obtained by dividing the wiring 118 and 121 into a plurality of segments, which will be a problem to be solved.

Furthermore, in the clock tree 130 as shown in FIG. 34, there is another problem in determining the equal delay branch point "x" that the delay time from the clock driver to each of the clock receivers has to be set to a target value while considering gate delays (extra-source gate delay) increased by applying loads to the clock driver not illustrated.

In the Mikami-Tabuchi method being one method for automatic searching for wiring paths, the temporal line segments (search segments) of the same level are processed without influencing each other, and therefore, it is possible to speed up the search for the line segments when the processing of search segments can be executed in parallel.

However, in the Mikami-Tabuchi method, since a point once searched is not searched again, and when a wiring path not optimum is searched before an optimum wiring path is searched, the wiring path not optimum can possibly be selected, which is another problem.

Accordingly, to solve the problem requires a method whereby a plurality of wiring paths can be searched and an optimum wiring path can be selected therefrom.

Further as mentioned above, if the possibility of wiring can be estimated before executing a wiring in the design of an LSI, it will be possible to improve the layout of a circuit and to optimize a wiring area from the possibility of wiring.

However, it is difficult to know the wiring possibility of a wiring objective when finishing the layout of a circuit, and there is a problem that the wiring possibility cannot be known before finishing the wiring.

SUMMARY OF THE INVENTION

The present invention has been made in view of the foregoing problems, and it is therefore an object of the present invention to provide a wiring processing method suitable for use in the design of an LSI using the CAD. More concretely, it is an object to provide a wiring processing method and wiring processing equipment, whereby the clock skew of a clock distributing circuit can be reduced through determining an equal delay branch point (tapping point) and taking an external clock delay time into account, the processing speed can be increased through performing a parallel processing of search segments in searching wiring paths, the lengths of wirings connecting to the circuits on an LSI can be minimized and the quality of wiring can be improved through selecting optimum wiring paths, and the layout of the circuits on an LSI can be improved and the wiring areas can be optimized through estimating the wiring possibility before executing wiring. It is further an object to provide a recording medium in which a wiring processing program is recorded for a computer executing the procedure of the aforementioned wiring processing.

In order to accomplish the foregoing objects, a wiring processing method of the invention comprises: a segment dividing step for dividing a wiring connecting between two receivers of a clock net on a clock distributing circuit of a clock synchronous circuit into three or more segments through setting two or more dividing points; an equal delay branch segment determining step for comparing a first delay time from one dividing point on one end of the segment obtained by the segment dividing step to one receiver of the two receivers with a second delay time from the one dividing point to the other receiver of the two receivers, and comparing a third delay time from the other dividing point on the other end of the segment to the one receiver of the two receivers with a fourth delay time from the other dividing point to the other receiver of the two receivers, and determining a segment in which a magnitude of the first delay time against the second delay time and a magnitude of the third delay time against the fourth delay time are inverted as an equal delay branch segment where an equal delay branch point exists; and an equal delay branch point determining step for determining an equal delay branch point in the equal delay branch segment determined by the equal delay branch segment determining step.

The abovementioned dividing points set by the segment dividing step may be physical points on the wiring, or points at which an impedance for a unit length of the wiring changes. And, the segments obtained by the segment dividing step can be evaluated by means of a single Π type circuit.

Further, the first through the fourth delay time in the foregoing equal delay branch segment determining step can be obtained by the following equations:

$$\text{the first delay time} = \sum_{i=1}^{k-1}\left[r_i\left(\sum_{j=1}^{i} c_j - c_i/2 + C_A\right)\right] + t_A$$

$$\text{the second delay time} = \sum_{i=k}^{n}\left[r_i\left(\sum_{j=i}^{n} c_j - c_i/2 + C_B\right)\right] + t_B$$

-continued $$\text{the third delay time} = \sum_{i=1}^{k}\left[r_i\left(\sum_{j=1}^{i} c_j - c_i/2 + C_A\right)\right] + t_A$$

$$\text{the fourth delay time} = \sum_{i=k+1}^{n}\left[r_i\left(\sum_{j=i}^{n} c_j - c_i/2 + C_B\right)\right] + t_B$$

here, $r_i$: resistance across a segment
$c_j$: capacitance at a segment
$C_A$: capacitance at the one receiver
$C_B$: capacitance at the other receiver
$t_A$: delay time by the one receiver
$t_B$: delay time by the other receiver
n+1: total number of the dividing points
k: first number of the dividing points forming the equal delay branch segment.

Further, the equal delay branch point in the equal delay branch segment determining step can be obtained by $$[(t_B-t_A)+\alpha L\ (C_B+\beta L/2)]/[\alpha L\ (\beta L+C_A+C_b)]$$

here,

L: wiring length between the two receivers
α: resistance for a unit length of the wiring
β: capacitance for a unit length of the wiring
$C_A$: capacitance at the one receiver
$C_B$: capacitance at the other receiver
$t_A$: delay time by the one receiver
$t_B$: delay time by the other receiver.

Accordingly, in the wiring processing method of the invention, a wiring connecting between two receivers of a clock net on a clock distributing circuit of a clock synchronous circuit is divided into three or more segments in obtaining an equal delay branch point, thereby, the equal delay branch point can accurately be obtained taking into account that a resistance and capacitance for a unit grid on the wiring are not equal independently of the positions. Therefore, the clock skew being a difference of a clock propagation delay in the clock synchronous circuit can be reduced.

According to another aspect of the invention, the wiring processing method comprises: a segment dividing step for dividing a wiring on a clock distributing circuit of a clock synchronous circuit into three or more segments through setting two or more dividing points; a propagation delay time determining step for obtaining a propagation delay time of the wiring in which the delay time of each of the segments obtained by the segment dividing step is taken into account; and a wiring length adjusting step for comparing the propagation delay time of the wiring obtained by the propagation delay time determining step with a preset time, and on the basis of the comparison result, adjusting a wiring length for each of the segments.

Further, the dividing points set by the foregoing segment dividing step may be points at which an impedance for a unit length of the wiring changes.

Furthermore, the segments obtained by the segment dividing step can be evaluated by means of a single Π type circuit.

Accordingly, in the wiring processing method of the invention, a wiring on a clock distributing circuit of a clock synchronous circuit is divided into three or more segments to adjust a wiring length for each segment, thereby, a delay time to each of the receivers can be made equal taking an external clock delay time into account. Therefore, the clock skew being a difference of a clock propagation delay in the clock synchronous circuit can be reduced.

According to another aspect of the invention, the wiring processing method comprises: a first segment dividing step for dividing a wiring connecting between two receivers of a clock net on a clock distributing circuit of a clock synchronous circuit into three or more segments through setting two or more dividing points; an equal delay branch segment determining step for comparing a first delay time from one dividing point on one end of the segment obtained by the first segment dividing step to one receiver of the two receivers with a second delay time from the one dividing point to the other receiver of the two receivers, comparing a third delay time from the other dividing point on the other end of the segment to the one receiver of the two receivers with a fourth delay time from the other dividing point to the other receiver of the two receivers, and determining a segment in which a magnitude of the first delay time against the second delay time and a magnitude of the third delay time against the fourth delay time are inverted as an equal delay branch segment where an equal delay branch point exists; an equal delay branch point determining step for determining an equal delay branch point in the equal delay branch segment determined by the equal delay branch segment determining step; a delay time determining step for obtaining a fifth delay time from the equal delay branch point obtained by the equal delay branch point determining step to each of the receivers; a second segment dividing step for setting two or more dividing points on a wiring from the equal delay branch point through an external clock source gate and dividing the wiring into three or more segments; a propagation delay time determining step for obtaining a propagation delay time of the wiring in which the delay time of each of the segments obtained by the second segment dividing step is taken into account, and a wiring length adjusting step for comparing the sum of the fifth delay time from the equal delay branch point to each of the receivers obtained by the delay time determining step and the propagation delay time of the wiring obtained by the propagation delay time determining step with a preset time, and on the basis of the comparison result, adjusting a wiring length for each segment.

In the foregoing wiring length adjusting step, the sum of the fifth delay time, the propagation delay time, and an external clock delay time at the external clock source gate is compared with a preset time, and on the basis of the comparison result, a wiring length may be adjusted for each segment.

Accordingly, in the wiring processing method of the invention, a wiring connecting between two receivers of a clock net on a clock distributing circuit of a clock synchronous circuit is divided into three or more segments to obtain an equal delay branch point and the length of a wiring from the equal delay branch point to an external clock source gate is adjusted for each segment while dividing the wiring into more than three segments. Thereby, the equal delay branch point can accurately be obtained taking into account that a resistance and capacitance for a unit grid on the wiring are not equal independently of the positions, and a delay time to each of the receivers can be made equal taking an external clock delay time into account. Therefore, the clock skew being a difference of a clock propagation delay time in the clock synchronous circuit can effectively be reduced.

According to another aspect of the invention relating to the wiring processing method, in determining a wiring path of a wiring on a circuit board, a wiring area is in advance divided into grids by a unit of a minimum pitch of the wiring, and an available flag to indicate whether a grid is available for the wiring or not, an arrival state flag to indicate that a search segment arrives at the grid, and an arrival direction flag to indicate a direction in which the search segment arrives at the grid are provided. With this provision, the wiring processing method comprises a forward search processing step that, when the available flag indicates an available state and the arrival flag indicates a non-arrival state of the search segment as for an adjoining grid next to the grid at which the arrival state flag indicates an arrival of the search segment, executes in parallel an adjoining grid flag processing procedure to set the arrival state flag at the adjoining gird to the arrival state of the search segment and to make the arrival direction flag at the adjoining grid to indicate a search direction of the search segment, and further repeats the adjoining grid flag processing procedure as to each of the search segments until the grid requiring the arrival state flag to indicate the arrival state of the search segment comes into nonexistence. The wiring processing method further comprises a backward search processing step for searching, after the forward search processing step, a wiring path backward from a desired grid in compliance with the arrival direction flag.

Therefore, in the wiring processing method of the invention, the parallel processing of the foregoing adjoining grid flag processing procedure can increase the speed of the operation in the forward search processing step, thus significantly reducing time for searching the wiring paths.

According to another aspect of the invention relating to the wiring processing method, in determining a wiring path of a wiring on a circuit board, a wiring area is in advance divided into grids by a unit of a minimum pitch of the wiring and an arrival direction flag to indicate a direction in which a search segment arrives at a grid is provided. The wiring processing method further comprises: a forward search processing step for searching each of the grids forward, while indicating a plurality of search directions of the search segments on the arrival direction flag; a backward search processing step for searching, after the forward search processing step, a plurality of wiring paths backward from a desired grid in compliance with the arrival direction flag; and an optimum wiring path determining step for determining an optimum wiring path out of a plurality of wiring paths obtained by the backward search processing step.

Accordingly, in the wiring processing method of the invention, a plurality of search directions are indicated on the arrival direction flag as for each of the grids, and thereby a plurality of wiring paths can be searched and an optimum wiring path can be selected therefrom. Therefore, it is possible to enhance quality of the wiring while minimizing a wiring length.

According to another aspect of the invention, the wiring processing method is provided with: a circuit layout determining step for determining a layout of circuits on a circuit board; and a wiring congestion degree evaluating step for evaluating, after the circuit layout determining step determines the layout of the circuits, a wiring congestion degree of a wiring from the (L−G)/L, in which L is a total wiring length of a wiring to connect the circuits, G is a number of dots used for the wiring.

Accordingly, in the wiring processing method of the invention, the wiring congestion degree of a circuit can be estimated for a wiring possibility at the finishing stage of a layout of a circuit before executing the wiring. Therefore, the estimation and evaluation of the wiring possibility becomes possible at an early stage, which is requested as wiring objectives become increasingly big.

The wiring processing equipment of the invention is provided with: a segment dividing processor for dividing a wiring connecting between two receivers of a clock net on a clock distributing circuit of a clock synchronous circuit into three or more segments through setting two or more branch points; an equal delay branch segment determining processor for comparing a first delay time from one branch point on one end of the segment obtained by the segment dividing processor to one receiver of the two receivers with a second delay time from the one branch point to the other receiver of the two receivers, and comparing a third delay time from the other branch point on the other end of the segment to the one receiver of the two receivers with a fourth delay time from the other branch point to the other receiver of the two receivers, and determining a segment in which a magnitude of the first delay time against the second delay time and a magnitude of the third delay time against the fourth delay time are inverted as an equal delay branch segment where an equal delay branch point exists; and an equal delay branch point determining processor for determining an equal delay branch point in the equal delay branch segment determined by the equal delay branch segment determining processor.

Accordingly, in the wiring processing equipment of the invention, the equal delay branch point can accurately be obtained taking into account that a resistance and capacitance for a unit grid on the wiring are not equal independently of the positions. Therefore, the clock skew being a difference of a clock propagation delay in the clock synchronous circuit can be reduced.

According to another aspect of the invention, the wiring processing equipment is provided with: a segment dividing processor for dividing a wiring on a clock distributing circuit of a clock synchronous circuit into three or more segments through setting two or more branch points; a propagation delay time determining processor for obtaining a propagation delay time of the wiring in which a delay time of each of the segments obtained by the segment dividing processor is taken into account; and a wiring length adjusting processor for comparing a propagation delay time of the wiring obtained by the propagation delay time determining processor with a preset time, and on the basis of the comparison result, adjusting a wiring length for each of the segments.

Accordingly, in the aforementioned wiring equipment of the invention, a delay time to each of the receivers can be made equal taking an external clock delay time into account, thereby reducing the clock skew being a difference of a clock propagation delay time in the clock synchronous circuit.

According to another aspect of the invention, the wiring processing equipment is provided with: a first segment dividing processor for dividing a wiring connecting between two receivers of a clock net on a clock distributing circuit of a clock synchronous circuit into three or more segments through setting two or more branch points; an equal delay branch segment determining processor for comparing a first delay time from one branch point on one end of the segment obtained by the first segment dividing processor to one receiver of the two receivers with a second delay time from the one branch point to the other receiver of the two receivers, comparing a third delay time from the other branch point on the other end of the segment to the one receiver of the two receivers with a fourth delay time from the other branch point to the other receiver of the two receivers, and determining a segment in which a magnitude of the first delay time against the second delay time and a magnitude of the third delay time against the fourth delay time are inverted as an equal delay branch segment where an equal delay branch point exists; an equal delay branch point determining processor for determining an equal delay branch point in the equal delay branch segment determined by the equal delay branch segment determining processor; a delay time determining processor for obtaining a fifth delay time from the equal delay branch point obtained by the equal delay branch point determining processor to each of the receivers; a second segment dividing processor for setting two or more branch points on a wiring from the equal delay branch point through an external clock source gate and dividing the wiring into three or more segments; a propagation delay time determining processor for obtaining a propagation delay time of the wiring in which the delay time of each of the segments obtained by the second segment dividing processor is taken into account; and a wiring length adjusting processor for comparing the sum of the fifth delay time from the equal delay branch point to each of the receivers obtained by the delay time determining processor and the propagation delay time of the wiring obtained by the propagation delay time determining processor with a preset time, and on the basis of the comparison result, adjusting a wiring length for each segment.

Accordingly, in the wiring processing equipment of the invention, the equal delay branch point can accurately be obtained taking into account that a resistance and capacitance for a unit grid on the wiring are not equal independently of the positions, and a delay time to each of the receivers can be made equal taking an external clock delay time into account. Therefore, the clock skew being a difference of a clock propagation delay time in the clock synchronous circuit can effectively be reduced.

According to another aspect of the invention, the wiring processing equipment is provided with: a forward searching processor that, as for an adjoining grid next to a grid at which an arrival state flag for indicating an arrival of a search segment at the grid obtained by dividing a wiring area into grids by a unit of a minimum pitch of a wiring on a circuit board indicates an arrival of the search segment, when an available flag for indicating whether a grid is available for a wiring or not indicates an available state and the arrival state flag indicates a non-arrival state of the search segment, executes in parallel an adjoining grid flag processing procedure that sets the arrival state flag at the adjoining gird to the arrival state of the search segment and makes an arrival direction flag for indicating an arrival direction of a search segment at the adjoining grid to indicate a search direction thereof, and further repeats the adjoining grid flag processing procedure as to each of the search segments until the grid requiring the arrival state flag to indicate the arrival state of the search segment comes into nonexistence; and a backward searching processor for searching backward, after the forward search processing finishes, a wiring path backward from a desired grid in compliance with the arrival direction flag.

Accordingly, the operation in the foregoing forward search processing procedure can be performed in an increased speed by the parallel processing, thus significantly reducing time for searching the wiring paths.

According to another aspect of the invention, the wiring processing equipment is provided with: a forward searching processor for searching forward each grid obtained by dividing a wiring area into grids by a unit of a minimum pitch of a wiring on a circuit board, while indicating a plurality of search directions of the search segments on an arrival direction flag for indicating a direction in which a search segment arrives at the grid; a backward searching processor for searching, after the forward search processing, a plurality of wiring paths backward from a desired grid in compliance with the arrival direction flag; and an optimum wiring path determining processor for determining an optimum wiring path out of a plurality of wiring paths obtained by the backward searching processor.

Accordingly, in the wiring processing equipment of the invention, a plurality of wiring paths can be searched and an optimum wiring path can be selected therefrom, thus enhancing quality of the wiring while minimizing a wiring length.

According to another aspect of the invention, the wiring processing equipment is provided with: a circuit layout determining processor for determining a layout of circuits on a circuit board; and a wiring congestion degree evaluating processor for evaluating, after the circuit layout determining processor determines a layout of the circuits, a wiring congestion degree of a wiring from the (L–G)/L, in which L is a total wiring length of the wiring to connect the circuits, G is a number of dots used for the wiring.

Accordingly, in the wiring processing equipment of the invention, the wiring congestion degree of a circuit can be estimated for a wiring possibility at the finishing stage of a layout of a circuit before executing the wiring. Therefore, the estimation and evaluation of the wiring possibility becomes possible at an early stage, which is requested as wiring objectives become increasingly big.

The recording medium for a wiring processing program according to the invention is characterized in that a wiring processing program is stored, whereby a computer executes: a segment dividing procedure for dividing a wiring connecting between two receivers of a clock net on a clock distributing circuit of a clock synchronous circuit into three or more segments through setting two or more branch points; an equal delay branch segment determining procedure for comparing a first delay time from one branch point on one end of the segment obtained by the segment dividing procedure to one receiver of the two receivers with a second delay time from the one branch point to the other receiver of the two receivers, and comparing a third delay time from the other branch point on the other end of the segment to the one receiver of the two receivers with a fourth delay time from the other branch point to the other receiver of the two receivers, and determining a segment in which a magnitude of the first delay time against the second delay time and a magnitude of the third delay time against the fourth delay time are inverted as an equal delay branch segment where an equal delay branch point exists; and an equal delay branch point determining procedure for determining an equal delay branch point in the equal delay branch segment determined by the equal delay branch segment determining procedure.

Accordingly, in the recording medium for a wiring processing program of the invention, the equal delay branch point can accurately be determined taking into account that a resistance and capacitance for a unit grid on the wiring are not equal independently of the positions. Therefore, the clock skew being a difference of a clock propagation delay in the clock synchronous circuit can be reduced.

According to another aspect of the invention, the recording medium for a wiring processing program is characterized in that a wiring processing program is stored, whereby a computer executes: a segment dividing procedure for dividing a wiring on a clock distributing circuit of a clock synchronous circuit into three or more segments through setting two or more branch points; a propagation delay time determining procedure for obtaining a propagation delay time of the wiring in which a delay time of each of the segments obtained by the segment branch procedure is taken into account; and a wiring length adjusting procedure for comparing a propagation delay time of the wiring obtained by the propagation delay time determining procedure with a preset time, and on the basis of the comparison result, adjusting a wiring length for each of the segments.

Accordingly, in the recording medium for a wiring processing program of the invention, a delay time to each of the receivers can be made equal taking an external clock delay time into account, thereby reducing the clock skew being a difference of a clock propagation delay time in the clock synchronous circuit.

According to another aspect of the invention, the recording medium for a wiring processing program is characterized in that a wiring processing program is stored, whereby a computer executes: a first segment dividing procedure for dividing a wiring connecting between two receivers of a clock net on a clock distributing circuit of a clock synchronous circuit into three or more segments through setting two or more branch points; an equal delay branch segment determining procedure for comparing a first delay time from one branch point on one end of the segment obtained by the first segment dividing procedure to one receiver of the two receivers with a second delay time from the one branch point to the other receiver of the two receivers, comparing a third delay time from the other branch point on the other end of the segment to the one receiver of the two receivers with a fourth delay time from the other branch point to the other receiver of the two receivers, and determining a segment in which a magnitude of the first delay time against the second delay time and a magnitude of the third delay time against the fourth delay time are inverted as an equal delay branch segment where an equal delay branch point exists; an equal delay branch point determining procedure for determining an equal delay branch point in the equal delay branch segment determined by the equal delay branch segment determining procedure; a delay time determining procedure for obtaining a fifth delay time from the equal delay branch point obtained by the equal delay branch point determining procedure to each of the receivers; a second segment dividing procedure for setting two or more branch points on a wiring from the equal delay branch point through an external clock source gate and dividing the wiring into three or more segments; a propagation delay time determining procedure for obtaining a propagation delay time of the wiring in which the delay time of each of the segments obtained by the second segment dividing procedure is taken into account; and a wiring length adjusting procedure for comparing the sum of the fifth delay time from the equal delay branch point to each of the receivers obtained by the delay time determining procedure and the propagation delay time of the wiring obtained by the propagation delay time determining procedure with a preset time, and on the basis of the comparison result, adjusting a wiring length for each segment.

Accordingly, in the recording medium for a wiring processing program of the invention, the equal delay branch point can accurately be obtained taking into account that a resistance and capacitance for a unit grid on the wiring are not equal independently of the positions, and a delay time to each of the receivers can be made equal taking an external clock delay time into account. Therefore, the clock skew being a difference of a clock propagation delay time in the clock synchronous circuit can effectively be reduced.

According to another aspect of the invention, the recording medium for a wiring processing program is characterized in that a wiring processing program is stored, whereby a computer executes: a forward searching procedure that, as for an adjoining grid next to a grid at which an arrival state flag for indicating an arrival of a search segment at the grid obtained by dividing a wiring area into grids by a unit of a minimum pitch of a wiring on a circuit board indicates an arrival of the search segment, when an available flag for indicating whether a grid is available for a wiring or not indicates an available state and the arrival state flag indicates a non-arrival state of the search segment, executes in parallel an adjoining grid flag procedure that sets the arrival state flag at the adjoining gird to the arrival state of the search segment and makes an arrival direction flag for indicating an arrival direction of a search segment at the adjoining grid to indicate a search direction thereof, and further repeats the adjoining grid flag processing procedure as to each of the search segments until the grid requiring the arrival state flag to indicate the arrival state of the search segment comes into nonexistence; and a backward searching procedure for searching, after the forward searching procedure finishes, a wiring path backward from a desired grid in compliance with the arrival direction flag.

Accordingly, in the recording medium for a wiring processing program of the invention, the operation in the forward searching procedure can be performed in an increased speed by the parallel processing, thus significantly reducing time for searching the wiring paths.

According to another aspect of the invention, the recording medium for a wiring processing program is characterized in that a wiring processing program is stored, whereby a computer executes: a forward searching procedure for searching forward each grid obtained by dividing a wiring area into grids by a unit of a minimum pitch of a wiring on a circuit board, while indicating a plurality of search directions of the search segments on an arrival direction flag for indicating a direction in which a search segment arrives at the grid; a backward searching procedure for searching, after the forward searching procedure, a plurality of wiring paths backward from a desired grid in compliance with the arrival direction flag; and an optimum wiring path determining procedure for determining an optimum wiring path out of a plurality of wiring paths obtained by the backward searching procedure.

Accordingly, in the recording medium for a wiring processing program of the invention, a plurality of wiring paths can be searched and an optimum wiring path can be selected therefrom, thus enhancing quality of the wiring while minimizing a wiring length.

According to another aspect of the invention, the recording medium for a wiring processing program is characterized in that a wiring processing program is stored, whereby a computer executes a wiring congestion degree evaluating procedure for evaluating a wiring congestion degree of a wiring from the $(L-G)/L$, in which L is a total wiring length of a wiring on a circuit board, G is a number of dots used for the wiring.

Accordingly, in the recording medium for a wiring processing program of the invention, the wiring congestion degree of a circuit can be estimated for a wiring possibility at the finishing stage of a layout of a circuit before executing the wiring. Therefore, the estimation and evaluation of the wiring possibility becomes possible at an early stage, which is requested as wiring objectives become increasingly big, presenting an advantage.

BRIEF DESCRIPTION OF THE DRAWINGS

The present invention will be fully understood from the detailed description given below and from the accompanying drawings of the preferred embodiments of the invention, which, however, should not be taken to limit the specific embodiment, but are for explanation and understanding, in which.

DESCRIPTION OF THE PREFERRED EMBODIMENT

Preferred embodiment of the present invention will hereafter be described in detail with reference to the accompanying drawings.

Figure 1:
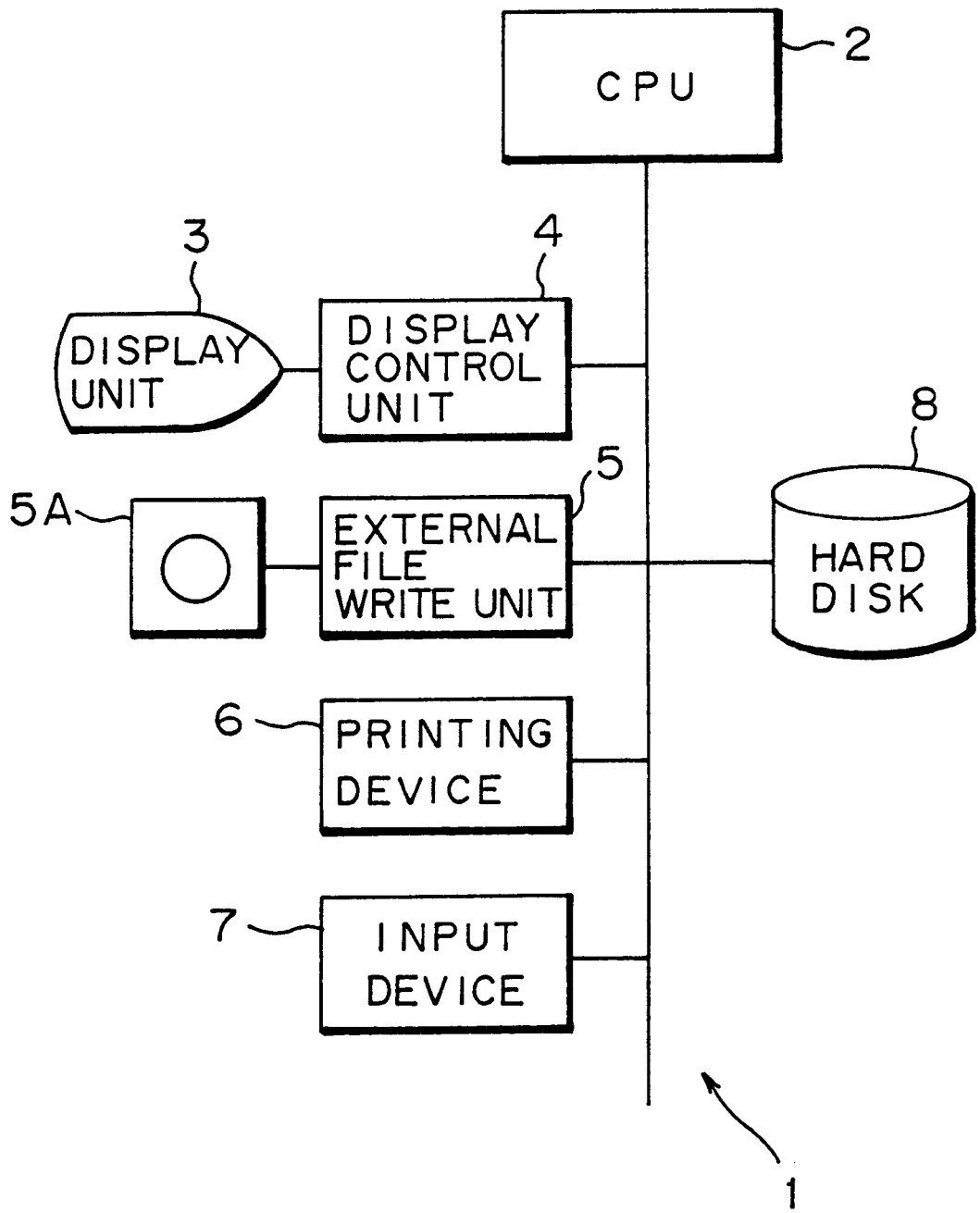
FIG. 1 is a block diagram showing a construction of an interactive circuit designing equipment relating to one embodiment of the invention.

(a) Description on the Construction of an Interactive Circuit Designing Equipment relating to one Embodiment of the Invention FIG. 1 is a block diagram showing a construction of an interactive circuit designing equipment being a wiring processing equipment relating to one embodiment of the invention.

In an interactive circuit designing equipment 1 shown in FIG. 1, numeral 3 is a display unit for displaying designing processes of various circuits and wiring paths etc. to connect circuits, 4 is a display control unit for controlling the display mode, 7 is an input device such as a key board and a mouse for a designer, referring to the data displayed on the display unit 3, to enter an information responsive to the displayed data.

5 is an external file write unit that writes into an external file 5A the wiring path drawings, etc. displayed on the display unit 3 by the display control unit 4 in accordance with the instruction from the input device 7.

6 is a printing device that prints out on a specific printing paper the wiring path drawings, etc. displayed on the display unit 3 by the display control unit 4 in accordance with the instruction from the input device 7.

8 is a hard disk in which all the data (logic circuit data, circuit layout data, etc.) used in designing circuits by the interactive circuit designing equipment 1 are stored and a wiring processing program (software) for the interactive circuit designing equipment 1 to execute the procedure for various wiring processing methods detailed later in (b) is stored, and in this embodiment, it functions as the recording medium for the wiring processing program.

2 is a CPU whereby each of the parts constituting the interactive circuit designing equipment 1 is administratively controlled.

Further, the function of the display control unit 4 is concretely achieved when the CPU 2 executes a program (software)stored in the hard disk 8; in FIG. 1, the display control unit 4 is illustrated in a block in order to define the function.

Figure 2:
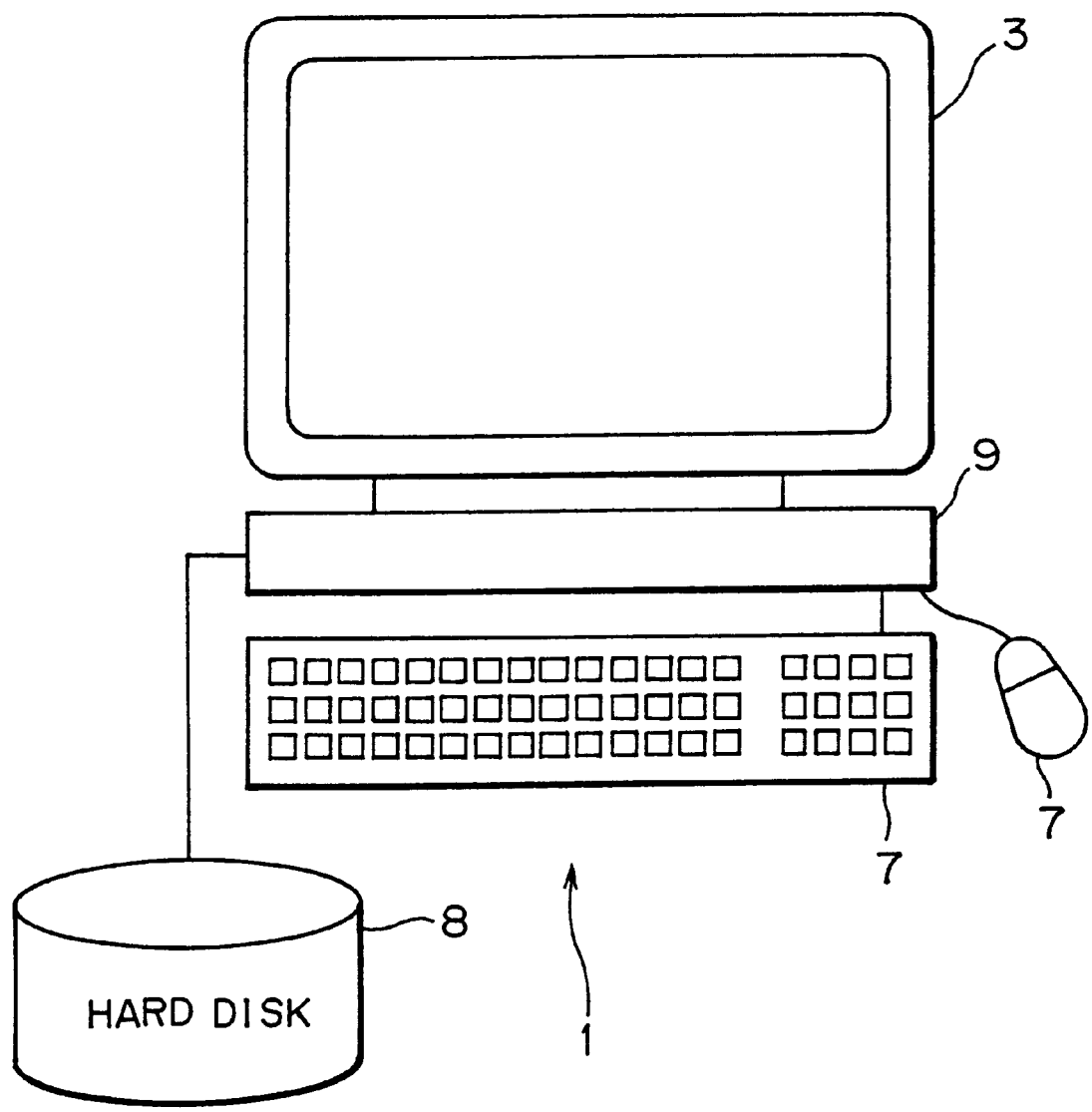
FIG. 2 is an illustration showing a total construction of the interactive circuit designing equipment relating to the embodiment of the invention.

Accordingly, the interactive circuit designing equipment 1 relating to this embodiment can be embodied by a general computer system (refer to FIG. 2) that comprises the CPU 2, display unit 3, external file write unit 5, printing device 6, input device 7, hard disk 8, etc. In FIG. 2, numeral 9 is a computer main frame.

(b) Description on the Wiring Processing Method by the Interactive Circuit Designing Equipment relating to one Embodiment of the Invention (b1) Description on the first Mode of the Wiring Processing Method for Reducing the Clock Skew The first mode of the wiring processing method for the interactive circuit designing equipment 1 relating to one embodiment of the invention will be described, whereby the clock skew, namely, the difference of clock propagation delay time in a clock synchronous circuit can be reduced.

Figure 5:
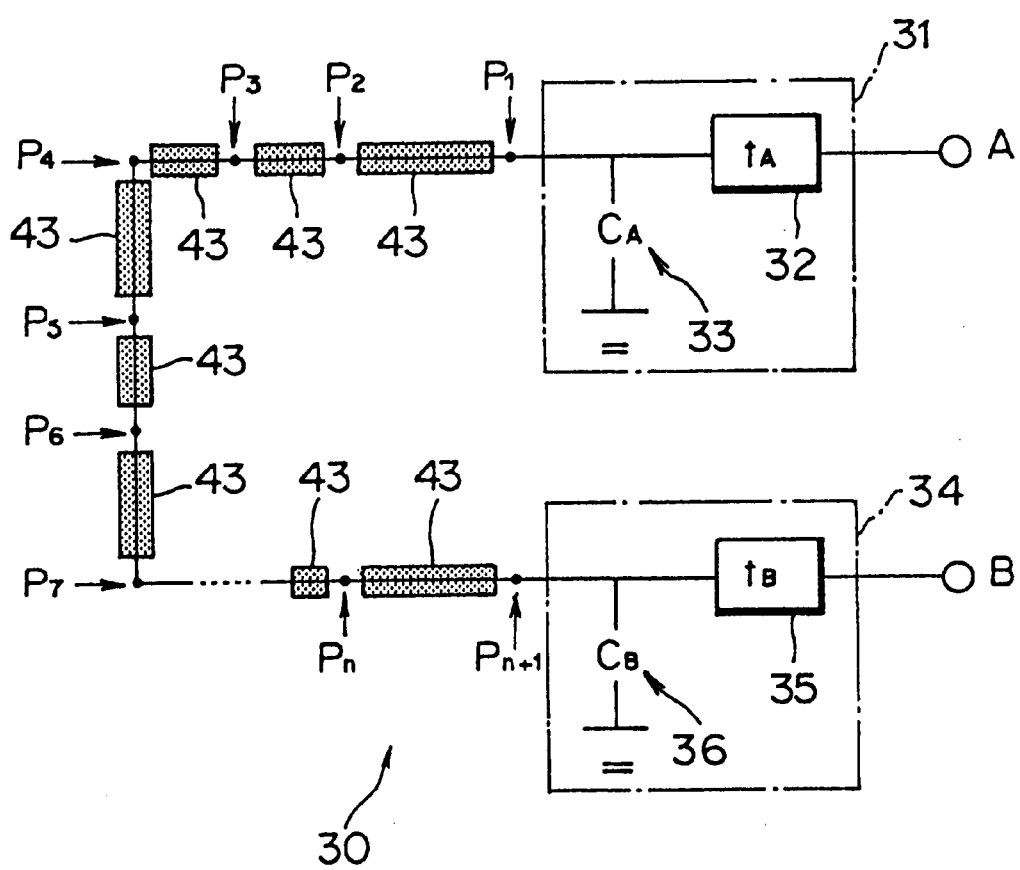
FIGS. 5 and 6 are illustrations typically showing a construction of a clock tree of a clock net on a clock distributing circuit in the first mode of the wiring processing method for reducing the clock skew according to the invention.
Figure 6:
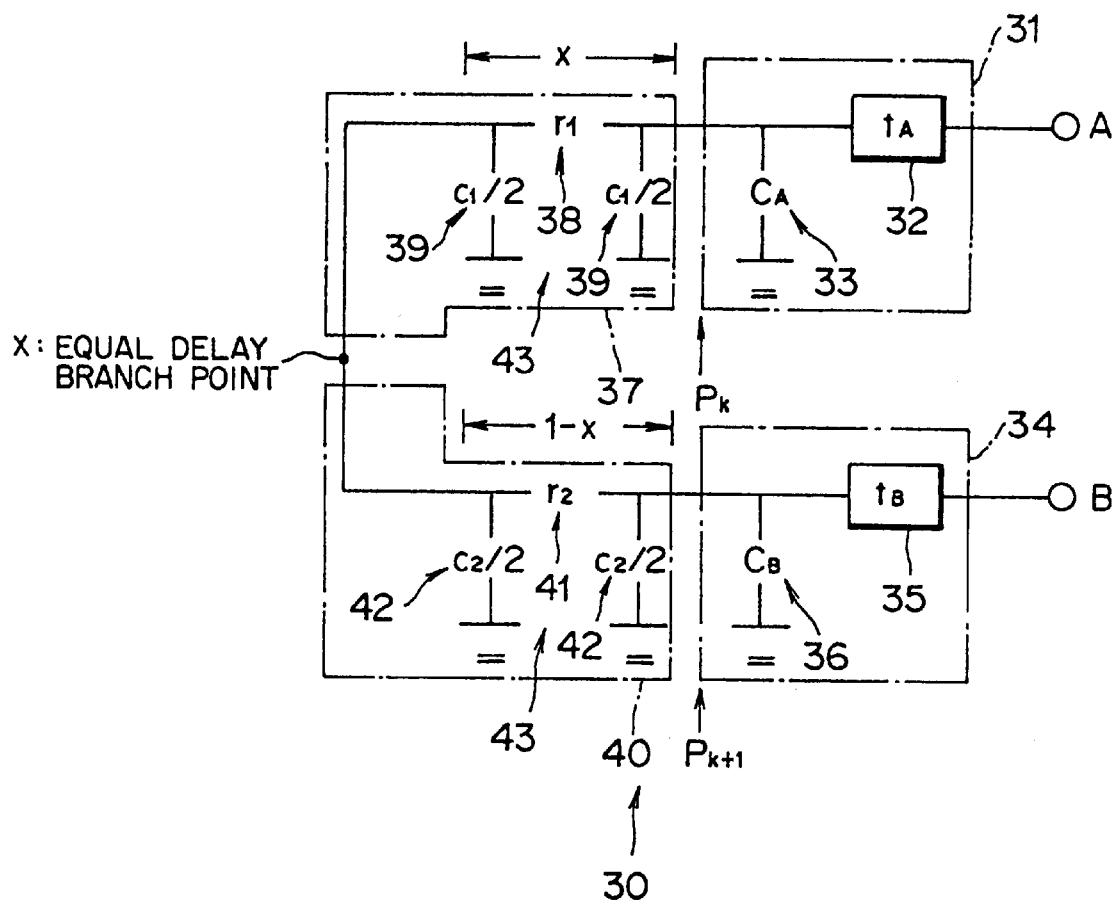

For explaining the first mode, FIGS. 5 and 6 illustrate a construction of a clock tree of a clock net on a clock distributing circuit of a clock synchronous circuit.

The clock tree 30 comprises, as shown in FIG. 6, a sub-clock tree consisting of a clock receiver(receiving circuit) 31 and a wiring 37 and another sub-clock tree consisting of a clock receiver(receiving circuit) 34 and a wiring 40, which are connected at an equal delay branch point (tapping point) x where the sub-clock trees have an equal delay.

Thus, in the clock tree 30, a clock driver (clock generator) not illustrated in FIG. 6 supplies a clock to the receiver 31 and 34 through the equal delay branch point x.

Here, the receiver 31 is composed of a flip-flop circuit (time constant $t_A$) 32 and a capacitor (capacitance $C_A$) 33, and the receiver 34 is composed of a flip-flop circuit (time constant $t_B$) 35 and a capacitor (capacitance $C_B$) 36.

The wiring 37 comprises a plurality of the Π type RC circuits (namely, segments 43) each of which consists of one resistor (resistance $r_1$) 38 and two capacitors (capacitance $c_1/2$) 39, from a reason described later.

Further, in the same manner as the wiring 37, the wiring 40 also comprises a plurality of the Π type RC circuits (namely, segments 43) consisting of one resistor (resistance $r_2$) 41 and two capacitors (capacitance $c_2/2$) 42.

In FIG. 6, the Π type RC circuit (segment 43) is illustrated only for one circuit each for the wiring 37 and 40, and the other segments are omitted.

Further in FIG. 5, the wiring 37 and 40 are omitted, however, a plurality of the segments in the wiring between the receiver 31 and 34 are illustrated with the symbol 43 (half-tone dot meshing in FIG. 5).

Incidentally, the equal delay branch point x shown in FIG. 6 is an input point of the clock from the driver (clock generator) not illustrated in FIG. 6, as described above.

In the clock tree 30 shown in FIG. 6, the clock skew by the two sub-clock trees of the clock tree 30 varies depending on the position of the equal delay branch point x. Therefore, the position of the equal delay branch point x has to be set very accurately to reduce the clock skew in the clock tree 30.

The method for determining an equal delay branch point x on a wiring between two sub-clock trees will now be described.

Figure 7:
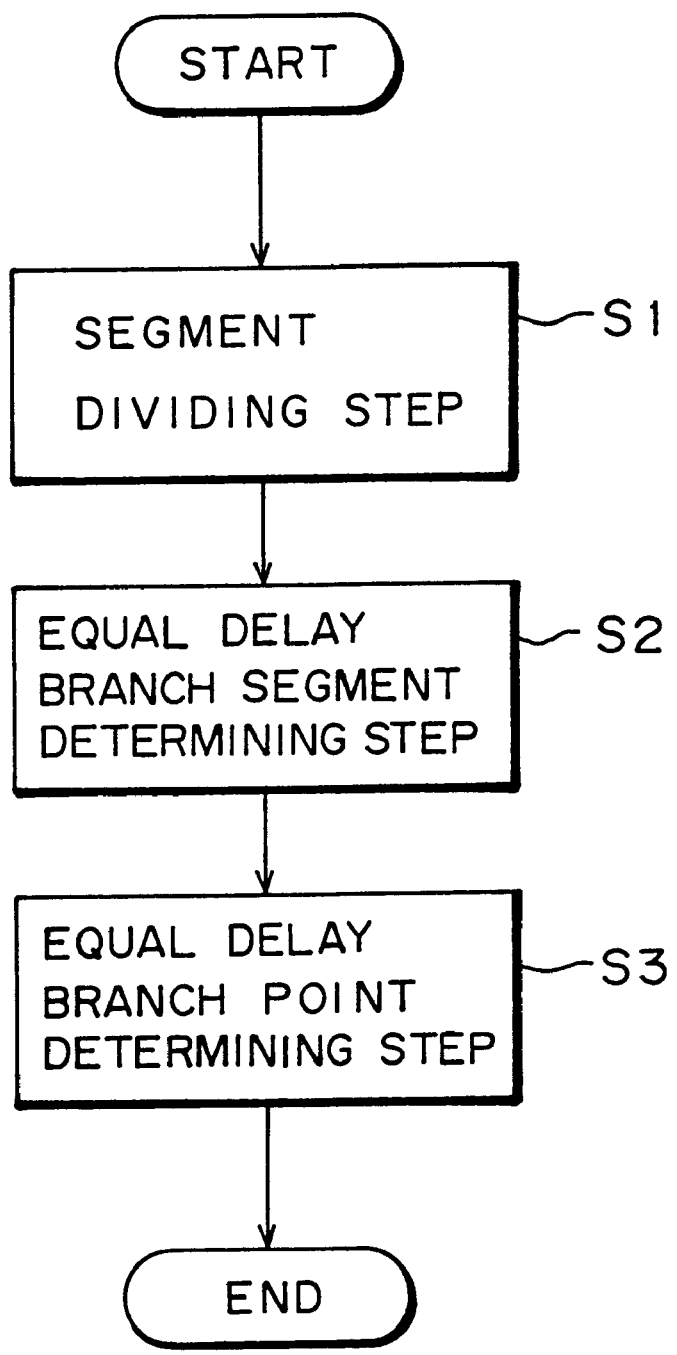
FIG. 7 is a flow chart for explaining the first mode of the wiring processing method for reducing the clock skew according to the invention.

The wiring processing method for determining the equal delay branch point x in the present mode comprises, as shown in FIG. 7, a segment dividing step (step S1), equal delay branch segment determining step (step S2), equal delay branch point determining step (step S3).

The segment dividing step (step S1) sets, as shown in FIG. 5, at least two or more dividing points (branch points) $P_1, \ldots P_{n+1}$ on the wiring between the receiver 31 and 34 and divides the wiring into at least three or more segments 43.

Here, the reason to divide the wiring (the wiring 37 and 40 shown in FIG. 6) between the receiver 31 and 34 into a plurality of segments 43 will be described.

First, a close look at one sub-clock tree is requested.

Figure 3:
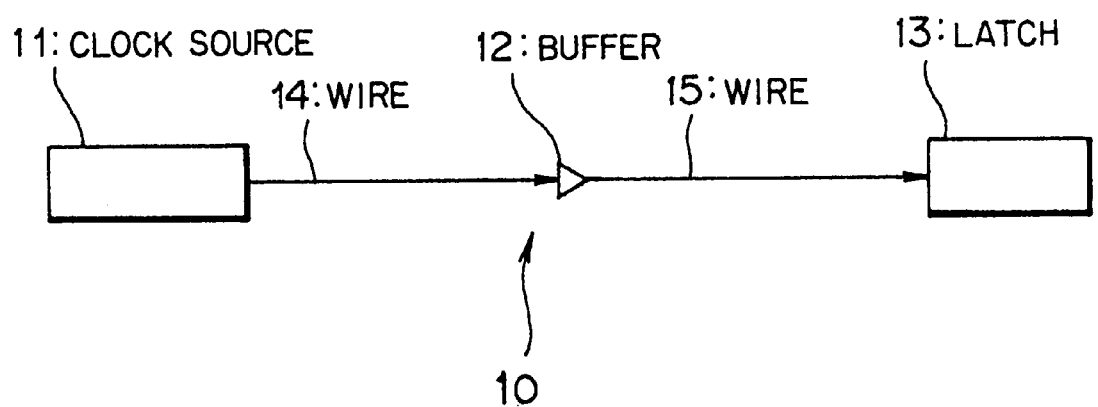
FIG. 3 is an illustration of a model for a clock tree with a buffer in the first mode of the wiring processing method for reducing a clock skew according to the invention.

FIG. 3 illustrates a model for a clock tree with a buffer, and as shown in this figure, the buffer built-in clock tree 10 comprises a clock signal generator (clock source) 11 as the driver, a clock receiver (latch) 13 as the receiver, and a buffer 12 through which the former two are connected.

Here, the clock source 11 is connected to the buffer 12 through a wire 14 and the buffer 12 is connected to the latch 13 through a wire 15.

Figure 4:
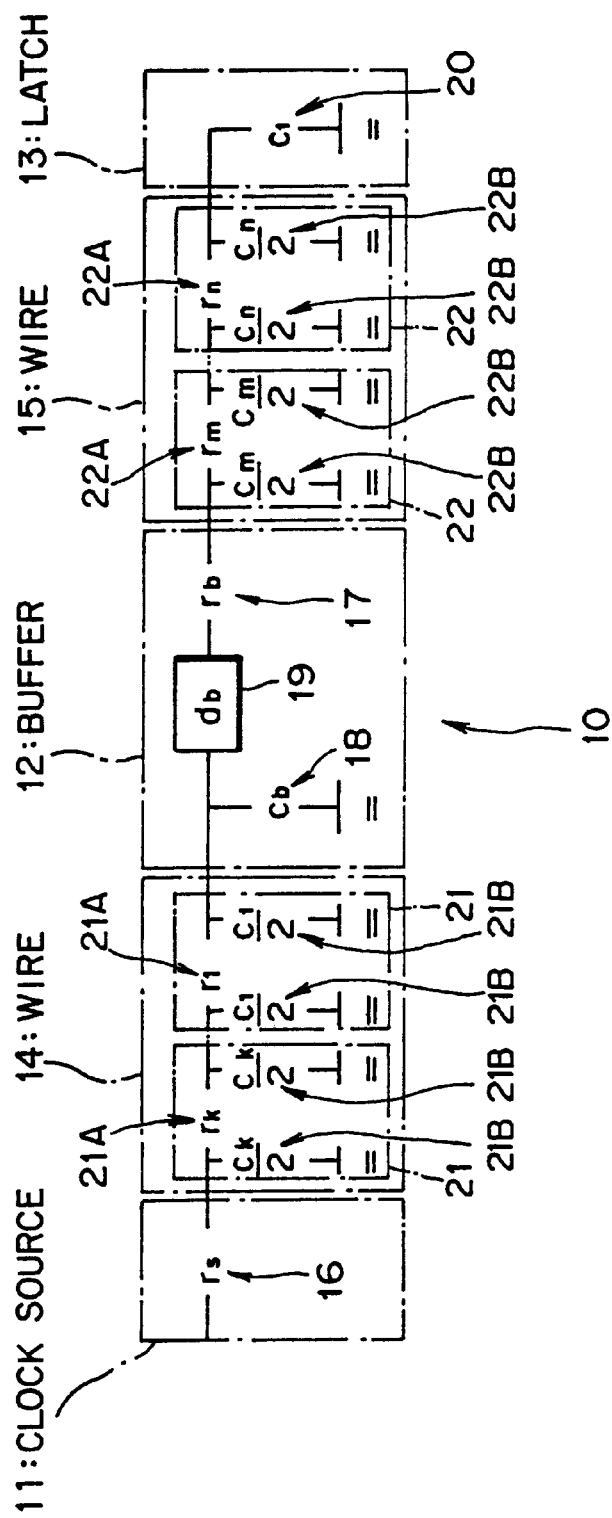
FIG. 4 is an illustration showing a major part of a construction of a clock tree with a buffer in the first mode of the wiring processing method for reducing the clock skew according to the invention.

This buffer built-in clock tree 10 has a configuration as shown in FIG. 4 in detail.

The clock source 11 has a resistor (resistance $r_s$) 16; the buffer 12 has a delay circuit (internal delay time $d_b$) 19, a resistor (resistance $r_b$) 17, and a capacitor (capacitance $c_b$) 18; the latch 13 has a capacitor (capacitance $c_1$) 20.

Figure 33:
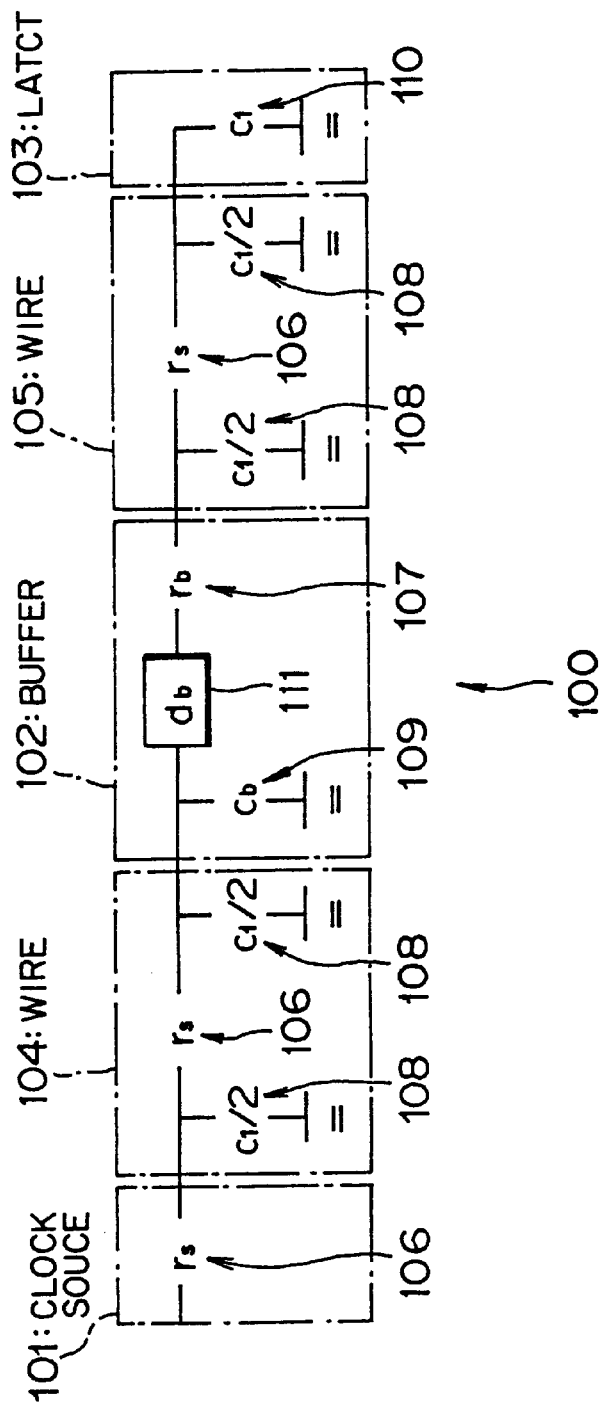
FIG. 33 is an illustration showing a major part of a construction of a clock tree with a buffer.
Figure 34:
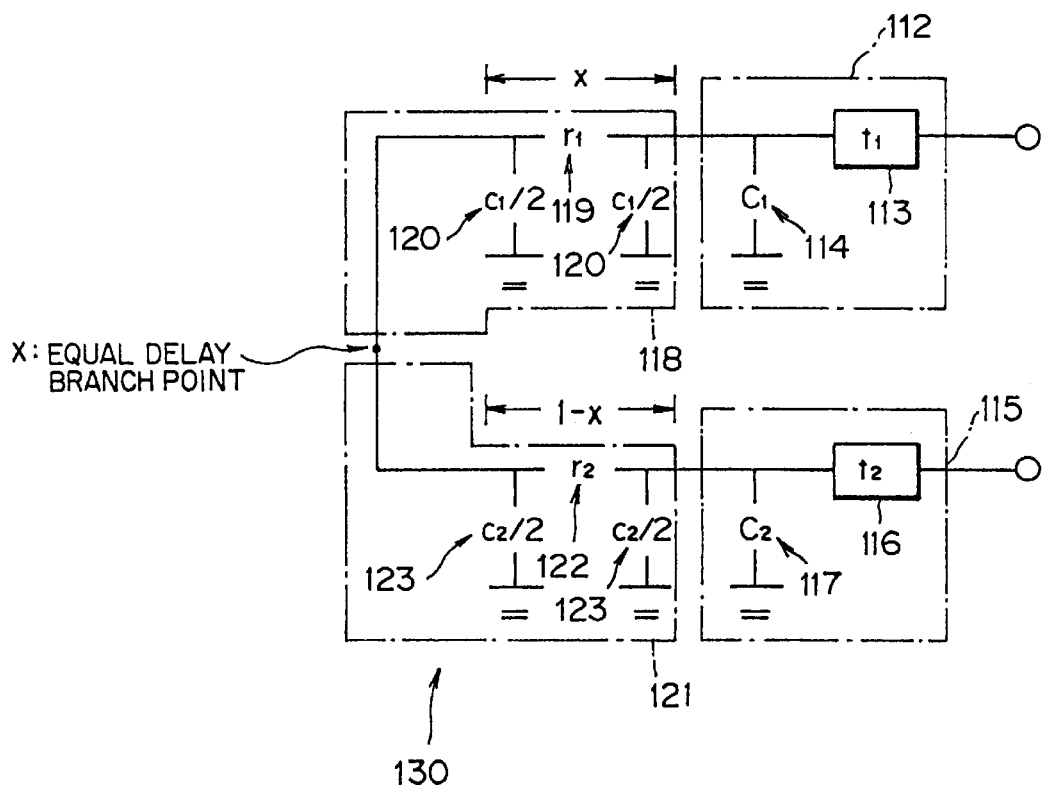
FIG. 34 is an illustration showing a construction of a clock tree consisting of two sub-clock trees.
Figure 35:
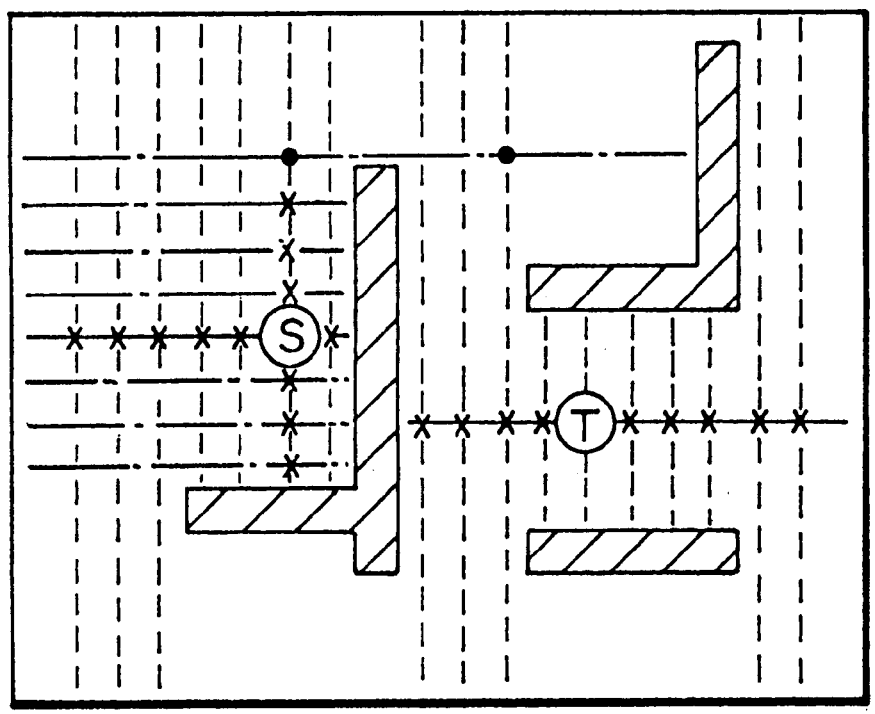
FIG. 35 is an illustration for explaining a method for searching a wiring path in an automatic wiring process.
Figure 36:
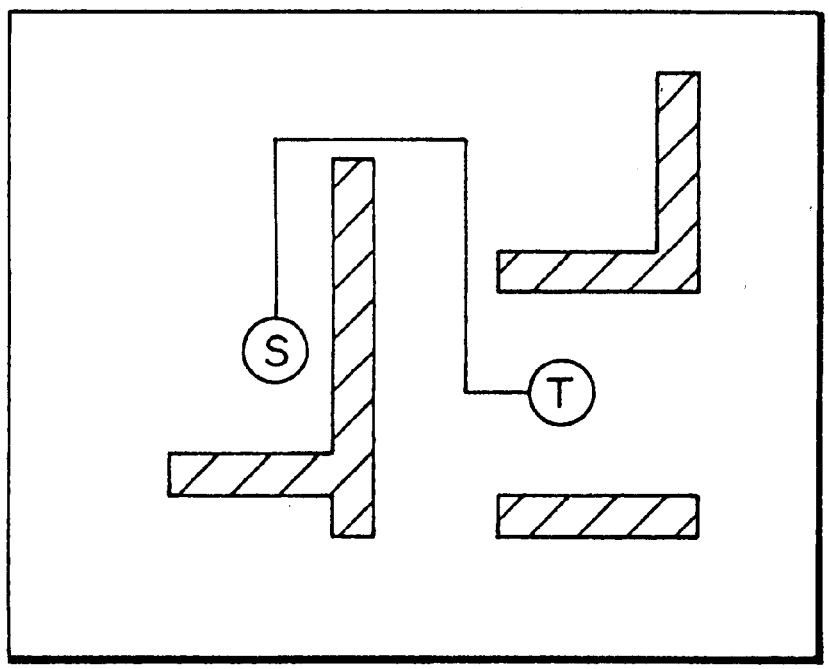
FIG. 36 is an illustration for explaining the method for searching a wiring path in the automatic wiring process.

The delay time from the clock source 11 to the latch 13 includes, as already described by means of FIG. 33, the delay time due to the wiring resistors and capacitors of the wire 14 and 15, and the internal delay time $d_b$ by the delay circuit 19 of the buffer 12.

The wiring resistor has become a problem as cannot be ignored, since the size of transistors and the cross-sectional area of wirings have decreased owing to the recent progress in the semiconductor microstructuring technique.

Accordingly, it has become necessary to deal with the wire 14 and 15 as a distributed constant circuit from accuracy for estimating the delay time.

In the buffer built-in clock tree 100 as already shown in FIG. 33, as a concentrated constant circuit being a typical form of the distributed constant circuit, the wire 104 and 105 each have been evaluated by means of one Π type RC circuit (single Π type RC model). In the present mode, from the consideration that the resistance and capacitance for unit grid in the wire 14 and 15 are not equal independently of the positions on the wiring, the delay time is evaluated by means of a plurality of the Π type RC circuits given by dividing the wire 14 and 15 into a plurality of segments 43.

The wire 14 comprises a plurality of the Π type RC circuits 21 (namely, segments) each of which consists of one resistor (resistance $r_1, \ldots, r_k$) 21A and two capacitors [capacitance $(c_1/2), \ldots, (c_k/2)$] 21B, as shown in FIG. 4.

The wire 15 also comprises a plurality of the Π type RC circuits 22 (namely, segments consisting of one resistor (resistance $r_m, \ldots, r_a$) 22A and two capacitors [capacitance $(c_m/2), \ldots, (c_n/2)$] 22B.

In the segment dividing step (step S1), the wiring between the receiver 31 and 34 shown in FIG. 5 is divided into the segments 43 by the dividing points $P_1, \ldots, P_{n+1}$ with the conditions mentioned below.

(1) a physical branch point on a wiring connecting between the receiver 31 and 34.

Here, the physical branch point is a point at which a wiring layer changes, for example, in FIG. 5, the dividing point $P_4$ and $P_7$ are equivalent to the physical point.

(2) a point at which the impedance for a unit length of the wiring connecting between the receiver 31 and 34 changes.

Here, the impedance for a unit length of the wiring changes where the wiring layer changes, however, it changes even where the wiring layer does not change (for example, where a power supply is disposed in the underlayer of the wiring). Therefore, it is effective to divide the wiring at such a point that the impedance for a unit length of the wiring changes. Here, the impedance is resistance or capacitance.

(3) a point at which the length of a segment 43 exceeds a predetermined length s (s: optional constant).

Here, the length s is a length obtained from experience.

The segments 43 are divided at the dividing points $P_1, \ldots, P_{n+1}$ which correspond to the aforementioned (1) through (3), each of which is evaluated by means of one Π type RC model.

The equal delay branch segment determining step (step S2) determines the segment 43 containing the equal delay branch point x out of the segments 43 obtained by the segment dividing step (step S1) as the equal delay branch segment.

Concretely, in the equal delay branch segment determining step (step S2), the delay time from one dividing point $P_k$ on one end of the segments 43 to one receiver of the foregoing two receivers 31, 34 (in FIG. 5, the receiver 31 connected to a gate A on the subsequent stage) is obtained as a first delay time [Delay $(P_k \rightarrow A)$], and the delay time from one dividing point $P_k$ to the other receiver of the foregoing two receivers 31, 34 (in FIG. 5, the receiver 34 connected to a gate B on the subsequent stage) is obtained as a second delay time [Delay $(P_k \rightarrow B)$].

And, the first delay time [Delay $(P_k \rightarrow A)$] and the second delay time [Delay $(P_k \rightarrow B)$] are compared.

Furthermore, the delay time from the other dividing point $P_{k+1}$ on the other end of the segments 43 to one receiver of the foregoing two receivers 31, 34 is obtained as a third delay time [Delay $(P_{k+1} \rightarrow A)$], and the delay time from the other dividing point Pk+1 to the other receiver of the foregoing two receivers 31, 34 is obtained as a fourth delay time [Delay $(P_{k+1} \rightarrow B)$].

And, the third delay time [Delay $(P_{k+1} \rightarrow A)$] and the fourth delay time [Delay $(P_{k+1} \rightarrow B)$] are compared.

If there is a segment in which the magnitude of the first delay time [Delay $(P_k \rightarrow A)$] against the second delay time [Delay $(P_k \rightarrow B)$] and the magnitude of the third delay time [Delay $(P_{k+1} \rightarrow A)$] against the fourth delay time [Delay $(P_{k+1} \rightarrow$ 60 B)] are inverted, the segment is determined as an equal delay branch segment where the equal delay branch point "x" exists.

Namely, the equal delay branch segment determining step (step S2) is to find out the dividing points $P_k$, $P_{k+1}$ which satisfy $$\text{Delay } (P_k \rightarrow A) \leq \text{Delay } (P_k \rightarrow B)$$

$$\text{Delay } (P_{k+1} \rightarrow A) \geq \text{Delay } (P_{k+1} \rightarrow B)$$

by means of dichotomy, out of the dividing points $P_1$ through $P_{n+1}$; the equal delay branch segment is a segment (segment $P_k P_{k+1}$) between the dividing point $P_k$ and $P_{k+1}$.

Here, the first delay time [Delay $(P_k \rightarrow A)$], the second delay time [Delay $(P_k \rightarrow B)$], the third delay time [Delay $(P_{k+1} \rightarrow A)$], and the fourth delay time [Delay $(P_{k+1} \rightarrow B)$] are obtained from the following equations.

$$\text{Delay } (P_k \rightarrow A) = \sum_{i=1}^{k-1}\left[r_i\left(\sum_{j=1}^{i} c_j - c_i/2 + C_A\right)\right] + t_A$$

-continued $$\text{Delay } (P_k \rightarrow B) = \sum_{i=k}^{n}\left[r_i\left(\sum_{j=i}^{n} c_j - c_i/2 + C_B\right)\right] + t_B$$

$$\text{Delay } (P_{k+1} \rightarrow A) = \sum_{i=1}^{k}\left[r_i\left(\sum_{j=1}^{i} c_j - c_i/2 + C_A\right)\right] + t_A$$

$$\text{Delay } (P_{k+1} \rightarrow B) = \sum_{i=k+1}^{n}\left[r_i\left(\sum_{j=1}^{n} c_j - c_i/2 + C_B\right)\right] + t_B$$

Here, $r_i$: resistance across a segment $r_k$: resistance of a resistor at an equal delay branch segment $c_j$: capacitance at a segment $c_k$: capacitance of a capacitor at an equal delay branch segment $C_A$: capacitance at the one receiver $C_B$: capacitance at the other receiver $t_A$: delay time by the one receiver $t_B$: delay time by the other receiver n+1: total number of the dividing points k: first number of the dividing points forming the equal delay branch segment.

Furthermore, the equal delay branch point determining step (step S3) determines the equal delay branch point x in an equal delay branch segment given by the equal delay branch segment determining step (step S2).

In this equal delay branch point determining step (step S3), as shown in FIG. 6, $t_A$ and $C_A$ are calculated regarding the segment from the dividing point $P_k$ to the gate A as a sub-clock tree A, and $t_B$ and $C_B$ are calculated regarding the segment from the dividing point $P_{k+1}$ to the gate B as a sub-clock tree B.

Here, $C_A$: total capacitance from the dividing point $P_k$ to the gate A $C_B$: total capacitance from the dividing point $P_{k+1}$ to the gate B $t_A$: delay by the wiring from the dividing point $P_k$ to the gate A $t_B$: delay by the wiring from the dividing point $P_{k+1}$ to the gate B In the segment from the dividing point $P_k$ to $P_{k+1}$, since the capacitance and resistance for a unit length are equal, the equal delay branch point x can be determined by the following equation, in the same method as the conventional technique from IBM.

$$x=[t_B-t_A)+\alpha L(C_B+\beta L/2)]/[\alpha L(\beta L+C_A+C_B)]$$

here,

L: wiring length between the two receivers

α: resistance for a unit length of the wiring

β: capacitance for a unit length of the wiring.

Figure 8:
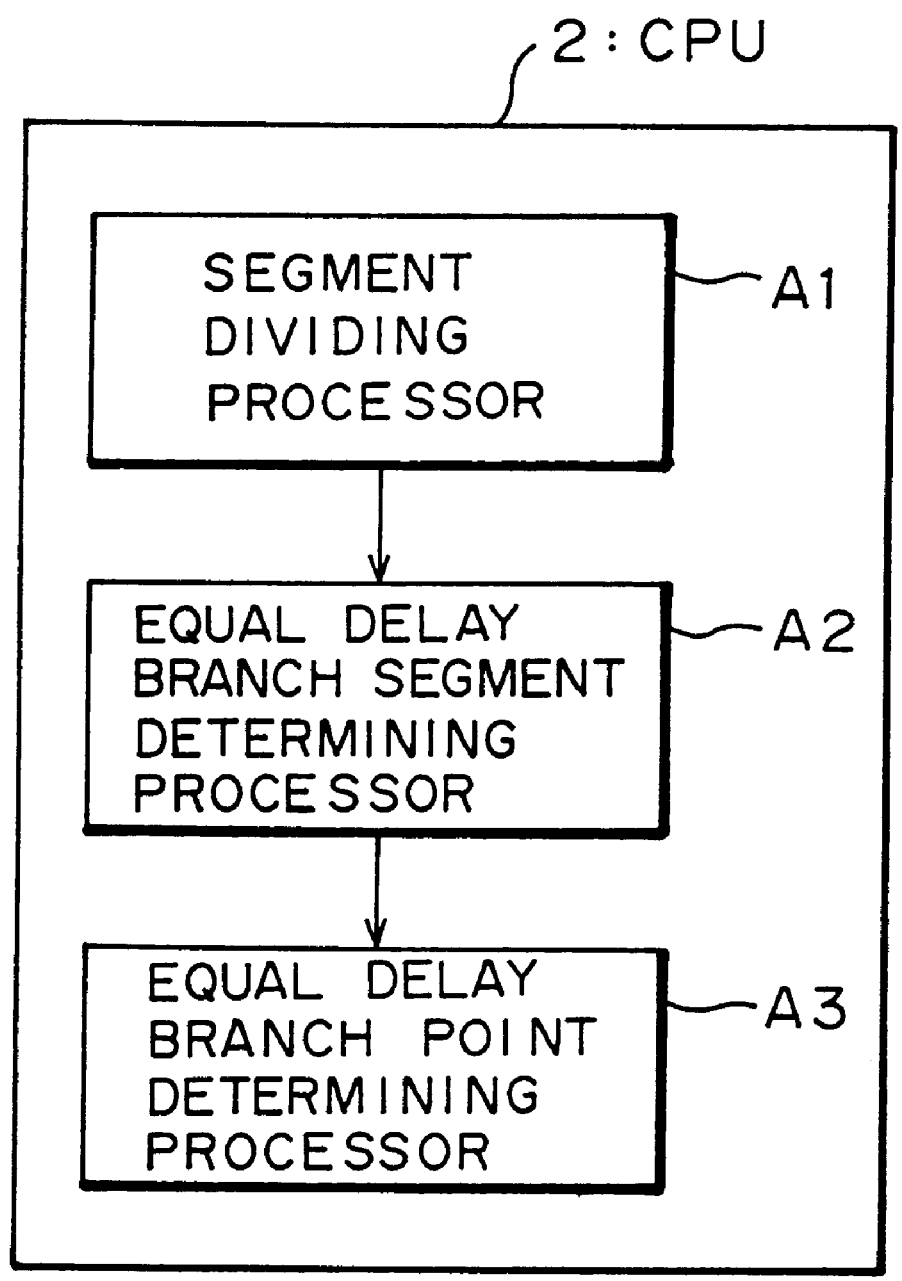
FIG. 8 is a functional block diagram for explaining the first mode of the wiring processing equipment for reducing the clock skew according to the invention.

Here, the wiring processing method formed of the foregoing steps (step S1 through S3) is executed on the basis that the CPU 2 (refer to FIG. 1) of the interactive circuit designing equipment 1 has the functions equivalent to a segment dividing processor A1, equal delay branch segment determining processor A2, and equal delay branch point determining processor A3, as shown in FIG. 8.

The segment dividing processor A1 divides the wiring connecting between the two receivers 31, 34 of the clock net on the clock distributing circuit of the clock synchronous circuit into at least three or more segments 43 through setting at least two or more dividing points $P_1, \ldots, P_{n+1}$ on the wiring. The equal delay branch segment determining processor A2 determines the segment 43 containing the equal delay branch point x out of the segments 43 picked up by the segment dividing processor A1 as the equal delay branch segment.

Concretely, the equal delay branch segment determining processor A2 compares the first delay time [Delay ($P_k \rightarrow A$)] from one dividing point $P_k$ on one end of the segment 43 to one receiver of the foregoing two receivers 31, 34 (in FIG. 5, the receiver 31 connected to a gate A on the subsequent stage) with the second delay time [Delay ($P_k \rightarrow B$)] from the one dividing point $P_k$ to the other receiver of the foregoing two receivers 31, 34 (in FIG. 5, the receiver 34 connected to a gate B on the subsequent stage), and compares the third delay time [Delay ($P_{k+1} \rightarrow A$)] from the other dividing point $P_{k+1}$ on the other end of the segment 43 to the one receiver of the foregoing two receivers 31, 34 with the fourth delay time [Delay ($P_{k+1} \rightarrow B$)] from the other dividing point $P_{k+1}$ to the other receiver of the foregoing two receivers 31, 34. Further, the equal delay branch segment determining processor A2 determines that the segment 43 in which the magnitude of the first delay time [Delay ($P_k \rightarrow A$)] against the second delay time [Delay ($P_k \rightarrow B$)] and the magnitude of the third delay time [Delay ($P_{k+1} \rightarrow A$)] against the fourth delay time [Delay ($P_{k+1} \rightarrow B$)] are inverted as the equal delay branch segment where the equal delay branch point x exists.

Furthermore, the equal delay branch point determining processor A3 determines an equal delay branch point x in the equal delay branch segment given by the equal delay branch segment determining processor A2.

And in practice, such functions as being equivalent to these processors A1 through A3 can be embodied by a wiring processing program, stored in the hard disk 8, whereby the CPU 2 of the interactive circuit designing equipment 1 executes the procedures described later.

Here, the wiring processing program in the present mode is a software whereby the interactive circuit designing equipment 1 executes a segment dividing procedure, equal delay branch segment determining procedure, and equal delay branch point determining procedure.

The segment dividing procedure sets at least two or more dividing points $P_1, \ldots, P_{n+1}$ on the wiring between the receiver 31 and 34 of the clock net on the clock distributing circuit of the clock synchronous circuit and divides the wiring into at least three or more segments 43.

The equal delay branch segment determining procedure determines the segment 43 containing the equal delay branch point "x" out of the segments 43 obtained by the segment dividing procedure as the equal delay branch segment.

Concretely, the equal delay branch segment determining procedure compares the first delay time [Delay ($P_k \rightarrow A$)] from one dividing point $P_k$ on one end of the segment 43 to one receiver of the foregoing two receivers 31, 34 (in FIG. 5, the receiver 31 connected to a gate A on the subsequent stage) with the second delay time [Delay ($P_k \rightarrow B$)] from the one dividing point $P_k$ to the other receiver of the foregoing two receivers 31, 34 (in FIG. 5, the receiver 34 connected to a gate B on the subsequent stage), and compares the third delay time [Delay ($P_{k+1} \rightarrow A$)] from the other dividing point $P_{k+1}$ on the other end of the segments 43 to the one receiver of the foregoing two receivers 31, 34 with the fourth delay time [Delay ($P_{k+1} \rightarrow B$)] from the other dividing point $P_{k+1}$ to the other receiver of the foregoing two receivers 31, 34. Further, the equal delay branch segment determining procedure determines the segment in which the magnitude of the first delay time [Delay ($P_k \rightarrow A$)] against the second delay time [Delay ($P_k \rightarrow B$)] and the magnitude of the third delay time [Delay ($P_{k+1} \rightarrow A$)] against the fourth delay time [Delay ($P_{k+1} \rightarrow B$)] are inverted as the equal delay branch segment where the equal delay branch point "x" exists.

Furthermore, the equal delay branch point determining procedure determines an equal delay branch point x in the equal delay branch segment given by the equal delay branch segment determining procedure.

Based on the foregoing construction, in the interactive circuit designing equipment 1 relating to the embodiment of the invention, the following operation determines the equal delay branch point x in the wiring between the two sub-clock trees.

In the interactive circuit designing equipment 1, the segment dividing step (step S1) sets at least two or more dividing points $P_1, \ldots, P_{n+1}$ on the wiring between the receiver 31 and 34 by, and divides the wiring into at least three or more segments 43.

Next, the equal delay branch segment determining step (step S2) determines, as described above, the first through the fourth delay time [Delay ($P_k \rightarrow A$), Delay ($P_k \rightarrow B$), Delay ($P_{k+1} \rightarrow A$), Delay ($P_{k+1} \rightarrow B$)] out of the segments 43 obtained by the segment dividing step (Step S1); and compares the first delay time [Delay ($P_k \rightarrow A$)] with the second delay time [Delay ($P_k \rightarrow B$)], and the third delay time [Delay ($P_{k+1} \rightarrow A$)] with the fourth delay time [Delay ($P_{k+1} \rightarrow B$)].

The equal delay branch segment determining step (step S2) further determines the segment in which the magnitude of the first delay time [Delay ($P_k \rightarrow A$)] against the second delay time [Delay ($P_k \rightarrow B$)] and the magnitude of the third delay time [Delay ($P_{k+1} \rightarrow A$)] against the fourth delay time [Delay ($P_{k+1} \rightarrow B$)] are inverted as the equal delay branch segment where the equal delay branch point "x" exists.

Furthermore, the equal delay branch point determining step (step S3) determines the equal delay branch point "x" in the equal delay branch segment obtained by the equal delay branch segment determining step (step S2).

According to the first mode of the wiring processing method for reducing the clock skew in the interactive circuit designing equipment 1 relating to the embodiment of the invention, in the clock net on the clock distributing circuit of the clock synchronous circuit, the wiring between the receiver 31 and 34 is divided into a plurality of segments 43 to evaluate the delay time by means of a plurality of single Π type RC circuits. Thereby, it is possible to take into account that the resistance and capacitance for a unit grid are not equal independently of the positions on the wiring, and to determine the equal delay branch point "x" accurately on the wiring between the receiver 31 and 34.

Further, the dividing points $P_1, \ldots, P_{n+1}$ are determined from (1) a physical branch point on a wiring connecting between the receiver 31 and 34, (2) a point at which the impedance for a unit length of the wiring connecting between the receiver 31 and 34 changes, or (3) a point at which the length of a segment 43 exceeds a predetermined length s (s: optional constant). Thereby, the dividing points $P_1, \ldots, P_{n+1}$ can be set so as to match the condition of each of the clock nets, and the equal delay branch point "x" can be determined more precisely.

Since it is possible to precisely determine the equal delay branch point in this manner, the delay time from the driver (not illustrated in FIG. 6) to the receiver 31 and 34 can be made equal; thereby, reducing the clock skew in the clock tree 30 on the clock nets.

(b2) Description on the second Mode of the Wiring Processing Method for Reducing the Clock Skew Furthermore, the second mode of the wiring processing method for the interactive circuit designing equipment 1 relating to the embodiment of the invention will be described, whereby the clock skew, namely, the difference of clock propagation delay time in a clock synchronous circuit can be reduced.

The second mode of the wiring processing method for reducing the clock skew will be described in which the gate delay (extra-source gate delay) increased by applying the driver being the clock generator to a load is considered in determining the equal delay branch point on the wiring between the receivers. Further, the length of the wiring between the equal delay branch point and the driver output point (external clock source gate) can be adjusted to set the delay time from the driver to the receivers to a target value, thereby the clock skew on the clock nets can effectively be reduced.

Figure 9:
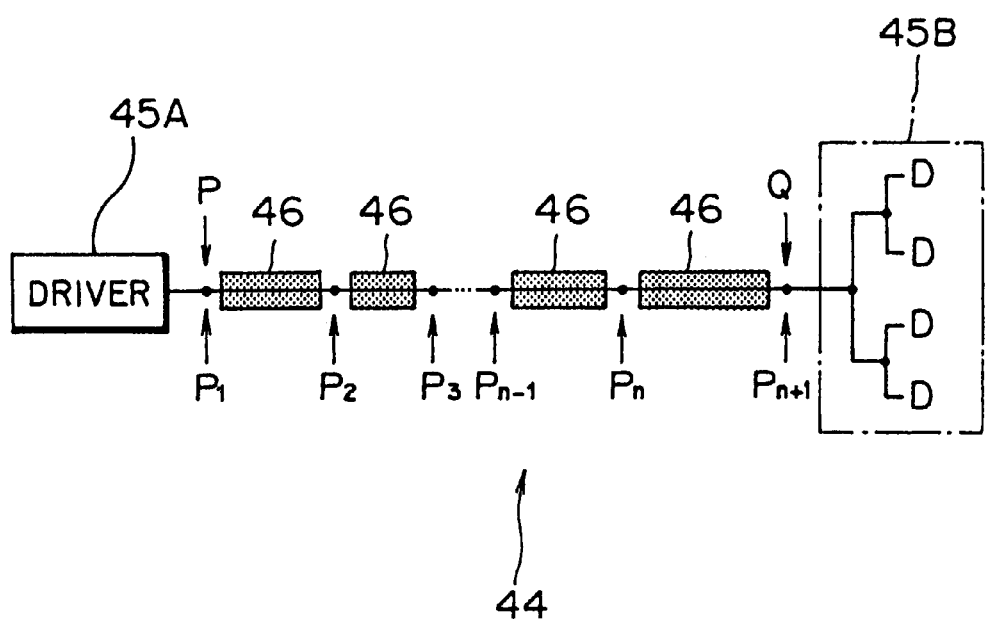
FIGS. 9 and 10 are illustrations typically showing a construction of a clock net on a clock distributing circuit in the second mode of the wiring processing method for reducing the clock skew according to the invention.

FIG. 9 shows a typical construction of a clock net 44 including a driver (clock generator) 45A and a clock tree 45B.

Here, the clock net 44 lies on the clock distributing circuit of the clock synchronous circuit, and the clock tree 45B comprises a plurality of clock trees (refer to FIGS. 5 and 6, reference symbol 30).

Namely, this FIG. 9 represents a state that a plurality of receivers (refer to FIGS. 5 and 6, reference symbol 31, 34) have completely been connected to form clock trees and a plurality of the clock trees thus formed have completely been connected each other to form the clock tree 45B, and then, the equal delay branch point Q (the final equal delay branch point on the wiring between the receivers) and the driver output point P (external clock source gate) are connected by the shortest wiring.

In this mode, after the equal delay branch point Q is accurately determined on the clock tree 45B, the length of the wiring between the equal delay branch point Q and the driver output point P is designed to be adjusted so that the delay time from the driver output point P to each of the receivers in the clock tree 45B can be set to the predetermined time.

Figure 13:
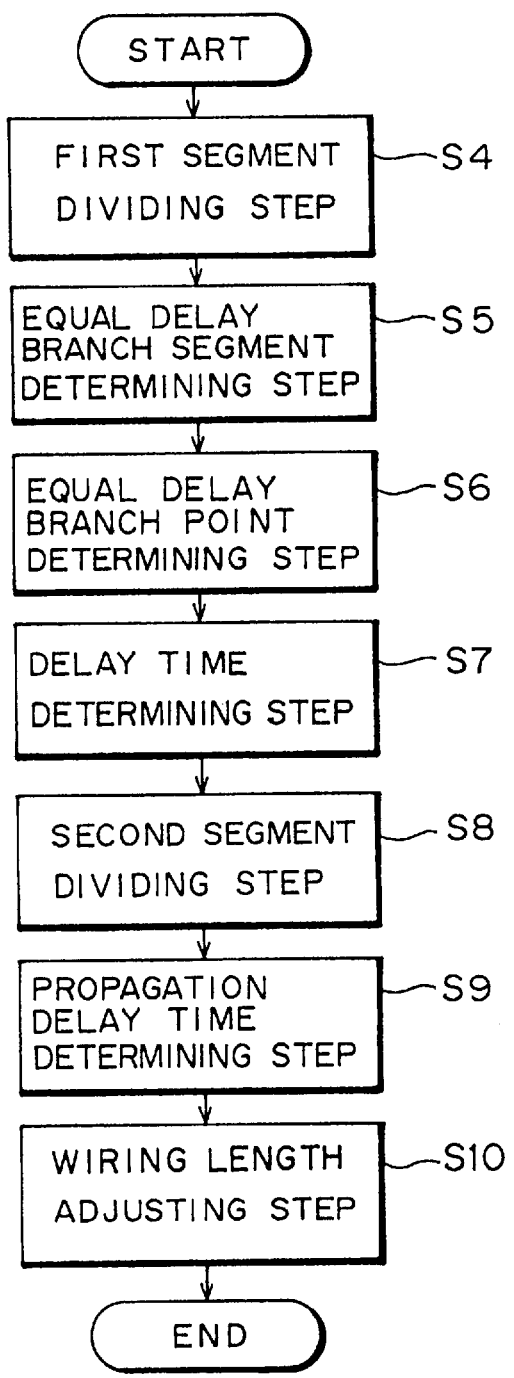
FIG. 13 is a flow chart for explaining the second mode of the wiring processing method for reducing the clock skew according to the invention.

The wiring processing method in this mode comprises, as shown in FIG. 13, a first segment dividing step (step S4), equal delay branch segment determining step (step S5), equal delay branch point determining step (step S6), delay time determining step (step S7), second segment dividing step (step S8), propagation delay time determining step (step S9), and wiring length adjusting step (step S10).

The first segment dividing step (step S4) sets at least two or more dividing points (branch points) on the wiring (the same as one shown in FIG. 5) between the two receivers in the clock tree 45B on the clock net 44 and divides the wiring into at least three or more segments.

In this mode, in the same manner as the abovementioned, from the consideration that the resistance and capacitance for a unit grid in the wiring are not equal independently of the positions, the delay time is evaluated by means of a plurality of the Π type RC circuits (refer to FIG. 6, reference symbol 43) given by dividing the wiring connecting between two receivers in the clock net 44 into a plurality of segments.

In FIG. 9, the dividing points and segments in the clock tree 45B are omitted.

The dividing points are determined, in the same manner as the foregoing case, from (1) a physical branch point on a wiring connecting between the receivers, (2) a point at which the impedance for unit length of the wiring connecting between the receivers changes, or (3) a point at which the length of a segment exceeds a predetermined length s (s: optional constant).

Further, the equal delay branch segment determining step (step S5) determines the segment containing the equal delay branch point Q out of the segments obtained by the first segment dividing step (step S4) as the equal delay branch segment.

Concretely, the equal delay branch segment determining step (step S5) compares, in the same manner as the foregoing case, the first delay time from one dividing point on one end of the segment to one receiver of the foregoing two receivers with the second delay time from the one dividing point to the other receiver of the foregoing two receivers, and compares the third delay time from the other dividing point on the other end of the segment to the one receiver of the foregoing two receivers with the fourth delay time from the other dividing point to the other receiver of the foregoing two receivers. The equal delay branch segment determining step (step S5) further determines the segment in which the magnitude of the first delay time against the second delay time and the magnitude of the third delay time against the fourth delay time are inverted as the equal delay branch segment where the equal delay branch point Q exists.

The foregoing first through fourth delay time can be obtained in the same manner as the foregoing case (b1) [refer to Delay ($P_k$ → A), Delay ($P_k$ → B), Delay ($P_{k+1}$ → A), Delay ($P_{k+1}$ → B) in the above mentioned].

Furthermore, the equal delay branch point determining step (step S6) determines an equal delay branch point Q in the equal delay branch segment given by the equal delay branch segment determining step (step S5).

The equal delay branch point Q can also be obtained in the same manner as the case described in (b1).

Further, the delay time determining step (step S7) obtains the fifth delay time $t_R$ from the equal delay branch point Q given by the equal delay branch point determining step (step S6) to each of the receivers.

Figure 10:
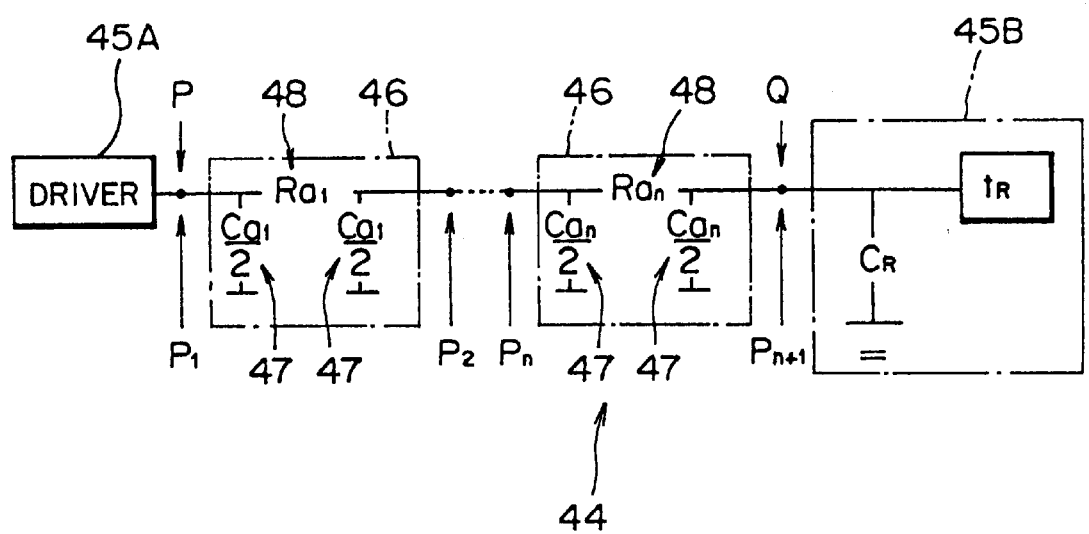

The fifth delay time $t_R$ is a delay time from the equal delay branch point Q in the clock tree 45B to each of the receivers, as shown in FIG. 10.

Here, the fifth delay time $t_R$ is obtained from the following equation:

$$t_R = r_1 \ (c_1/2 + C_A) + t_A = \alpha \ L \ Q \ (\beta \ L \ Q + C_A) + t_A$$

here,

L: wiring length between the receivers

α: resistance for a unit length of the wiring

β: capacitance for a unit length of the wiring.

The second segment dividing step (step S8) sets, as shown in FIG. 9, at least two or more dividing points (branch points) $P_1, \ldots, P_{n+1}$ on the wiring from the equal delay branch point Q through the driver output point P and divides the wiring into at least three or more segments 46.

In this mode, in the same manner as the abovementioned, from the consideration that the resistance and capacitance for a unit grid in the wiring are not equal independently of the positions, the delay time is evaluated by means of a plurality of the Π type RC circuits (refer to FIG. 10) given by dividing the wiring connecting between the equal delay point Q and the driver output point P into a plurality of segments 46.

In the second segment dividing step (step S8), the wiring between the equal delay point Q and the driver output point P is divided into the segments 46 by the dividing points $P_1, \ldots, P_{n+1}$ with the conditions mentioned below.

(1) a point at which the impedance for a unit length of the wiring connecting between the equal delay point Q and the driver output point P changes.

Here, the impedance for a unit length of the wiring changes where the wiring layer changes, however, it changes even where the wiring layer does not change. Therefore, it is effective to divide the wiring at such a point that the impedance for a unit length of the wiring changes. Here, the impedance is a resistance or capacitance.

(2) a point at which the length of a segment 46 exceeds a predetermined length s (s: optional constant).

Here, the length s is a length determined from experience.

The segments 46 are divided at the dividing points $P_1, \ldots, P_{n+1}$ which correspond to the aforementioned (1) and (2), each of which is evaluated by means of the Π type RC circuit (Π type RC model) consisting of one resistor 48 (resistance $Ra_1, \ldots, Ra_n$) and two capacitors 47 [capacitance $(Ca_1/2), \ldots, (Ca_n/2)$], as shown in FIG. 10.

The propagation delay time determining step (step S9) obtains a propagation delay time $t_{PQ}$ of the wiring in which the delay time of each of the segments 46 given by the second segment dividing step (step S8) is taken into account.

Here, the propagation delay time t PQ is obtained from the following equation.

$$t_{PQ} = \sum_{i=1}^{n} \left[ Ra \left( \sum_{j=i}^{n} Ca_j - Ca_i/2 + C_R \right) \right]$$

n+1: total number of the dividing points

The wiring length adjusting step (step S10) compares the delay time [Delay (P → each receiver)] from the driver output point P to each of the receivers with a preset time, and on the basis of the comparison result, adjusts the wiring length for each segment.

Here, the delay time [Delay (P → each receiver)] from the driver output point P to each of the receivers is the sum of the fifth delay time $t_R$ from the equal delay branch point Q given by the delay time determining step (step S7) to each of the receivers, the propagation delay time $t_{PQ}$ of the wiring given by the propagation delay time determining step (step S 9), and the external clock delay time (extra-source gate delay) $t_{LOAD}$ at the driver output point P.

Namely, as shown in FIG. 10, assuming that the delay time from the equal delay branch point Q to each of the receivers in the clock tree 45B is $t_R$ (the fifth delay time) and the total capacitance from the equal delay branch point Q to each of the receivers is $C_R$, the delay time [Delay (P → each receiver)] from the driver output point P to each of the receivers is given by the following equation.

Delay (P → each receiver)=$t_{LOAD}+t_{PQ}+t_R$

Figure 12:
FIG. 12 is an illustration for explaining an external clock delay.

Here, the external clock delay time (extra source gate delay) $t_{LOAD}$ is described with reference to FIG. 12. In the figure, the delay time $T_{INTERCONNECT\ delay}$ delay in the wiring between the driver (SOURCE) and the receiver (LOAD) is given by the following equation:

$T_{INTERCONNECT\ delay} \approx T_{AC} - T_{AB}(0) = [T_{AB}(L) - T_{AB}(0)] + T_{BC}$ here, $T_{AB}$ (0): delay through an unloaded source gate $T_{AB}$ (L): delay through the same source gate loaded by an interconnect net of length L.

And, $[T_{AB}(L) - T_{AB}(0)]$ in the foregoing equation represents the external clock delay $t_{LOAD}$.

In the wiring length adjusting step (step S10), y1, y2, and y3 for calculating the admittance viewed from the dividing point $P_1$ shown in FIGS. 9, 10 are calculated in order to obtain $t_{LOAD}$ at the dividing point $P_1$.

Namely, $t_{LOAD}$ at the dividing point $P_1$ can be obtained through the calculation that the equations y1, y2, and y3 for calculating the admittance viewed from the dividing point $P_1$ are calculated and a specific calculation (whose detailed content does not concern this mode) is carried out using these three equations.

Namely, $t_{LOAD}$=F (y1, y2, y3).

In this embodiment, the calculation of y1, y2, and y3 for calculating the admittance is performed on the basis of the method mentioned in 'P. R. O'Brien and T. L. Savarino, "Modeling the Driving-Point Characteristics of Resistive Interconnect for Accurate Delay Estimation", IEEE Intl. Conference on CAD, pp512–515, 1989'.

Figure 11:
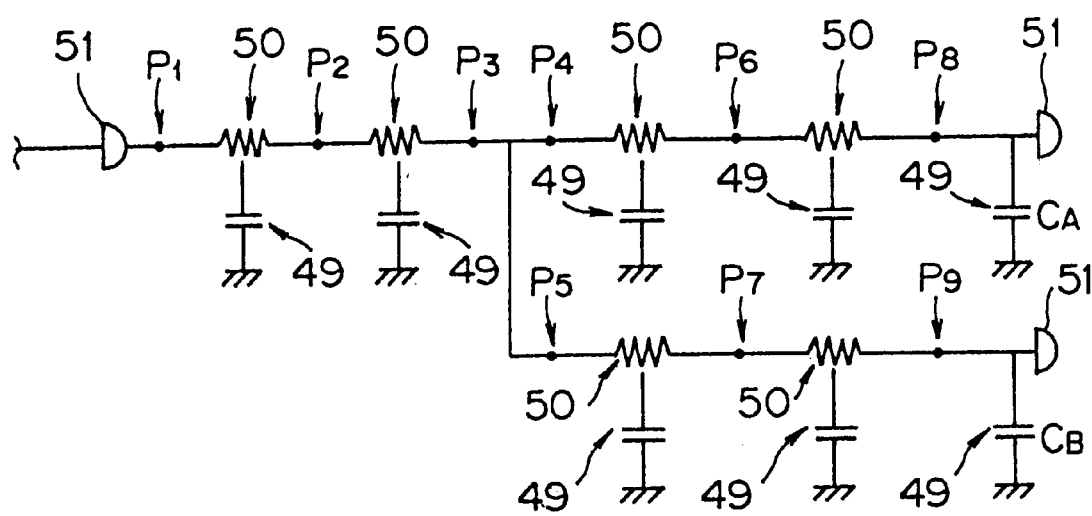
FIG. 11 is an illustration for explaining a calculation method of y1, y2, and y3 for calculating the admittance.

Here, a general wiring model to obtain y1, y2, and y3 is shown in FIG. 11.

In FIG. 11, numeral 49 is a capacitor, 50 resistor, 51 output pin from the driver or receiver, and $P_1 \sim P_9$ are dividing points.

A calculation method of y1, y2, and y3 for calculating the admittance viewed from the dividing point $P_1$ will hereafter be described.

First, assuming that the Laplace transform expression is $y_1$ (s), the Laplace transform from the receiver to the driver will be given by the following.

$y_8(s) = C_A \cdot s \rightarrow y_6(s) \rightarrow y_4(s)$ $y_9(s) = C_B \cdot s \rightarrow y_7(s) \rightarrow y_5(s)$ $y_3(s) = y_4(s) + y_5(s) \rightarrow y_2(s)$ $\rightarrow y_1(s)$ The tertiary approximation of $y_1$ (s) is expressed in the following equation:

$y_1(s) = y1 \cdot s + y2 \cdot s^2 + y3 \cdot s^3$, and the coefficient y1, y2, and y3 are obtained from this equation.

Thus, in the wiring length adjusting step (step S10), the delay time [Delay (P → each receiver)] from the driver output point P calculated by the foregoing equation to each of the receivers is compared with a preset time γ, and on the basis of this comparison, the wiring length between the equal delay branch point Q and the driver output point P can be adjusted for each segment.

When the delay time [Delay (P → each receiver)] from the driver output point P to each of the receivers exceeds the preset time γ at the beginning, the layout of the driver 45A and/or the clock tree 45B (refer to FIGS. 9 and 10) are relocated before the wiring length between the equal delay branch point Q and the driver output point P is readjusted.

Concretely, the relocation or the wiring length adjustment is done in accordance with the following:

if, Delay ($P \to$ each receiver)>$\gamma$: relocation, if, Delay ($P \to$ each receiver)=$\gamma$: end of processing, if, Delay ($P \to$ each receiver)<$\gamma$: wiring length adjustment.

The adjustment of the wiring length has to be done between the dividing point $P_1$ and $P_2$. Assuming that the shortest wiring length between the dividing point $P_1$ and $P_2$ is $L_{LOWER}$, the resistance $\alpha$ and capacitance $\beta$ for unit length of the wiring between the dividing point $P_1$ and $P_2$ are as follows.

$$\alpha = Ra_1/L_{LOWER}$$

$$\beta = Ca_1/L_{LOWER}$$

And, in the wiring newly arranged by the adjustment of the wiring length between the dividing point $P_1$ and $P_2$, the length L to satisfy Delay ($P \to$ each receiver)=$\gamma$ lies in $L_{LOWER} < L < L_{UPPER}$.

Here, $L_{UPPER}$ is the longest permissible wiring length, and in order to obtain $L_{UPPER}$, a segment of length s [which does not concern the s from the Laplace transform yi (s)] is inserted one by one and at each time of the insertion, y1, y2, and y3 are calculated to obtain $t_{LOAD}$.

LUPPER can be obtained by the following recursive calculation.

$$t_0 = t_{PQ} + t_R$$

$$C_0 = \Sigma_{i=1}^{n} Ca_i + C_R$$

$$L_0 = L_{LOWER}$$

$$y1_0 = y1$$

$$y2_0 = y2$$

$$y3_0 = y3$$

$$t_i = t_{i-1} + \alpha s \, (\beta s/2 + C_{i-1})$$

$$C_i = C_{i-1} + \beta s$$

$$L_i = L_{i-1} + s$$

Here, referring to the literature by the P. R. O'Brien and T. L. Savarino, $$y1_i = f(y1_{i-1})$$

$$y2_i = g(y1_{i-1}, y2_{i-1})$$

$$y3_i = h(y1_{i-1}, y2_{i-1}, y3_{i-1}),$$

thereby, $$t_{LOAD} = F(y1_i, y2_i, y3_i).$$

Here, the value of $s \cdot i + L_{LOWER}$ when $t_i + t_{LOAD} > \gamma$ is first met is regarded as $L_{UPPER}$, and the value $L_{i-1}$ is taken up as a new $L_{LOWER}$. Here, the s is a natural number, and the number of about 50 is considered as appropriate.

Furthermore, while the wiring length L between the dividing point $P_1$ and $P_2$ is determined by means of the dichotomy between $s \cdot (i-1) + L_{LOWER}$ and $L_{UPPER}$, the delay time [Delay (P$\to$each receiver)] from the driver output point P to each of the receivers is calculated, and thereby the wiring length L with which the delay time becomes equal to the preset value $\gamma$ is determined.

Assuming that the segment of length s is sequentially inserted between the driver output pin 51 and the dividing point $P_1$ and the calculation is continued until the delay time from the driver output point P (refer to FIGS. 9, 10) to each of the receivers exceeds the preset value $\gamma$, the segment of length $s \cdot i$ (i: number of repetition) is inserted in total when the delay time under calculation exceeds the preset value $\gamma$.

Since the wiring length L with which the delay time becomes equal to the preset value $\gamma$ satisfies the inequality $$[s \cdot (i-1) + L_{UPPER}] < L < (s \cdot i + L_{UPPER}),$$

the wiring length L can be obtained by means of the dichotomy.

And, the wiring between the dividing point $P_1$ and $P_2$ is removed and the wiring is rearranged with the length L.

Figure 14:
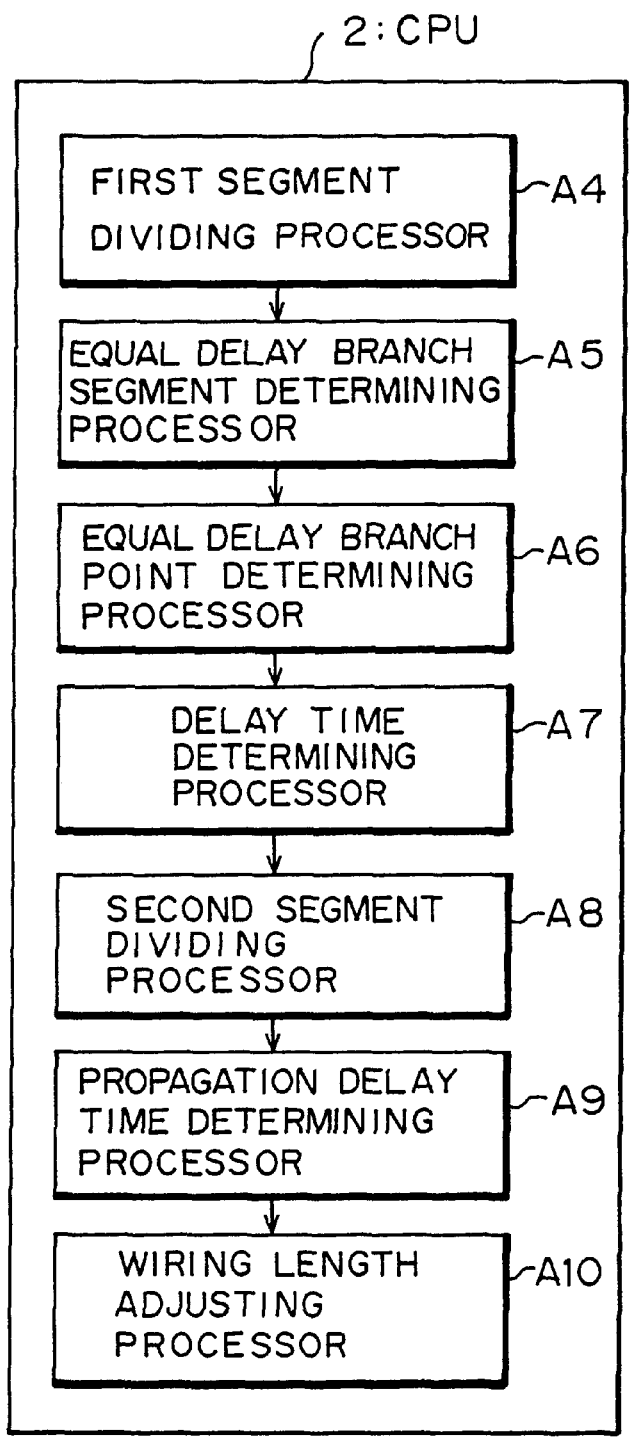
FIG. 14 is a functional block diagram for explaining the second mode of the wiring processing equipment for reducing the clock skew according to the invention.

The wiring processing method formed of the foregoing steps (step S4 through S10) is executed on the basis that the CPU 2 (refer to FIG. 1) of the interactive circuit designing equipment 1 has the functions equivalent to a first segment dividing processor A4, equal delay branch segment determining processor A5, equal delay branch point determining processor A6, delay time determining processor A7, second segment dividing processor A8, propagation delay time determining processor A9, and wiring length adjusting processor A10, as shown in FIG. 14.

The first segment dividing processor A4 executes to divide the wiring connecting between the two receivers of the clock net 44 on the clock distributing circuit of the clock synchronous circuit into at least three or more segments through setting at least two or more dividing points on the wiring.

Still, the equal delay branch segment determining processor A5 compares, in the segment given by the first segment dividing processor A4, the first delay time from one dividing point on one end of the segment to one receiver of the foregoing two receivers with the second delay time from the one dividing point to the other receiver of the foregoing two receivers, and compares the third delay time from the other dividing point on the other end of the segment to the one receiver of the foregoing two receivers with the fourth delay time from the other dividing point to the other receiver of the foregoing two receivers. The equal delay branch segment determining processor A5 further determines the segment in which the magnitude of the first delay time against the second delay time and the magnitude of the third delay time against the fourth delay time are inverted as the equal delay branch segment where the equal delay branch point exists.

Furthermore, the equal delay branch point determining processor A6 determines an equal delay branch point Q in the equal delay branch segment given by the equal delay branch segment determining processor A5.

Further, the delay time determining processor A7 obtains the fifth delay time $t_R$ from the equal delay branch point Q given by the equal delay branch point determining processor A6 to each of the receivers.

Further, the second segment dividing processor A8 sets at least two or more dividing points $P_1, \ldots, P_{n+1}$ on the wiring from the equal delay branch point Q through the driver output point P and divides the wiring into at least three or more segments 46.

The propagation delay time determining processor A9 gives a propagation delay time $t_{PQ}$ of the wiring in which the delay time of each of the segments 46 obtained by the second segment dividing processor A8 is taken into account.

Still more, the wiring length adjusting processor A10 compares the preset time $\gamma$ with the delay time [Delay (P$\to$each receiver)] from the driver output point P to each of the receivers, namely, the sum of the fifth delay time $t_R$ from the equal delay branch point Q given by the delay time determining processor A7 to each of the receivers, the propagation delay time $t_{PQ}$ of the wiring given by the propagation delay time determining processor A9, and the external clock delay time $t_{LOAD}$ at the driver output point P; and on the basis of the comparison result, adjusts the wiring length for each segment.

And in practice, such functions as being equivalent to these processors A4 through A10 can be achieved by the wiring processing program, stored in the hard disk 8, whereby the CPU 2 of the interactive circuit designing equipment 1 executes the procedures described later.

Here, the wiring processing program in the present mode is a software whereby the interactive circuit designing equipment 1 executes a first segment dividing procedure, equal delay branch segment determining procedure, equal delay branch point determining procedure, delay time determining procedure, second segment dividing procedure, propagation delay time determining procedure, and wiring length adjusting procedure.

The first segment dividing procedure sets at least two or more branch points on the wiring between the two receivers of the clock net 44 on the clock distributing circuit of the clock synchronous circuit and divides the wiring into at least three or more segments.

Furthermore, the equal delay branch segment determining procedure compares, in the segment obtained by the first segment dividing procedure, the first delay time from one dividing point on one end of the segment to one receiver of the foregoing two receivers with the second delay time from the one dividing point to the other receiver of the foregoing two receivers, and compares the third delay time from the other dividing point on the other end of the segment to the one receiver of the foregoing two receivers with the fourth delay time from the other dividing point to the other receiver of the foregoing two receivers. The equal delay branch segment determining procedure further determines the segment in which the magnitude of the first delay time against the second delay time and the magnitude of the third delay time against the fourth delay time are inverted as the equal delay branch segment where the equal delay branch point exists.

The equal delay branch point determining procedure determines an equal delay branch point Q in the equal delay branch segment obtained by the equal delay branch segment determining procedure.

Further, the delay time determining procedure obtains the fifth delay time $t_R$ from the equal delay branch point Q given by the equal delay branch point determining procedure to each of the receivers.

The second segment dividing procedure sets at least two or more dividing points $P_1, \ldots, P_{n+1}$ on the wiring from the equal delay branch point Q through the driver output point P and divides the wiring into at least three or more segments 46.

The propagation delay time determining procedure obtains a propagation delay time $t_{PQ}$ of the wiring in which the delay time of each of the segments 46 given by the second segment dividing procedure is taken into account.

Furthermore, the wiring length adjusting procedure compares the preset time γ with the delay time [Delay (P→each receiver)] from the driver output point P to each of the receivers, namely, the sum of the fifth delay time $t_R$ from the equal delay branch point Q given by the delay time determining procedure to each of the receivers, the propagation delay time $t_{PQ}$ of the wiring given by the propagation delay time determining procedure, and the external clock delay time $t_{LOAD}$ at the driver output point P, and on the basis of the comparison result, adjusts the wiring length for each segment.

Based on the foregoing construction, in the interactive circuit designing equipment 1 relating to the embodiment of the invention, the following operation determines the equal delay branch point Q and adjusts the wiring length between the equal delay branch point Q and the driver output point P.

Namely, in the interactive circuit designing equipment 1, the first segment dividing step (step S4) sets at least two or more dividing points on the wiring between the two receivers of the clock net 44, and divides the wiring into at least three or more segments.

Next, the equal delay branch segment determining step (step S5) determines the segment in which an equal delay branch point Q exists out of the segments obtained by the first segment dividing step (step S4) as the equal delay segment.

Furthermore, the equal delay branch point determining step (step S6) determines the equal delay branch point Q in the equal delay branch segment obtained by the equal delay branch segment determining step (step S5).

Further, the delay time determining step (step S7) obtains the fifth delay time $t_R$ from the equal delay branch point Q given by the equal delay branch point determining step (step S6) to each of the receivers.

The second segment dividing step (step S8) sets, as shown in FIG. 9, at least two or more dividing points (branch points) $P_1, \ldots, P_{n+1}$ on the wiring from the equal delay branch point Q through the driver output point P and to divide the wiring into at least three or more segments 46.

The propagation delay time determining step (step S9) obtains a propagation delay time $t_{PQ}$ of the wiring in which the delay time of each of the segments 46 given by the second segment dividing step (step S8) is taken into account.

Further, the wiring length adjusting step (step S10) compares, the delay time [Delay (P→each receiver)] from the driver output point P (refer to FIGS. 9, 10) to each of the receivers with the preset time γ.

When the delay time [Delay (P→each receiver)] from the driver output point P to each of the receivers exceeds the preset time γ at the beginning [namely, Delay (P→each receiver)>γ], the driver 45A and/or clock tree 45B are relocated (refer to FIGS. 9, 10).

When the delay time [Delay (P→each receiver)] from the driver output point P to each of the receivers is less than the preset time γ [namely, Delay (P→each receiver)<γ], on the assumption that the segment of length s is sequentially inserted between the dividing point $P_1$ and $P_2$, the delay time [Delay (P→each receiver)] from the driver output point P to each of the receivers is calculated on each time of the insertion.

The calculation of the delay time [Delay (P→each receiver)] from the driver output point P to each of the receivers is continued until the delay time under calculation exceeds the preset time g, and in consequence, the wiring length L between the dividing point $P_1$ and $P_2$ is acquired with which the delay time becomes equal to the preset time γ by means of dichotomy, thereby adjusting the wiring length between the equal delay branch point Q and the driver output point P.

According to the second mode of the wiring processing method for reducing the clock skew in the interactive circuit designing equipment 1 relating to the embodiment of the invention, in each of the clock nets 44 on the clock distributing circuit of the clock synchronous circuit, the wiring connecting between the receivers in the clock tree 45B is divided into a plurality of segments to evaluate the delay time by means of a plurality of single Π type RC circuits. Thereby, it is possible to take into account that the resistance and capacitance for a unit grid are not equal independently of the positions on the wiring, and to determine the equal delay branch point Q accurately on the wiring connecting between the receivers.

Further, the dividing points are determined from (1) a physical branch point on a wiring connecting between the receivers, (2) a point at which the impedance for a unit length of the wiring connecting between the receivers changes, and (3) a point at which the length of a segment exceeds a predetermined length s (s: optional constant). Thereby, the dividing points can be set so as to match the condition of each of the clock nets 44, and the equal delay branch point Q can be determined more precisely.

Furthermore, as shown in FIG. 9, the wiring from the equal delay branch point Q through the driver output point P is divided into a plurality of segments 46 and the delay time is evaluated by means of a plurality of single Π type RC circuits, and thereby it is possible to take into account that the resistance and capacitance for a unit grid in the wiring are not equal independently of the positions. And, it is also possible to set the dividing points $P_1, \ldots, P_{n+1}$ so as to match the condition of each of the clock nets 44 by setting the dividing points $P_1, \ldots, P_{n+1}$ to (1) a point at which the impedance for a unit length of the wiring connecting between the equal delay point Q and the driver output point P changes, or (2) a point at which the length of a segment 46 exceeds a predetermined length s (s: optional constant).

In the clock net 44, the delay time [Delay (P→each receiver)] from the driver output point P to each of the receivers in the clock tree 45B is compared with the preset time. On the basis of this comparison result, the length of the wiring from the equal delay branch point Q to the driver output point P is adjusted for each segment. Consequently, the delay time from the driver 45A of the clock net 44 to each of the receivers in the clock tree 45B can be made equal, while considering the external clock delay time increased with a load applied to the driver 45A. Accordingly, the clock skew in the clock tree 45B of the clock net 44 can be reduced more effectively.

(b3) Description on the third Mode of the Wiring Processing Method for Reducing the Clock Skew Furthermore, the third mode of the wiring processing method for the interactive circuit designing equipment 1 relating to the embodiment of the invention will be described, whereby the clock skew, namely, the difference of clock propagation delay time in a clock synchronous circuit can be reduced.

In the third mode of the wiring processing method for reducing the clock skew, in each of the clock nets on the clock distributing circuit of the clock synchronous circuit, when the equal delay branch points in the wirings connecting between the receivers are accurately determined in advance, only adjusting the wiring length between the equal delay point and the driver output point (extra clock source gate) can reduce the clock skew in the clock net, while considering the external clock delay increased with a load applied to the driver.

Figure 15:
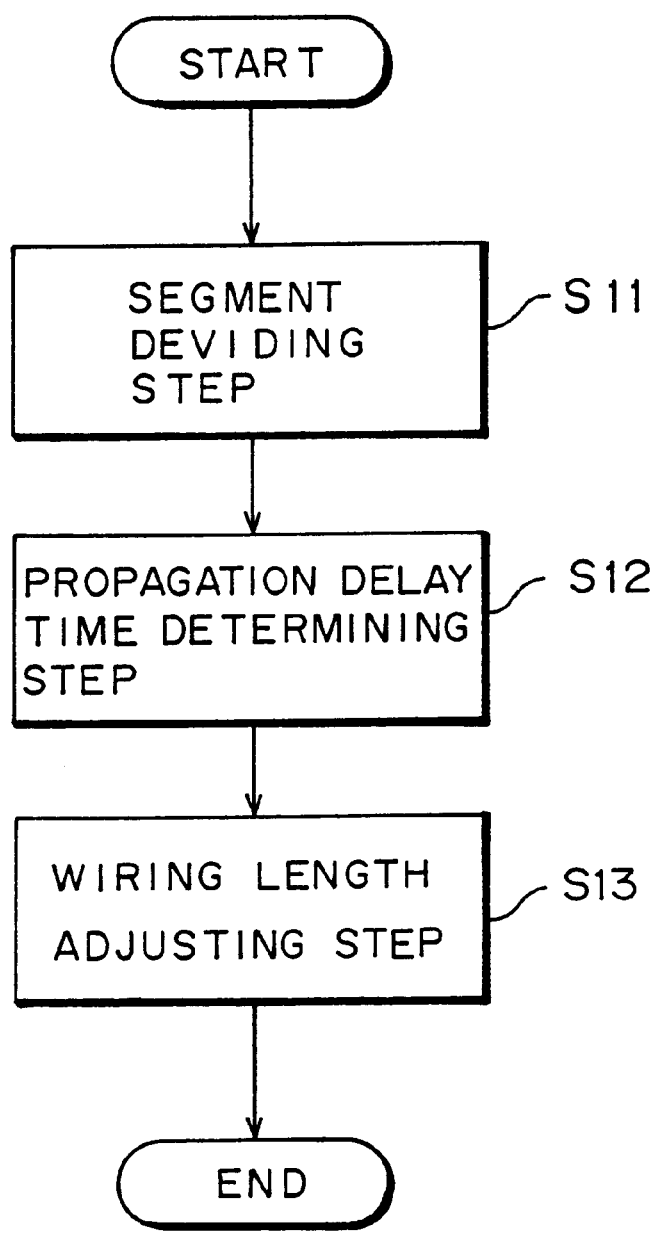
FIG. 15 is a flow chart for explaining the third mode of the wiring processing method for reducing the clock skew according to the invention.

The wiring processing method in this mode comprises, as shown in FIG. 15, a segment dividing step (step S11), propagation delay time determining step (step S12), and wiring length adjusting step (step S13).

The segment dividing step (step S11) sets at least two or more dividing points on the wiring between the equal delay point and the driver output point and divides the wiring into at least three or more segments.

The segment dividing step (step S11) is the same step as the foregoing second segment dividing step (step S8) in FIG. 13.

The propagation delay time determining step (step S12) gives a propagation delay time of the wiring in which the delay time for each of the segments obtained by the segment dividing step (step S11) is taken into account.

The propagation delay time determining step (step S12) is the same step as the foregoing propagation delay time determining step (step S9) in FIG. 13.

Further, the wiring length adjusting step (step S13) compares the propagation delay time of the wiring obtained by the propagation delay time determining step (step S12) with a preset time, and based on this comparison result, adjusts the wiring length for each segment.

The wiring length adjusting step (step S13) is the same step as the foregoing wiring length adjusting step (step S10) in FIG. 13.

Figure 16:
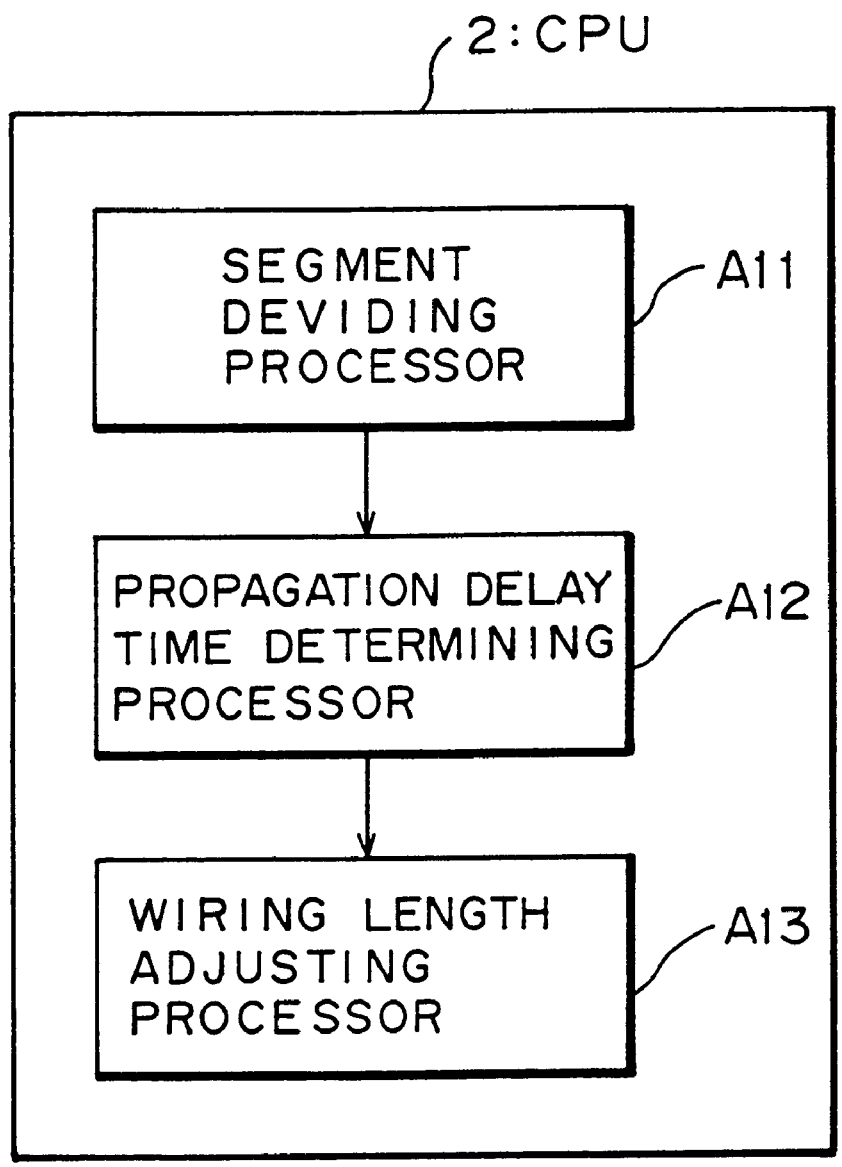
FIG. 16 is a functional block diagram for explaining the third mode of the wiring processing equipment for reducing the clock skew according to the invention.

The wiring processing method formed of the foregoing steps (step S11 through S13) is executed on the basis that the CPU 2 (refer to FIG. 1) of the interactive circuit designing equipment 1 has the functions equivalent to a segment dividing processor A11, propagation delay time determining processor A12, and wiring length adjusting processor A13, as shown in FIG. 16.

The segment dividing processor A11 sets at least two or more dividing points on the wiring on the clock distributing circuit of the clock synchronous circuit and divides the wiring into at least three or more segments.

The propagation delay time determining processor A12 gives a propagation delay time of the wiring in which the delay time for each of the segments obtained by the segment dividing processor A11 is taken into account.

Furthermore, the wiring length adjusting processor A13 compares the propagation delay time of the wiring obtained by the propagation delay time determining processor A12 with the preset time, and based on the comparison result, adjusts the wiring length for each segment.

And in practice, such functions as equivalent to these processors A11 through A13 can be achieved by the wiring processing program, stored in the hard disk 8, whereby the CPU 2 of the interactive circuit designing equipment 1 executes the procedures described later.

Here, the wiring processing program in the present mode is a software whereby the interactive circuit designing equipment 1 executes a segment dividing procedure, propagation delay time determining procedure, and wiring length adjusting procedure.

The segment dividing procedure sets at least two or more branch points on the wiring on the clock distributing circuit of the clock synchronous circuit and divides the wiring into at least three or more segments.

The propagation delay time determining procedure gives a propagation delay time of the wiring in which the delay time for each of the segments obtained by the segment dividing procedure is taken into account.

Furthermore, the wiring length adjusting procedure compares the propagation delay time of the wiring obtained by the propagation delay time determining procedure with the preset time, and based on the comparison result, adjusts the wiring length for each segment.

In the interactive circuit designing equipment 1 relating to the embodiment of the invention, based on the foregoing steps (step S11~S13) shown in FIG. 15, the same operations as the steps (step S8~S10) shown in FIG. 13 are performed, and the wiring length between the equal delay branch point and the driver output point is adjusted.

In this arrangement, the delay time from the driver of the clock net to each of the receivers can be made equal, and the clock skew in the clock tree on the clock net can be reduced effectively while considering the external clock delay increased with a load applied to the driver.

(b4) Description on the first Mode of the Wiring Processing Method for Determining a Wiring Path The first mode on the wiring processing method for determining an optimum wiring path in connecting the circuits on an LSI will be described as a wiring processing method in the interactive circuit designing equipment 1 relating to the embodiment of the invention.

The circuits on an LSI will be connected in accordance with an optimum wiring path searched by the automatic wiring system, as described above.

The method for determining a wiring path in this mode will now be described.

Figure 23:
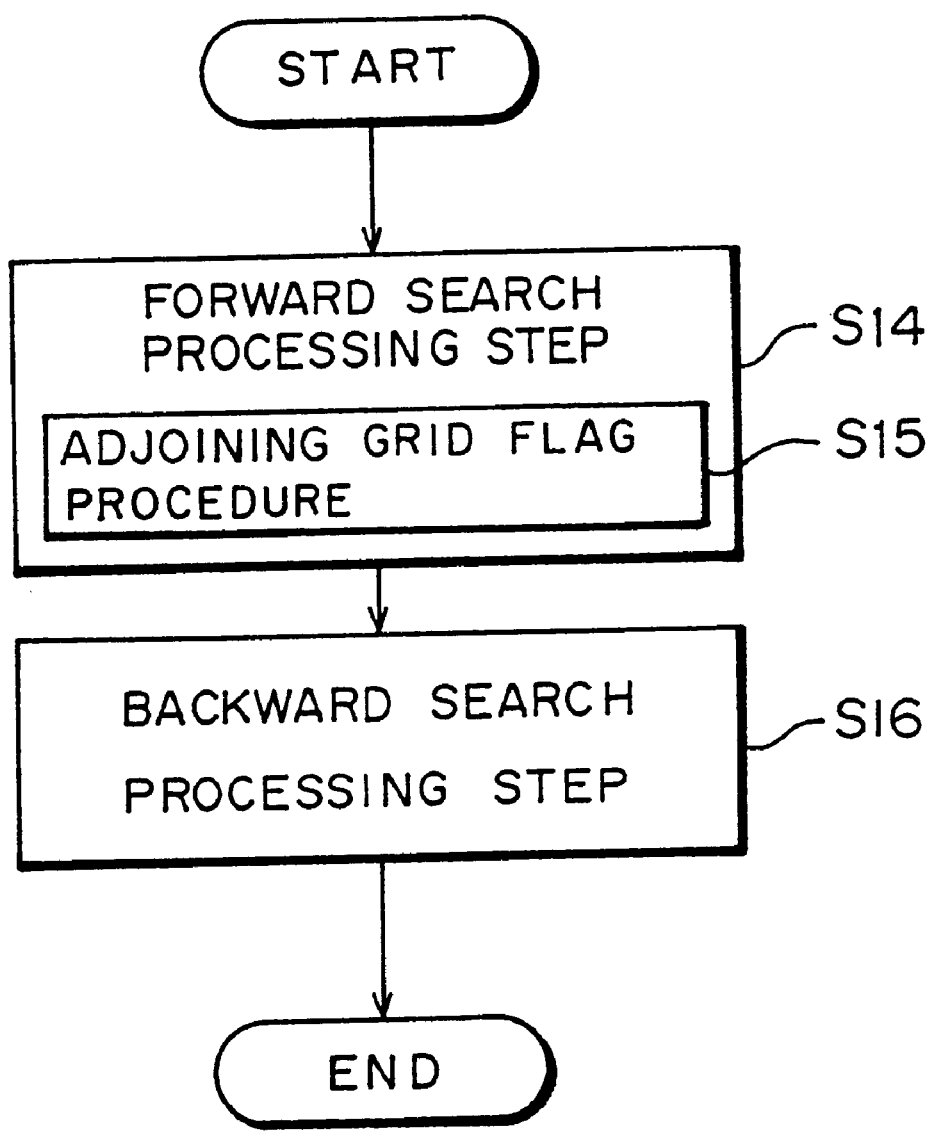
FIG. 23 is a flow chart for explaining the first mode of the wiring processing method for determining a wiring path according to the invention.

The wiring processing method for determining a wiring path in this mode comprises, as shown in FIG. 23, a forward search processing step (step S14) and a backward search processing step (step S16).

First, in this mode, in determining a wiring path of a wiring on a circuit board, an available flag, arrival state flag, and arrival direction flag are provided in advance in the hard disk 8 or the memory not illustrated of the interactive circuit designing equipment 1 shown in FIGS. 1, 2.

The available flag is to indicate whether the grid made by dividing the wiring area into grids by the unit of the minimum wiring pitch is available for the wiring or not. As shown in FIG. 18 (*b*), when the grid is available for wiring, "1" is set to the flag, when the grid is not available for wiring, "0" is set to the flag.

The arrival state flag is to indicate that a search segment arrives at the grid. As shown in FIG. 18 (*c*), when the search segment has arrived at the grid, "1" to show "arrived" is set to the flag, when the search segment has not arrived at the grid, "0" to show "not arrived" is set to the flag.

The available flag and arrival state flag each are provided with one bit for each wiring layer.

The arrival direction flag is to indicate the direction in which the search segment has arrived at the grid, and is provided with some bits for each wiring layer.

In case of one wiring layer, the available flag and arrival state flag are provided with one bit each.

When the X and Y axis are defined as the horizontal and vertical direction, respectively, the arrival direction flag is provided with a XY-direction flag [refer to FIG. 18 (*d*)] that indicates the arriving direction to be the X axis direction or Y axis direction for one bit, and a positive-negative direction flag [refer to FIG. 18 (*e*)] that indicates the arriving direction to be the positive or negative direction for one bit.

Further, the XY-direction flag is set with "1" when the arriving direction is the X axis direction, and set with "0" when the arriving direction is the Y axis direction, as shown in FIG. 18(*d*).

The positive-negative direction flag is set with "1" when the arriving direction is the positive direction, and set with "0" when the arriving direction is the negative direction, as shown in FIG. 18(*e*).

Figure 17:
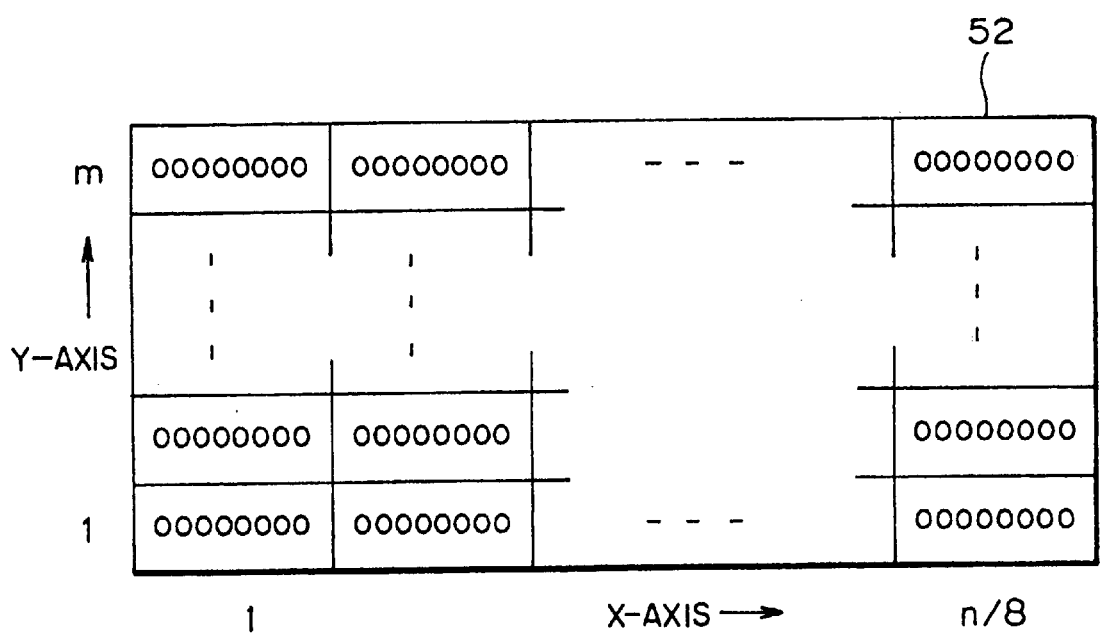
FIG. 17 is an illustration for explaining a construction of an available flag, arrival state flag, and arrival direction flag.
Figure 18A:
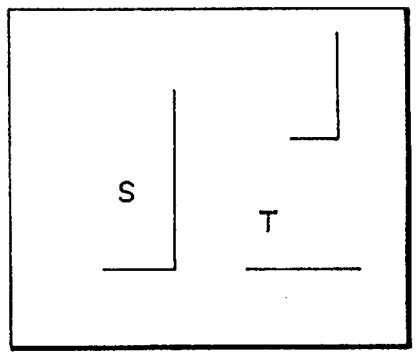
FIGS. 18(a) through 18(e), FIGS. 19(a) through 19(e), FIGS. 20(a) through 20(e), FIGS. 21(a) through 21(e), FIGS. 22(a) through 22(f) are illustrations for explaining the first mode of the wiring processing method for determining a wiring path according to the invention.
Figure 18B:
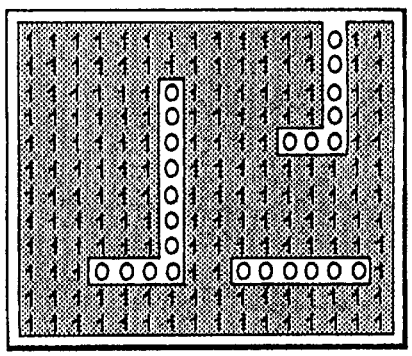
Figure 18C:
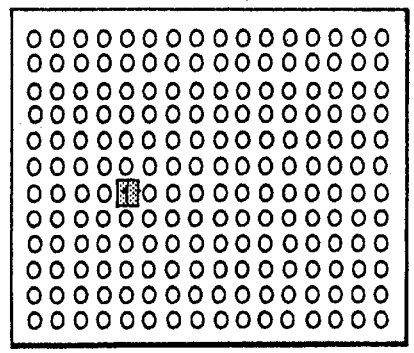
Figure 18D:
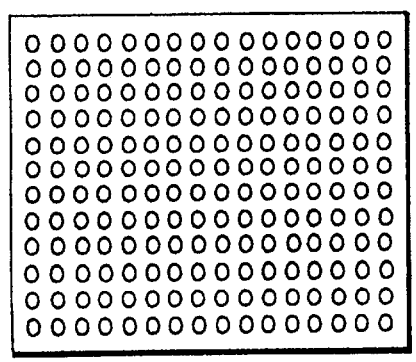
Figure 18E:
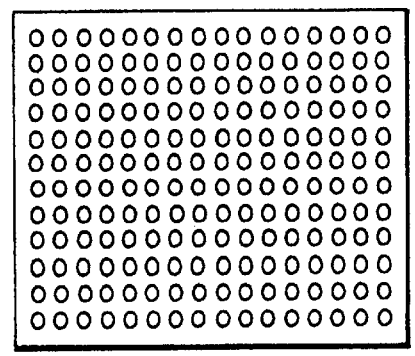
Figure 19A:
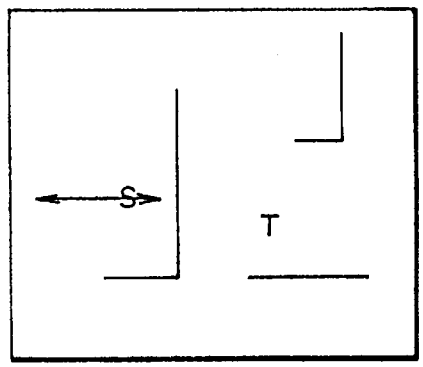
Figure 19B:
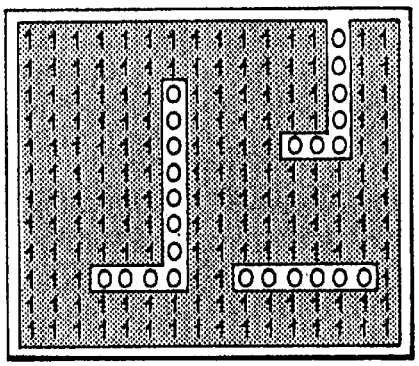
Figure 19C:
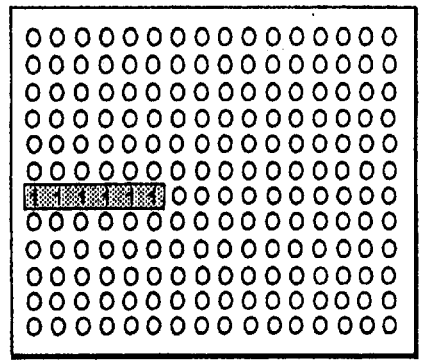
Figure 19D:
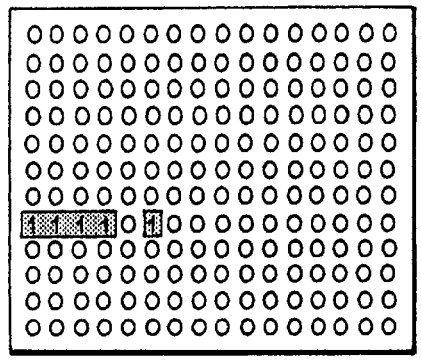
Figure 19E:
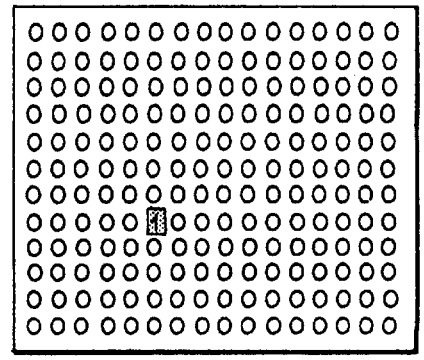
Figure 20A:
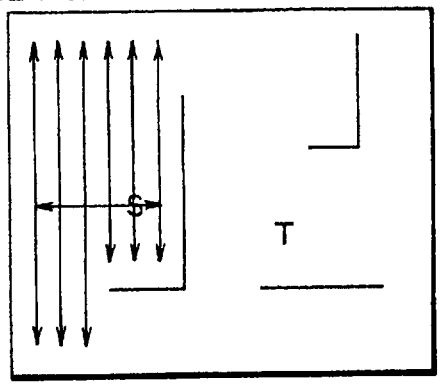
Figure 20B:
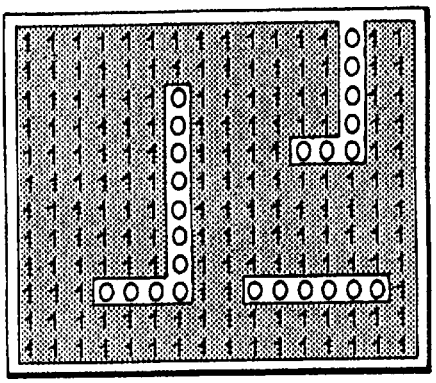
Figure 20C:
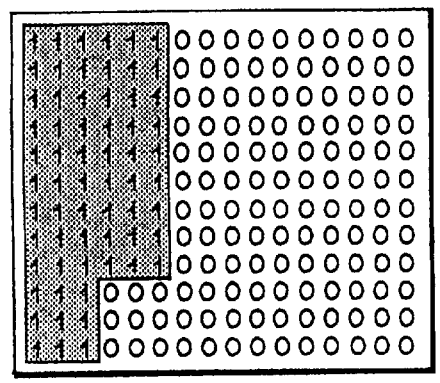
Figure 20D:
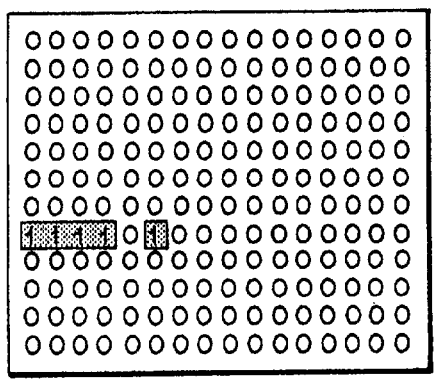
Figure 20E:
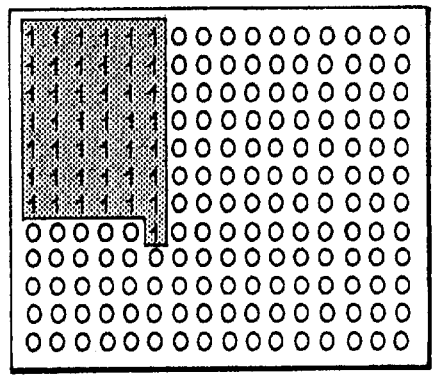
Figure 21A:
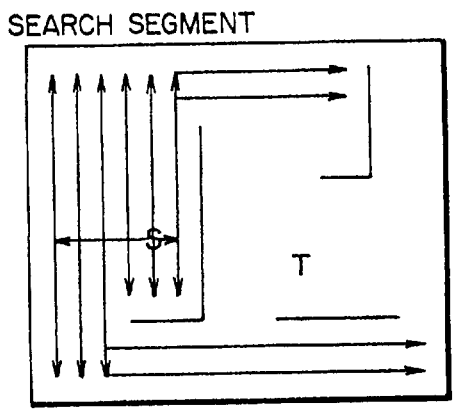
Figure 21B:
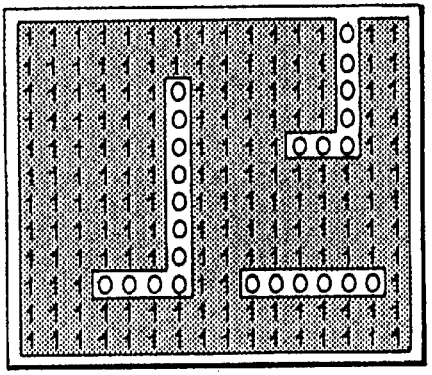
Figure 21C:
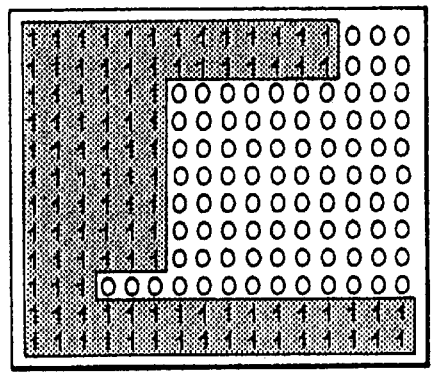
Figure 21D:
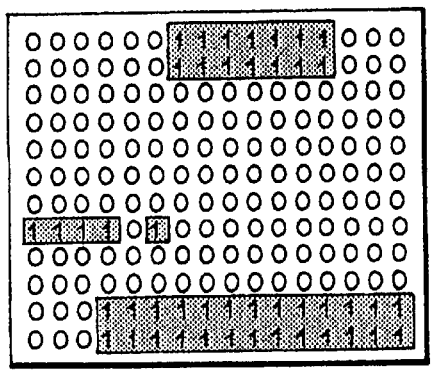
Figure 21E:
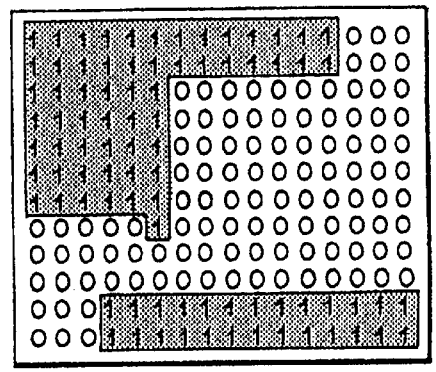
Figure 22A:
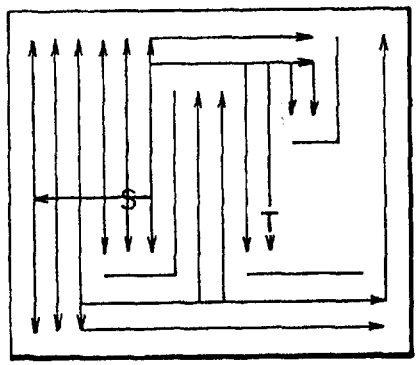
Figure 22F:
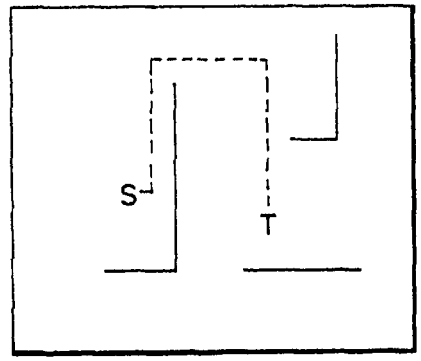
Figure 22B:
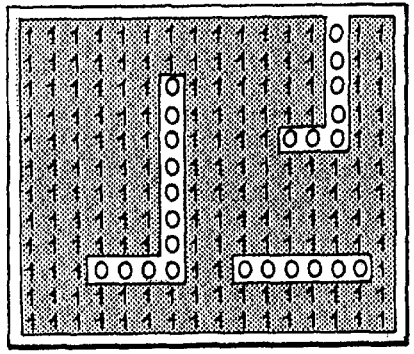
Figure 22C:
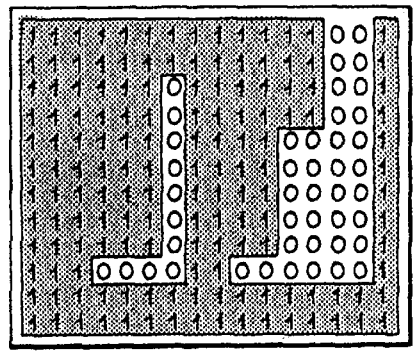
Figure 22D:
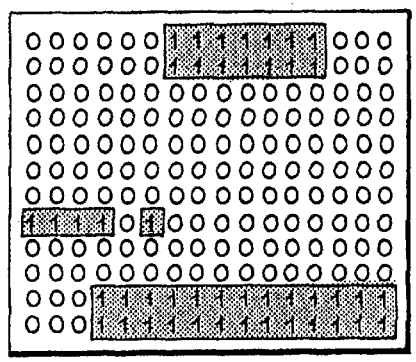
Figure 22E:
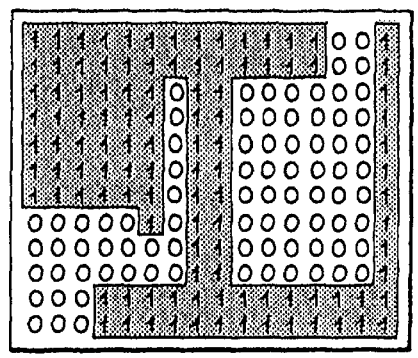

The foregoing available flag, arrival state flag, and arrival direction flag are arranged in such a table format that the byte address and bit number in the memory or the like directly represent the grid coordinates as shown in FIG. 17, in order to process in parallel the operation for segment search in the forward search processing step (step S14), which will be described later in detail.

Namely, in order that the operation of searching the segments in the forward search processing step (step S14) can be processed in parallel, each of the grids is expressed by one bit and the flags are arranged in a format as shown in FIG. 17 in this mode.

Here, a table 52 in FIG. 17 is arranged so that the current operation can be done by the parallel processing (parallel degree 8 in FIG. 17) for each one ward in the Y axis direction.

Further, to arrange the table 52 in FIG. 17 in such a format that the X axis is replaced with the Y axis and to hold the flags by the foregoing table can perform the current operation by the parallel processing for each one ward in the X axis direction.

In the wiring processing method in this mode, the forward search processing step (step S14) executes an adjoining grid flag processing procedure S15 in parallel.

Here, the adjoining grid flag processing procedure S15 operates to set the arrival state flag of an adjoining grid to "1", when the available flag is "1" and the arrival state flag is "0" as for the grid adjoining to the grid of which the arrival state flag is "1", and makes the arrival direction flag of the adjoining grid to indicate the search direction (namely, in accordance with the search direction, set the XY-direction flag and sign direction flag to "1" or "0").

Furthermore, the forward search processing step (step S14) repeats the adjoining grid flag processing procedure S15 until the grid of which the arrival state flag is "1" is not available as to the search segments, thereby the forward searching procedure is executed by producing the segments in sequence.

The backward search processing step (step S16) searches, after the arrival state flag of the grid to indicate the end of search becomes "1" (namely, after the search segment reaches the end point) in the forward search processing step (step S14), the wiring path in compliance with the arrival direction flag backward from the grid to indicate the end of search to the grid to indicate the start of search, thus finding out an optimum wiring path.

Figure 24:
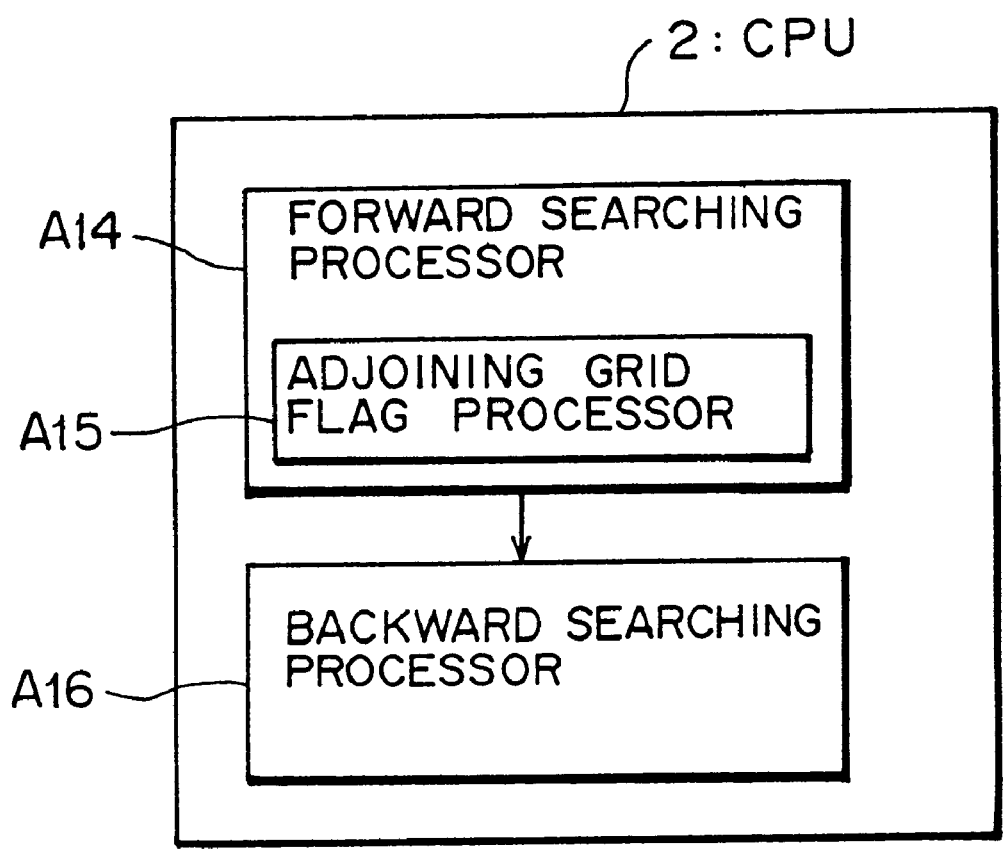
FIG. 24 is a functional block diagram for explaining the first mode of the wiring processing equipment for determining a wiring path according to the invention.

The wiring processing method of the foregoing steps (step S14, S16) is executed on the basis that the CPU 2 (refer to FIG. 1) of the interactive circuit designing equipment 1 has the functions equivalent to a forward searching processor A14 and backward searching processor A16 shown in FIG. 24.

The forward searching processor A14 is provided with an adjoining grid flag processor A15, which executes in parallel the foregoing adjoining grid flag procedure S15. Further, the adjoining grid flag processor A15 repeats to execute the adjoining grid flag processing procedure S15 until the grid of which the arrival state flag is "1" is not available as to the search segments, thereby forward searching processing is executed to produce the segments in sequence.

Further, the backward searching processor A16 searches, after the arrival state flag of the grid to indicate the end of search becomes "1" (namely, after the search segment reaches the end point) in the forward searching processor A14, the wiring path in compliance with the arrival direction flag backward from the grid to indicate the end of search to the grid to indicate the start of search, thus the backward searching procedure is executed by finding out an optimum wiring path.

And in practice, the functions equivalent to the processor A14, A16 can be achieved by the wiring processing program, stored in the hard disk 8, whereby the CPU 2 of the interactive circuit designing equipment 1 executes the procedures described later.

Here, the wiring processing program in this mode is a software whereby the interactive circuit designing equipment 1 executes the forward searching procedure and the backward searching procedure.

As for a grid adjoining to the grid obtained by dividing the wiring area into grids by the unit of the minimum wiring pitch on a circuit board, the grid of which the arrival state flag indicating the arrival of the search segment is "1", when the available flag indicating whether the grid is available for wiring or not is "1" and the arrival state flag is "0", the forward searching procedure executes in parallel the adjoining grid flag processing procedure S15 (refer to FIG. 23), whereby the arrival state flag of the adjoining gird is set to "1" and the arrival direction flag indicating the arrival direction in which the search segment has arrived at the adjoining grid is made to indicate the search direction (namely, in accordance with the search direction, to set the XY-direction flag and positive-negative direction flag to "1" or "0"). Furthermore, the forward search procedure repeats the adjoining grid flag processing procedure S15 until the grid of which the arrival state flag is "1" comes into nonexistence as to the search segments, thereby producing the segments in sequence.

The backward searching procedure searches, after the arrival state flag of the grid to indicate the end of search becomes "1" (namely, after the search segment reaches the end point) in the forward searching procedure, the wiring path in compliance with the arrival direction flag backward from the grid to indicate the end of search to the grid to indicate the start of search, thus finding out an optimum wiring path.

In the interactive circuit designing equipment 1 relating to the embodiment of the invention, the following operation based on the foregoing construction searches a wiring path and determines an optimum wiring path.

The method for determining a wiring path on a circuit board shown in FIG. 18 (a) will hereafter be described.

FIG. 18 (a) illustrates an initial state of a circuit board (a state before a wiring path is determined), in which the start point of search is indicated by S and the end point of search is indicated by T. Further, in FIG. 18 (a), wiring prohibited areas on the circuit board due to the presence of circuits and the like are illustrated by continuous lines.

The available flag, arrival state flag, XY-direction flag, and positive-negative direction flag at the initial state of the circuit board shown in FIG. 18 (a) each are illustrated in FIG. 18 (b) through FIG. 18 (e).

In FIG. 18 (b) through FIG. 18 (e), the grid of the flag "1" is shown with a half-tone dot meshing. As shown in FIG. 18 (b), the arrival state flag at the start point S is set to "1" at the initial state.

In the interactive circuit designing equipment 1, when, as for the arrival state flag of "1", the available flag of the grid adjoining in the direction searching the grid is "1" and the arrival state flag is "0", the forward search processing step (step S14) sets "1" to the arrival state flag of the adjoining grid and records the search direction into the arrival direction flag.

In the forward search processing step (step S14), the foregoing operation is continued until the grid of which the arrival state flag is set to "1" comes into nonexistence as to the search segments.

When a wiring path is determined on a wiring on a circuit board as shown in FIG. 18 (a), first, as shown in FIG. 19 (a), a search segment is produced in the X axis direction from the start point S (search level 1). At this moment, the available flag, arrival state flag, XY-direction flag, and positive-negative direction flag each are illustrated in FIGS. 19 (b) through (e).

Next, as shown in FIG. 20 (a), a search segment is produced in the Y axis direction from the search segment produced in the foregoing search level 1 (search level 2). In this search level 2 and the subsequent search level (search level 3, 4), if the search segment is produced in parallel, the processing speed will increase. Here, the available flag, arrival state flag, XY-direction flag, and positive-negative direction flag each are illustrated in FIGS. 20 (b) through (e).

Further, as shown in FIG. 21 (a), a search segment is produced in the X axis direction from the search segment produced in the foregoing search level 2 (search level 3). Here, the available flag, arrival state flag, XY-direction flag, and positive-negative direction flag each are illustrated in FIGS. 21 (b) through (e).

Furthermore, as shown in FIG. 22 (a), a search segment is produced in the Y axis direction from the search segment produced in the foregoing search level 3 (search level 4). Here, the available flag, arrival state flag, XY-direction flag, and positive-negative direction flag each are illustrated in FIGS. 22 (b) through (e).

After the search segment reaches the end point T, as shown in FIG. 22 (f), the backward search processing step (step S16) searches a wiring path backward from the end point T to the start point S in accordance with the arrival direction flag, thereby, determining an optimum wiring path.

Thus, according to the first mode of the wiring processing method for determining a wiring path in the interactive circuit designing equipment 1 relating to the embodiment of the invention, the available flag, arrival state flag, and arrival direction flag are arranged, as shown in FIG. 17, such that the byte address and bit number in the memory and the like directly indicate the coordinates of the grid. Thereby, the forward search processing step (step S14) can process the operations in parallel in a high speed, thus significantly reducing time for searching a wiring path.

(b5) Description on the second Mode of the Wiring Processing Method for Determining a Wiring Path Next, the second mode on the wiring processing method for determining an optimum wiring path in connecting the circuits on an LSI will be described as a wiring processing method in the interactive circuit designing equipment 1 relating to the embodiment of the invention.

Figure 27:
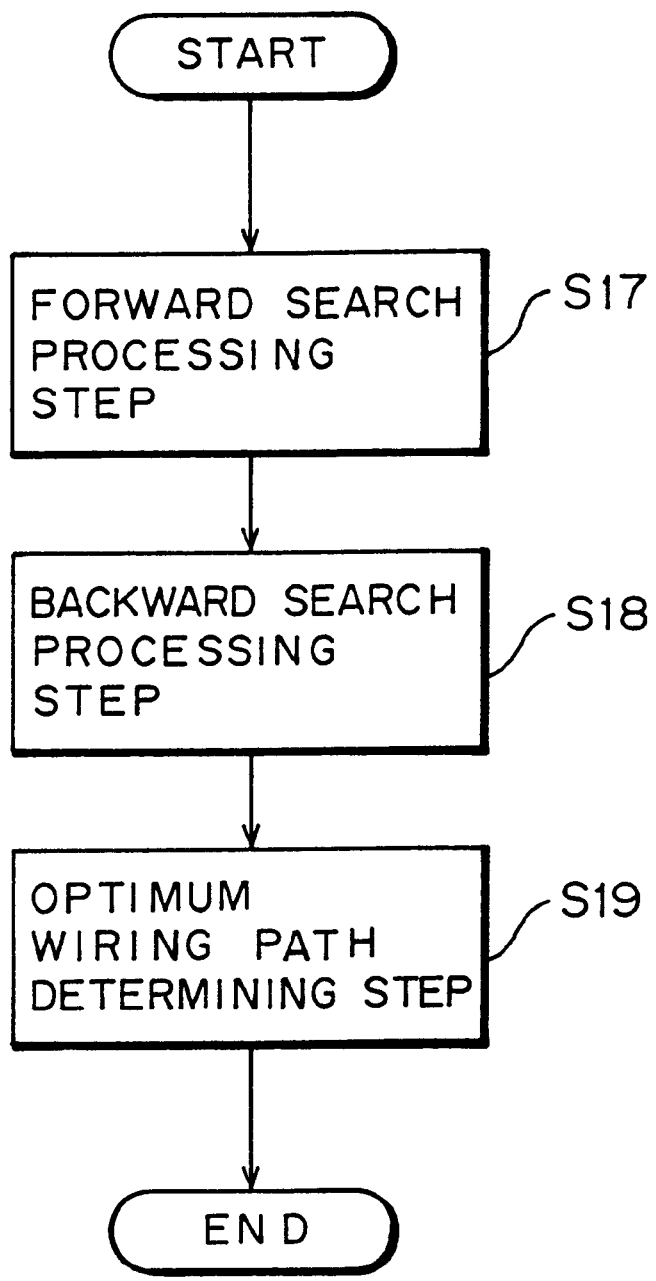
FIG. 27 is a flow chart for explaining the second mode of the wiring processing method for determining a wiring path according to the invention.

The wiring processing method for determining a wiring path in this mode comprises, as shown in FIG. 27, a forward search processing step (step S17), backward search processing step (step S18), and optimum wiring path determining step (step S19).

First, in this mode, in determining a wiring path on a circuit board, an arrival direction flag is provided in advance in the hard disk 8 or the memory not illustrated of the interactive circuit designing equipment 1 shown in FIGS. 1, 2.

Here, the arrival direction flag is to indicate the direction in which the search segment has arrived at the grid made by dividing the wiring area into grids by the unit of the minimum wiring pith.

The arrival direction flag is provided with a flag that indicates the arrival of the search segment by "1" for each of the directions of the grids.

For example, in one layer wiring, if the X and Y axis are defined as the horizontal and vertical direction, respectively, the flags are provided to each of the positive and negative direction of the X axis and the positive and negative direction of the Y axis.

Figure 25A:
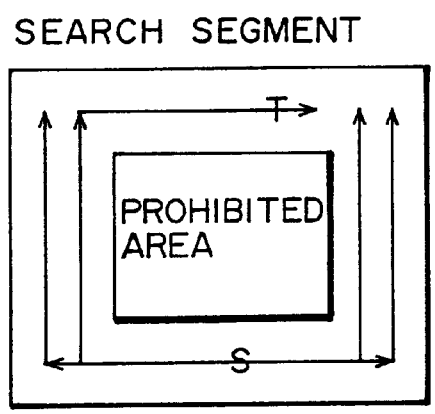
FIGS. 25(a), 25(b), FIGS. 26(a) and 26(b) are illustrations for explaining the second mode of the wiring processing method for determining a wiring path according to the invention.
Figure 25B:
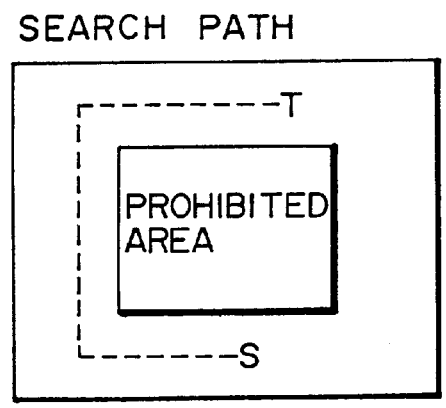

In case a plurality of wiring paths are not designed to be searched, a wiring path first searched is selected as the wiring path [the wiring path reached from left to the end point T, in case of FIG. 25 (*a*)], and therefore, a wiring path which is not optimum is possibly selected.

Figure 26A:
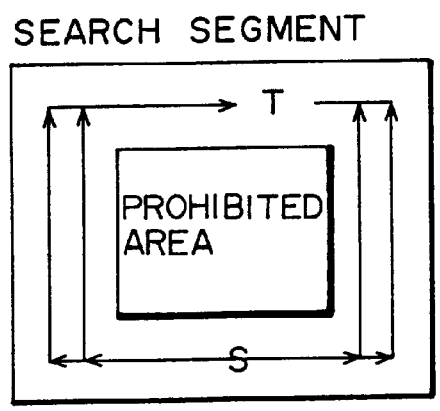
Figure 26B:
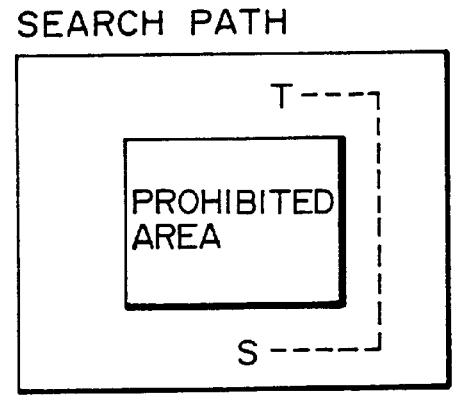

Therefore, in this embodiment, a plurality of wiring paths are searched, as shown in FIG. 26 (*a*), and the optimum wiring path is designed to be selected among a plurality of the wiring paths [the wiring path of which the wiring length is the shortest, in case of FIG. 26 (*b*)]; in order to accomplish the foregoing, the arrival direction flag is composed of four types of flags indicating that the search segments arrive from the directions.

The forward search processing step (step S17) searches the grids forward in determining a wiring path on a circuit board as shown in FIG. 26 (*a*), while indicating a plurality of the search directions on the arrival direction flag.

Namely, in the forward search processing step (step S17), when the search segments arrive at the grids from a plurality of directions, the arrival direction flag corresponding to the arriving direction is set to "1".

The backward search processing step (step S18) searches, after the arrival state flag of the grid to indicate the search end point becomes "1" (namely, after the search segment reaches the end point) in the forward search processing step (step S17), the wiring path in compliance with the arrival direction flag backward from the grid to indicate the search end point T to the grid to indicate the search start point S as shown in FIG. 26 (*a*), thus finding out a plurality of the wiring paths [four wiring paths in FIG. 26 (*a*)].

Further, the optimum wiring path determining step (step S19) gives the wiring lengths and costs of a plurality of the wiring paths obtained by the backward search step (step S18), and determines an optimum wiring path as shown in FIG. 26 (*b*).

Concretely, the optimum wiring path determining step (step S19) determines the wiring path of which the wiring length or the wiring cost is minimum as the optimum.

Figure 28:
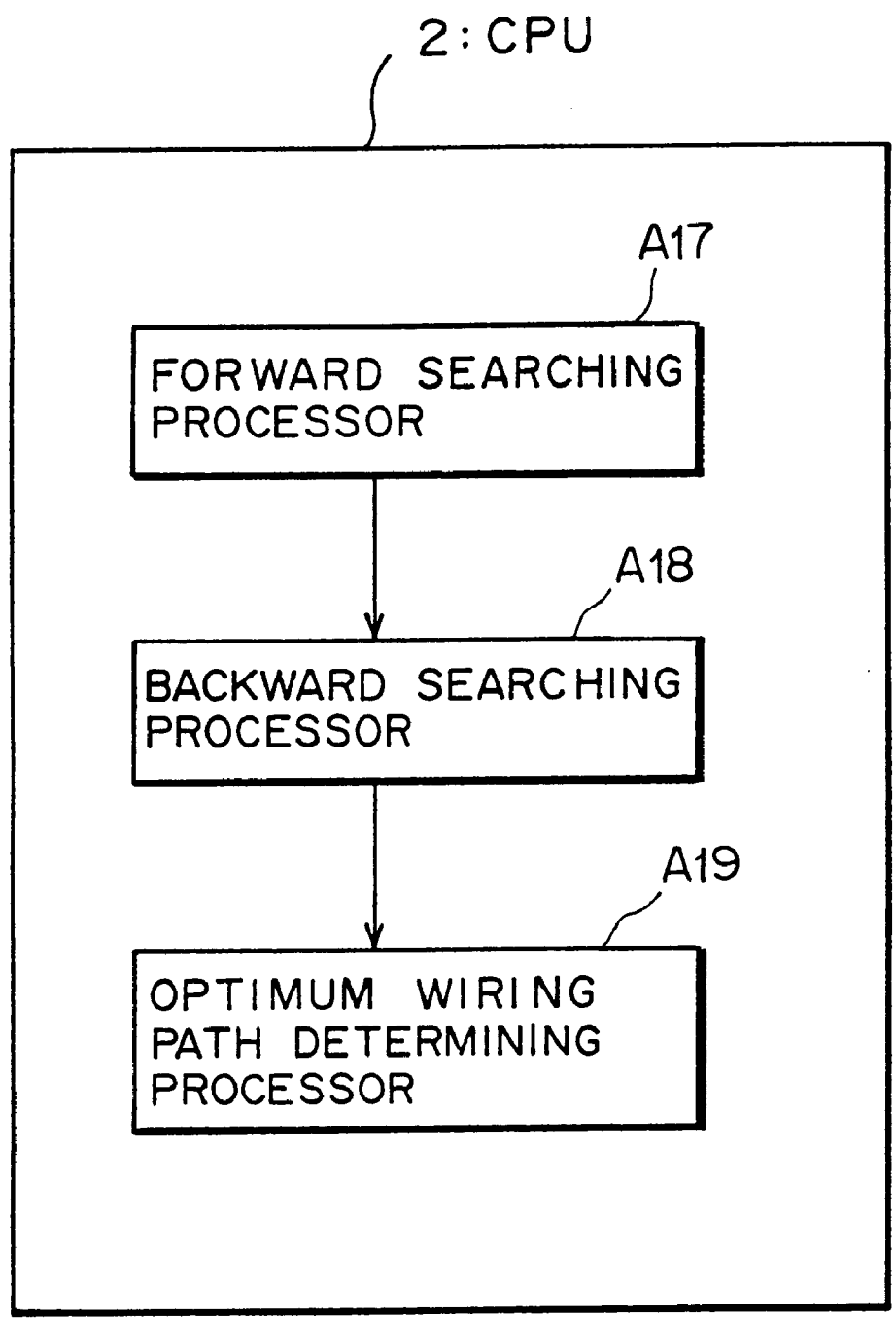
FIG. 28 is a functional block diagram for explaining the second mode of the wiring processing equipment for determining a wiring path according to the invention.

The wiring processing method consisting of the foregoing steps (step S17 through S19) is executed on the basis that the CPU 2 (refer to FIG. 1) of the interactive circuit designing equipment 1 has the functions equivalent to a forward search processor A17, backward search processor A18, and optimum wiring path determining processor A19, as shown in FIG. 28.

The forward search processor A17 searches forward the grids obtained by dividing the wiring area into grids by the unit of the minimum wiring pith in determining a wiring path on a circuit board as shown in FIG. 26 (*a*), while indicating a plurality of the search directions on the arrival direction flag indicating the arrival direction of the search segment.

Further, the backward search processor A18 searches, after the arrival state flag of the grid to indicate the search end point becomes "1" in the forward search processor A 17 (namely, after the search segment reaches the end point), the wiring path in compliance with the arrival direction flag backward from the grid to indicate the search end point T to the grid to indicate the search start point S as shown in FIG. 26 (*a*), thus finding out a plurality of the wiring paths [four wiring paths in FIG. 26 (*a*)].

Furthermore, the optimum wiring path determining processor A19 acquires the wiring length or wiring cost of a plurality of the wiring paths obtained by the backward search processor A18, and thereby determines, as shown in FIG. 26 (*b*), a wiring path that the wiring length or wiring cost is the minimum as an optimum wiring path.

And in practice, the functions equivalent to the processor A17 through A19 can be achieved by the wiring processing program, stored in the hard disk 8, whereby the CPU 2 of the interactive circuit designing equipment 1 executes the procedures described later.

Here, the wiring processing program in this mode is a software whereby the interactive circuit designing equipment 1 executes the forward search procedure, backward search procedure, and the optimum wiring path determining procedure.

The forward searching procedure searches forward the grids obtained by dividing the wiring area into grids by the unit of the minimum wiring pitch in determining a wiring path on a circuit board as shown in FIG. 26 (*a*), while indicating a plurality of the search directions on the arrival direction flag indicating the arrival directions of the search segments.

Further, the backward searching procedure searches, after the arrival state flag of the grid to indicate the search end point becomes "1" in the forward searching procedure (namely, after the search segment reaches the end point), the wiring path in compliance with the arrival direction flag backward from the grid to indicate the search end point T to the grid to indicate the search start point S as shown in FIG. 26 (*a*), thus finding out a plurality of the wiring paths [four wiring paths in FIG. 26 (*a*)].

Furthermore, the optimum wiring path determining procedure acquires the wiring length or wiring cost of a plurality of the wiring paths obtained by the backward search procedure, and thereby determines, as shown in FIG. 26 (*b*), a wiring path that the wiring length or wiring cost is the minimum as an optimum wiring path.

Based on the foregoing arrangement in the interactive circuit designing equipment 1 relating to the embodiment of the invention, the following operation searches wiring paths and determines an optimum wiring path.

In the interactive circuit designing equipment 1, first, the forward search processing step (step S17) searches each of the grids forward while, in case search segments arrive at grids from a plurality of directions, setting the arrival flag corresponding to the directions to "1".

The backward search processing step (step S18) searches, after the arrival state flag of the grid to indicate the search end point becomes "1" (namely, after the search segment reaches the end point) in the forward search processing step (step S17), wiring paths in compliance with the arrival direction flag backward from the grid to indicate the search end point T to the grid to indicate the search start point S as shown in FIG. 26 (*a*), thus finding out a plurality of the wiring paths.

In case of determining a wiring path on a circuit board as shown in FIG. 26 (*a*), the backward search processing step (step S18) searches wiring paths backward in compliance with the arrival direction flag so as to find out four wiring paths.

Furthermore, in the backward search processing step (step S18), when a plurality of the wiring paths are searched, the optimum wiring path determining step (step S19) determines an optimum wiring path from these plural wiring paths, as shown in FIG. 26 (*b*).

In case of determining a wiring path on a circuit board as shown in FIG. 26 (*a*), the optimum wiring path determining step (step S19) acquires a wiring length of each of the wiring paths obtained by the backward search processing step (step S18), and thereby determines an wiring path of which the wiring length is the shortest.

Thus, according to the second mode of the wiring processing method for determining a wiring path in the interactive circuit designing equipment 1, the arrival direction flag is designed to indicate the arrival direction of the search segment to the grid (concretely, the arrival direction flag is composed of four types of flags to indicate the arrival of the segments from each direction to the grid). Thereby, a plurality of the wiring paths can be searched so as to select an optimum wiring path among them, and therefore, the wiring length can be minimized to improve the wiring quality.

Further, based on the wiring congestion degree in each divided area in case a wiring area is divided into smaller areas and the delay value of each wiring layer in case plural wiring layers are provided, the wiring cost can also be set for each of the grids. With this arrangement, the foregoing optimum wiring path determining step (step S19) can determine an optimum wiring path in which wiring quality and circuit performance are considered.

(b6) Description on the third Mode of the Wiring Processing Method for Determining a Wiring Path The third mode of the wiring processing method for determining an optimum wiring path in connecting the circuits on an LSI will be described as a wiring method in the interactive circuit designing equipment 1 relating to the embodiment of the invention.

In this mode, to determine an optimum wiring path, a wiring congestion degree is estimated as a wiring possibility before executing a wiring at the stage where a circuit layout finishes, and according to the wiring congestion degree, the circuit layout is appropriately modified.

Figure 30:
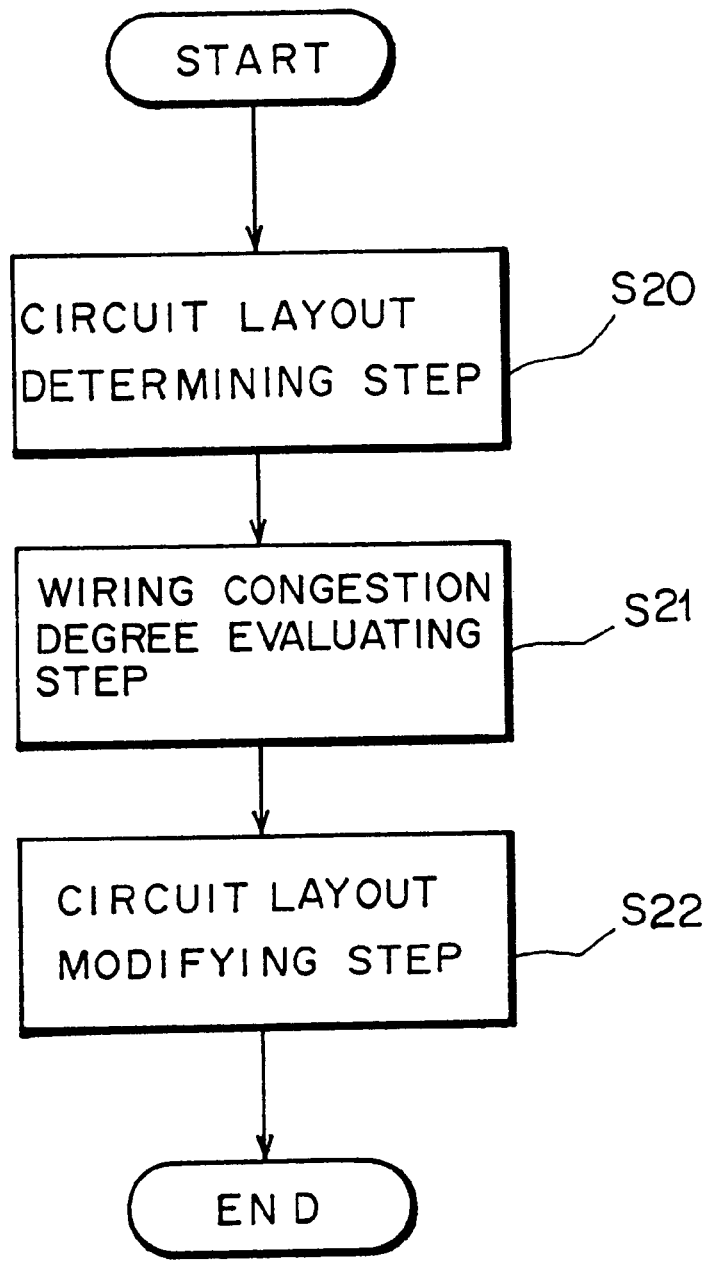
FIG. 30 is a flow chart for explaining the third mode of the wiring processing method for determining a wiring path according to the invention.

The wiring method for determining a wiring path in this mode comprises, as shown in FIG. 30, a circuit layout determining step (step S20), wiring congestion degree evaluating step (step S21), and circuit layout modifying step (step S22).

Here, the circuit layout determining step (step S20) determines a layout of a circuit on a circuit board. In this circuit layout determining step (step S20), the layout of a circuit on a circuit board is determined by a conventional method and the like.

The wiring congestion degree evaluating step (step S21) acquires, after the circuit layout determining step (step S20) determined the layout of a circuit, a wiring congestion degree of a wiring to connect circuits, and thereby evaluates the circuit layout determined by the circuit layout determining step (step S20).

The method for evaluating a wiring congestion degree in the wiring congestion evaluating step (step S21) will now be described.

Figure 29:
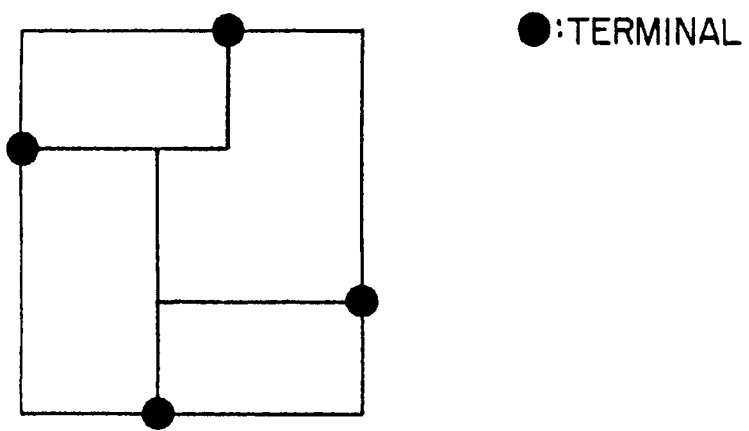
FIG. 29 is an illustration for explaining the third mode of the wiring processing method for determining a wiring path according to the invention.

First, a probability whereby a net made by wirings as shown in FIG. 29 occupies dots in a wiring area is considered.

The probability whereby the net occupies the dots in the wiring area can be expressed by means of an area S of a minimum rectangle including terminals (terminals are shown by · mark in FIG. 29) of the net to be wired and the theoretical length l of the net.

A probability $p_i$ whereby a net i of a theoretical length $l_i$ occupies dots inside the rectangle of an area Si is assumed to be $$p_i = l_i/S_i.$$

Here, assuming that the sum of the theoretical lengths $l_i$ is a total wiring length L, the total wiring length L is defined as the following equation.

$$L = \sum_i l_i$$

On the other hand, the number G of the dots used for the wirings when overlapping of the nets is allowed can be obtained by summarizing the following as to all the dots contained in all the wiring areas.

'probability of only one net using the dots'
+ 'probability of only two nets using the dots'
+ 'probability of only three nets using the dots'
+ 'probability of all the nets using the dots'

Here, 'probability of only one net using the dots' is given by the following equation.

$$\sum_i \left[ p_i \prod_j (1 - p_j) \right] \quad \text{here, } i \neq j.$$

And, 'probability of only two nets using the dots' is given by the following equation.

$$(1/2!) \sum \left[ p_i p_j \prod_{ij} (1 - p_k) \right]$$

here, $i \neq j$, $j \neq k$, $k \neq i$.

In the same manner as above, 'probability of only n nets using the dots' is given by the following equation.

$$(1/n!) \sum \frac{[p_i \cdots p_j \Pi(1 - p_k)]}{n}$$

The probability $p_i$ of the net $i$ of the theoretical length li occupying the dots is considered smaller than 1, and therefore, 'probability of only n nets using the dots' is considered to converge rapidly as n increases.

Therefore, the number G of the dots used for the wirings can be approximated using an appropriate number of the nets.

If, two wiring paths have an equal total wiring length L, one having a smaller number G of the dots used can be considered as having a larger wiring congestion degree, and therefore, as an evaluation scale of the wiring congestion degree, the following is considered.

(L−G)/L

Here, the total wiring length L is expressed as follows.

L=1×'probability of only one net using the dots'+ . . . + 'number of all the nets'×'probability of all the nets using the dots'

Accordingly, calculating L by ignoring the terms in which more than four probabilities of the probability $p_i$ of the net i of the theoretical length $l_i$ occupying the dots are multiplied in the foregoing equation, $$L - G = \Sigma[(\tfrac{1}{2})T_1^2 + (\tfrac{1}{2})T_1 T_2 - (\tfrac{1}{2}) T_2 - (\tfrac{1}{6})T_1^3 - (\tfrac{1}{3})T_3]$$

here, Σ means the sum in all the dots in the wiring area, $T_1 = \Sigma p_i$, $T_2 = \Sigma(p_i^2)$, $T3 = \Sigma(p_i^3)$.

Therefore, (L−G) can be calculated by using the sum of the products by the probability of each of the nets occupying a dot.

Thus, (L−G)/L is calculated, which will be used as a scale for evaluating the wiring congestion degree to improve a wiring possibility.

In this manner, the wiring congestion evaluating step (step S21) evaluates, after the circuit layout determining step (step S20) determines a layout of a circuit, the wiring congestion degree from the foregoing (L−G)/L: here, L is the total wiring length of the wirings to connect the circuits, G is the number of the dots used for wiring. Thereby, a circuit layout determined by the circuit layout determining step (step S20) is evaluated.

Further, the circuit layout modifying step (step S22) modifies, after the wiring congestion evaluating step (step S21) acquires a wiring congestion degree and evaluates a circuit layout, the circuit layout in accordance with the evaluation from the wiring congestion degree; and thereby, improves the circuit layout and optimizes the wiring areas. In this circuit layout modifying step (step S22), improving the layout and optimizing the wiring areas are done by means of a conventional method and the like.

In the interactive circuit designing equipment 1, after the circuit layout modifying step (step S22) modifies the circuit layout as needed, the wiring processing is made to produce an optimum wiring path.

Figure 31:
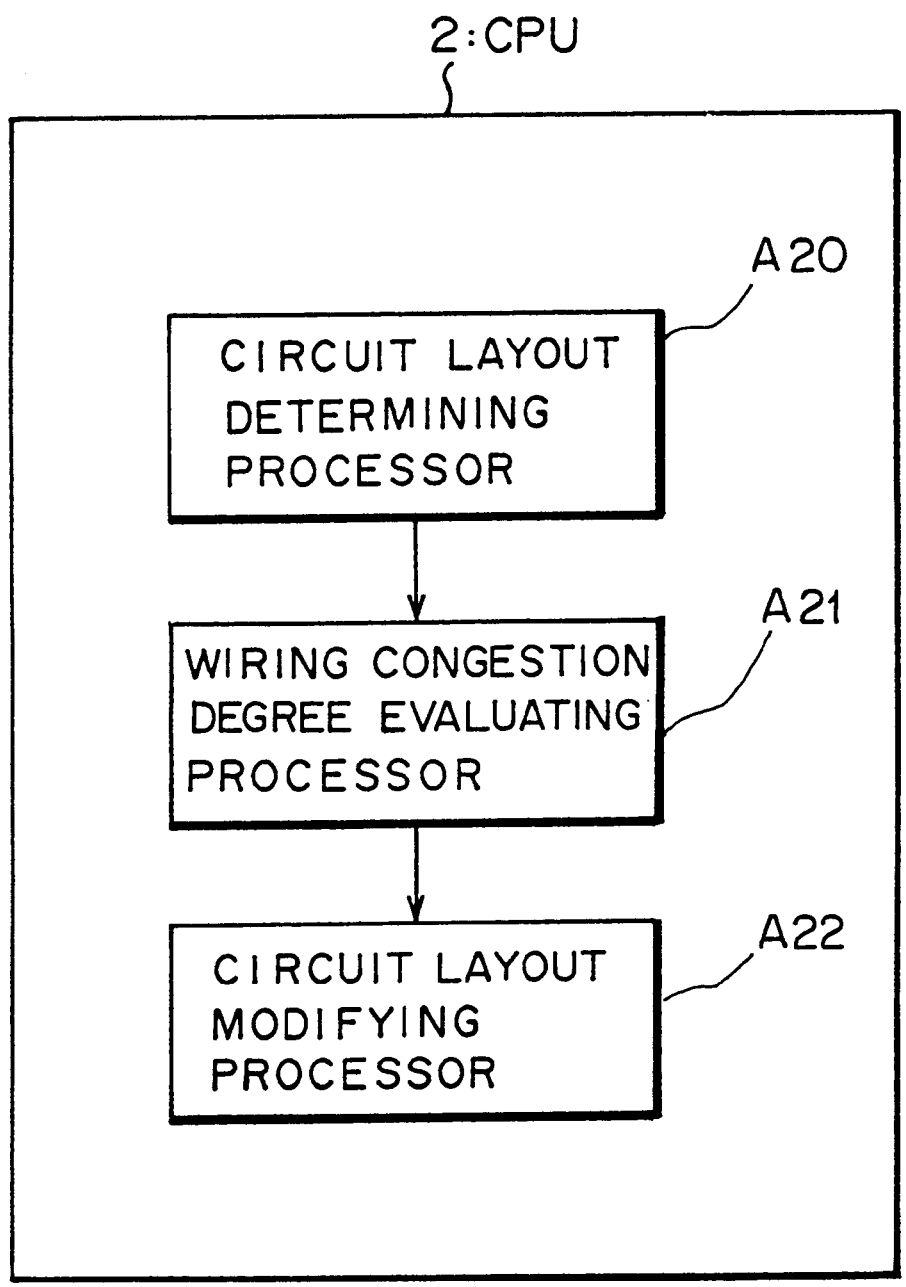
FIG. 31 is a functional block diagram for explaining the third mode of the wiring processing equipment for determining a wiring path according to the invention.
Figure 32:
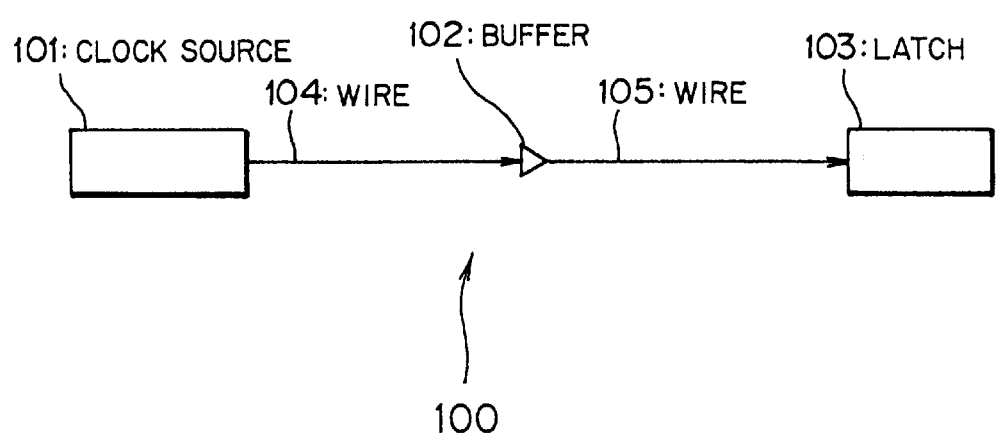
FIG. 32 is an illustration of a model for a clock tree with a buffer.

The wiring processing method consisting of the foregoing steps (step S20 through S22) is executed on the basis that the CPU 2 (refer to FIG. 1) of the interactive circuit designing equipment 1 has the functions equivalent to a circuit layout determining processor A20, wiring congestion degree evaluating processor A21, and circuit layout modifying processor A22, as shown in FIG. 31.

The circuit layout determining processor A20 determines a layout of a circuit on a circuit board.

The wiring congestion degree evaluating processor A21 evaluates, after the circuit layout determining processor A20 determines a layout of a circuit, the wiring congestion degree from the foregoing (L−G)/L: here, L is the total wiring length of the wirings to connect the circuits, G is the number of the dots used for wiring. Thereby, a circuit layout determined by the circuit layout determining processor A20 is evaluated.

Further, the circuit layout modifying processor A22 modifies, after the wiring congestion evaluating processor A21 acquires a wiring congestion degree and evaluates a circuit layout, the circuit layout in accordance with the evaluation from the wiring congestion degree; and thereby, improves the circuit layout and optimizes the wiring areas.

And in practice, the functions equivalent to the processor A20 through A22 can be achieved by the wiring processing program, stored in the hard disk 8, whereby the CPU 2 of the interactive circuit designing equipment 1 executes the procedures described later.

Here, the wiring processing program in this mode is a software whereby the interactive circuit designing equipment 1 executes the circuit layout determining procedure, wiring congestion degree evaluating procedure, and circuit layout modifying procedure.

The circuit layout determining procedure determines a layout of a circuit on a circuit board.

The wiring congestion degree evaluating procedure evaluates, after the circuit layout determining procedure determines the layout of the circuit, the wiring congestion degree from the foregoing (L−G)/L: here, L is the total wiring length of the wirings to connect the circuits, G is the number of the dots used for wiring. Thereby, a circuit layout determined by the circuit layout determining procedure is evaluated.

Further, the circuit layout modifying procedure modifies, after the wiring congestion degree evaluating procedure acquires a wiring congestion degree and evaluates a circuit layout, the circuit layout in accordance with the evaluation from the wiring congestion degree; and thereby, improves the circuit layout and optimizes the wiring areas.

Based on the foregoing arrangement, in the interactive circuit designing equipment 1 relating to the embodiment of the present invention, the following operation determines a circuit layout, evaluates the congestion degree of a circuit layout thus determined, and modifies the circuit layout in accordance with the evaluation from the congestion degree.

In the interactive circuit designing equipment 1, first, the circuit layout determining step (step S20) determines a layout of a circuit on a circuit board.

Next, after the circuit layout determining step (step S20) determines a layout of a circuit, the wiring congestion degree evaluating step (step S21) acquires a wiring congestion degree of the wirings to connect the circuits, and on the basis of this wiring congestion degree evaluates the circuit layout determined by the circuit layout determining step (step S20).

Furthermore, in accordance with the evaluation from the wiring congestion degree by the wiring congestion degree evaluating step (step S21), the circuit layout modifying step (step S22) appropriately modifies a circuit layout.

And, in the interactive circuit designing equipment 1, after a circuit layout is appropriately modified by the circuit layout modifying step (step S22), the wiring processing is made to produce an optimum wiring path.

Thus, according to the third mode of the wiring processing method for determining a wiring path in the interactive circuit designing equipment 1 relating to the embodiment of the invention, at the stage where a circuit layout is completed and before the wiring is executed, the wiring congestion degree is estimated to evaluate the wiring possibility, and the circuit layout is appropriately modified in accordance with an evaluation from this wiring congestion degree; thus determining an optimum wiring path.

Furthermore, the value (L−G)/L is calculated to evaluate a wiring congestion degree, and a wiring possibility can be estimated at the stage where a layout of the circuits is completed before the wiring is executed; and therefore, an early estimation and evaluation of the wiring possibility becomes possible which is strongly requested as a wiring objective becomes increasingly gigantic.

On the basis of the value (L−G)/L to evaluate the wiring congestion degree, the circuit layout is further modified to optimize the wiring areas.

What is claimed is:

1. A wire processing method for processing a wiring of clock nets connecting between two receivers on a clock distributing circuit of a clock synchronous circuit in which a clock is to be propagated from an external clock source to the two receivers along opposite routes of the wiring via a tapping point with a minimal delay difference, said method comprising the steps of:

(a) dividing the wiring into three or more series segments by two or more dividing points in such a manner that each segment is substantially uniform in impedance per unit length along its entire length, the impedance per unit length of each segment being different from that of any adjacent segment;

(b) obtaining a delay time of the clock from one dividing point at one end of each said segment to one receiver as a first delay time, a delay time of the clock from said one dividing point to the other receiver as a second delay time, a delay time of the clock from the other driving point at the other end of each said segment to said one receiver as a third delay time, and a delay time of the clock from said other dividing point to said other receiver an a fourth delay time;

(c) comparing said first delay time with said second delay time to obtain a first delay difference and also comparing said third delay time with said fourth delay time to obtain a second delay difference, and determining, among said segments, one segment in which the sign of a resultant value of subtraction of said first delay difference from said second delay difference is inverted from positive to negative or vice versa, as an equal delay segment on which the tapping point is to be located; and (d) determining an equal delay branch point in said equal delay segment as the tapping point via which the external clock source is to be connected to the wiring.

2. A wire processing method as claimed in claim 1, wherein the dividing points are physical points on the wiring.

3. A wire processing method as claimed in claim 1, wherein each of the segments is evaluated by a single Π-type RC circuit.

4. A wire processing method as claimed in claim 1, wherein in said determining of said equal delay branch segment, the first through the fourth delay time are given by the following equations:

$$\text{the first delay time} = \sum_{l=1}^{k-1}\left[r_i\left(\sum_{j=1}^{l}c_j - c_i/2 + C_A\right)\right] + t_A$$

$$\text{the second delay time} = \sum_{l=k}^{n}\left[r_i\left(\sum_{j=l}^{n}c_j - c_i/2 + C_B\right)\right] + t_B$$

$$\text{the third delay time} = \sum_{l=1}^{k}\left[r_i\left(\sum_{j=1}^{l}c_j - c_i/2 + C_A\right)\right] + t_A$$

$$\text{the fourth delay time} = \sum_{l=k+1}^{n}\left[r_i\left(\sum_{j=l}^{n}c_j - c_i/2 + C_B\right)\right] + t_B$$

where $r_i$: resistance across a segment
$c_j$: capacitance at a segment
$C_A$: capacitance at the one receiver
$C_B$: capacitance at the other receiver
$t_A$: delay time by the one receiver
$t_B$: delay time by the other receiver
k+1: total number of the branch points
k: first number of the branch points forming the equal delay branch segment.

5. A wire processing method as claimed in claim 1, wherein the equal delay branch point in said equal delay branch segment determining step is given by $[(t_B-t_A)+\alpha L(C_B+\beta L/2)]/[\alpha L(\beta K+C_A+C_B)]$ where

| | |
|---|---|
| L | wiring length between the two receivers |
| α | resistance for a unit length of the wiring |
| β | capacitance for a unit length of the wiring |
| $C_A$ | capacitance at the one receiver |
| $C_B$ | capacitance at the other receiver |
| $t_A$ | delay time by the one receiver |
| $t_B$ | delay time by the other receiver. |

6. A wire processing method for processing a wiring connecting between an external clock source and an equal delay branch point on a clock distributing circuit of a clock synchronous circuit, said method comprising (a) dividing the wiring into three more series segments by two or more dividing points in such a manner that each segment is substantially uniform in impedance per unit length along its entire length, the impedance per unit length of each segment being different from that of any adjacent segment;

(b) obtaining a delay time of each of said segments;

(c) obtaining a propagation delay time of the wiring based on said delay time of each said segment;

(d) comparing said propagation delay time of the wiring with a preset target value; and (e) if said propagation delay time does not coincide with said preset target value, adjusting the wire length of an arbitrary one of said segments so as to conform said propagation delay time to said target value.

7. A wire processing method as claimed in claim 6, wherein each of the segments is evaluated by a single Π-type RC circuit.

8. A wire processing method for processing a first wiring connecting between two receivers on a clock distributing circuit of a clock synchronous circuit in which a clock is to be propagated from an external clock source to the two receivers along opposite routes of the first wiring via a tapping point with a minimal delay difference, and a second wiring connecting between the external clock source and the tapping point, said method comprising the steps of:

(a) dividing the first wiring into three or more series first segments by two or more first dividing points in such a manner that each first segment is substantially uniform in impedance per unit length along its entire length, the impedance per unit length of each first segment being different from that of adjacent first segment;

(b) obtaining a delay time of the clock from one first dividing point at one end of each said first segment to one receiver as a first delay time, a delay time of the clock from said one first dividing point to the other receiver as a second delay time, a delay time of the clock from the other first dividing point at the other end of each said first segment to said one receiver as a third delay time, and a delay time of the clock from said other first dividing point to said other receiver as a fourth delay time;

(c) comparing said first delay time with said second delay time to obtain a first delay difference and also comparing said third delay time with said fourth delay time to obtain a second delay difference, and determining, among said first segments, one first segment in which the sign of a resultant value of subtraction of said first delay difference from said second delay difference is inverted from positive to negative or vice versa, as an equal delay segment on which the tapping point is to be located;

(d) determining an equal delay branch point in said equal delay segment as the tapping point via which the external clock source is to be connected to the first wiring via the second wiring;

(e) obtaining a delay time from the equal delay branch point to each of the two receivers as a fifth delay time;

(f) dividing the second wiring into three or more series second segments by two or more second dividing points in such a manner that each second segment is substantially uniform in impedance per unit length along its entire length, the impedance per unit length of each second segment being different from that of any adjacent second segment;

(g) obtaining a sixth delay time of each of said second segments;

(h) obtaining a propagation delay time of the second wiring based on said sixth delay time of each said second segment;

(i) comparing said propagation delay time of the second wiring with a preset target value: and (j) if said propagation delay time does not coincide with said preset target value, adjusting the wire length of an arbitrary one of said second segments so as to conform said propagation delay time to said target value.

9. A wire processing method as claimed in claim 8, wherein, in said adjusting of said wire length, the sum of the fifth delay time, the propagation delay time, and an external clock delay time at the external clock source is compared with a preset time, and based on the comparison result, the wire length of said arbitrary segment is adjusted.

10. A wire processing method for determining an optimal target path of wiring on a circuit board by a segment search method using flags, comprising the steps of:

(a) dividing a wiring area of the circuit board into a grid by units of a minimum pitch of the wiring;

(b) providing available flags one at each intersection of the grid for indicating whether an intersection of the grid is available for the wiring, arrival state flags one at each intersection of the grid for indicating whether a search segment has arrived at an intersection of the grid, and arrival direction flags one at each intersection of the grid for indicating a direction in which a search segment has arrived at an intersection of the grid;

(c) carrying out forward search by, for every stage of generation search segments, (i) generating a search segment so as to cause (1) the arrival state flag of the adjoining intersection to indicate the arrival of the search segment and (2) the arrival direction flag of the same adjoining intersection to indicate the direction of the search, if the available flag of an intersection of the grid adjoining one intersection whose arrival state flag indicates the arrival of a search segment and disposed on a side opposite to the direction of arrival indicated by the arrival direction flag of said one intersection indicates that the adjoining intersection is available and if the available flag of the adjoining intersection indicates that a search segment has not yet arrived, and (ii) repeating these two flag processing procedures in parallel until none of the intersections whose flags each indicate the arrival of the search segment remains; and (d) carrying out backward search by searching the target path of wiring backwardly from a desired intersection of the grid along the successive arrival direction flags.

11. A wire processing method for determining an optimal target path of wiring on a circuit board by a segment search method using flags, comprising the steps of:

(a) dividing a wiring area of the circuit board into a grid by units of a minimum pitch of the wiring;

(b) providing arrival direction flags one at each intersection of the grid for indicating two or more directions in which two or more search segments have arrived at an intersection of the grid;

(c) carrying out forward search by causing the arrival direction flag of each said intersection to indicate two or more directions of arrival of the search segments;

(d) carrying out backward search by searching candidate paths backwardly from a desired intersection of the grid in accordance with the indicated directions of the arrival direction flags; and (e) selecting one path, among said two or more candidate paths, as the optimal target path of wiring.

12. A wire processing equipment for processing a wiring of clock nets connecting between two receivers on a clock distributing circuit of a clock synchronous circuit in which a clock is to be propagated from an external clock source to the two receivers along opposite routes of the wiring via a tapping point with a minimal delay difference, said equipment comprising:

(a) a segment dividing processor for dividing the wiring into three or more series segments by two or more dividing points in such a manner that each segment is substantially uniform in impedance per unit length along its entire length, the impedance per unit length of each segment being different from that of any adjacent segment;

(b) means for obtaining a delay time of the clock from one dividing point at one end of each said segment to one receiver as a first delay time, a delay time of the clock from said one dividing point to the other receiver as a second delay time, a delay time of the clock from the other driving point at the other end of each said segment to said one receiver as a third delay time, and a delay time of the clock from said other dividing point to said other receiver as a fourth delay time;

(c) means for comparing said first delay time with said second delay time to obtain a first delay difference and also comparing said third delay time with said fourth delay time to obtain a second delay difference, and determining, among said segments, one segment in which the sign of a resultant value of subtraction of said first delay difference from said second delay difference is inverted from positive to negative or vice versa, as an equal delay segment on which the tapping point is to be located; and (d) an equal delay branch point determining processor for determining an equal delay branch point in said equal delay segment as the tapping point via which the external clock source is to be connected to the wiring.

13. A wire processing equipment for processor processing a wiring connecting between an external clock source and an equal delay branch point on a clock distributing circuit of a clock synchronous circuit, said equipment comprising:

(a) a segment dividing processor for dividing the wiring into three or more series segments by two or more dividing points in such a manner that each of said segments is substantially uniform in impedance per unit length along its entire length, the impedance per unit length of each segment being different from that of any adjacent segment;

(b) means for obtaining a delay time of each of said segments;

(c) a propagation delay time determining processor for obtaining a propagation delay time of the wiring based on said delay time of each said segment;

(d) means for comparing said propagation delay time of the wiring with a preset target value; and (e) a wiring length adjusting processor for determining if said propagation delay time does not coincide with said preset target value, and adjusting the wire length of an arbitrary one of said segments so as to conform said propagation delay time to said target value.

14. A wire processing equipment for processing a first wiring connecting between two receivers on a clock distributing circuit of a clock synchronous circuit in which a clock is to be propagated from an external clock source to the two receivers along opposite routes of the first wiring via a tapping point with a minimal delay difference, and a second wiring connecting between the external clock source and the tapping point, said equipment comprising:

(a) a first segment dividing processor for dividing the first wiring into three or more series first segments by two or more first dividing points in such a manner that each first segment is substantially uniform in impedance per unit length along its entire length, the impedance per unit length of each first segment being different from that of any adjacent segment;

(b) means for obtaining a delay time of the clock from one first dividing point at one end of each said first segment to one receiver as a first delay time, a delay time of the clock from said one first dividing point to the other receiver as a second delay time, a delay time of the clock from the other first dividing point at the other end of each said first segment to said one receiver as a third delay time, and a delay time of the clock from said other first dividing point to said other receiver as a fourth delay time;

(c) a propagation delay time determining processor for comparing said first delay time with said second delay time to obtain a first delay difference and also comparing said third delay time with said fourth delay time to obtain a second delay difference, and determining, among said first segments, one first segment in which the sign of a resultant value of subtraction of said first delay difference from said second delay difference is inverted from positive to negative or vice versa, as an equal delay segment on which the tapping point is to be located;

(d) an equal delay branch point determining processor for determining an equal delay branch point in said equal delay segment as the tapping point via which the external clock source is to be connected to the first wiring via the second wiring;

(e) a delay time determining processor for obtaining a delay time from the equal delay branch point to each of the two receivers as a fifth delay time;

(f) a second segment dividing processor for dividing the second wiring into three or more series second segments by two or more second dividing points in such a manner that each of said second segments is substantially uniform in impedance per unit length along its entire length, the impedance per unit length of each first segment being different from that of any adjacent segment;

(g) means for obtaining a sixth delay time of each of said second segments;

(h) a propagation delay time determining processor for obtaining a propagation delay time of the second wiring based on said sixth delay time of each said second segment;

(i) means for comparing said propagation delay time of the second wiring with a preset target value; and (j) a wiring length adjusting processor for determining if said propagation delay time does not coincide with said preset target value, and adjusting the wire length of an arbitrary one of said second segments so as to confirm said propagation delay time to said target value.

15. A wire processing equipment for determining an optimal target path of wiring on a circuit board by a segment search method using flags, said equipment comprising:

(a) means for dividing a wiring area of the circuit board into a grid by units of a minimum pitch of the wiring;

(b) means for providing available flags one at each intersection of the grid for indicating whether an intersection of the grid is available for the wiring, arrival state flags one at each intersection of the grid for indicating whether a search segment has arrived at an intersection of the grid, and arrival direction flags one at each intersection of the grid for indicating a direction in which a search segment has arrived at an intersection of the grid;

(c) a forward searching processor for carrying out forward search by, for every stage of generation search segments, (i) generating a search segment so as to cause (1) the arrival state flag of the adjoining intersection to indicate the arrival of the search segment and (2) the arrival direction flag of the same adjoining intersection to indicate the direction of the search, if the available flag of an intersection of the grid adjoining one intersection whose arrival state flag indicates the arrival of a search segment and disposed on a side opposite to the direction of arrival indicated by the arrival direction flag of said one intersection indicates that the adjoining intersection is available and if the available flag of the adjoining intersection indicates that a search segment has not yet arrived, and (ii) repeating these two flag processing procedures in parallel until none of the intersections whose flags each indicate the arrival of the search segment remains; and (d) a backward searching processor for carrying out backward search by searching the target path of wiring backwardly from a desired intersection of the grid along the successive arrival direction flags.

16. A wire processing equipment for determining an optimal target path of wiring on a circuit board by a segment search method using flags, said equipment comprising:

(a) means for dividing a wiring area of the circuit board into a grid by units of a minimum pitch of the wiring;

(b) means for providing arrival direction flags one at each intersection of the grid for indicating two or more directions in which two or more search segments have arrived at an intersection of the grid;

(c) a forward search processor for carrying out forward search by causing the arrival direction flag of each said intersection to indicate two or more directions of arrival of the search segments;

(d) a backward searching processor for carrying out backward search by searching candidate paths backwardly from a desired intersection of the grid in accordance with the indicated directions of the arrival direction flags; and (e) an optimum wiring path determining processor for selecting one path, among said two or more candidate paths, as the optimal target path of wiring.

17. A recording medium for a wiring processing program in which a wiring program is stored, whereby a computer executes:

(a) a segment dividing procedure for dividing the wiring into three or more series segments by two or more dividing points in such a manner that each segment is substantially uniform in impedance per unit length along its entire length, the impedance per unit length of each segment being different from that of any adjacent segment;

(b) a procedure for obtaining a delay time of the clock from one dividing point at one end of each said segment to one receiver as a first delay time, a delay time of the clock from said one dividing point to the other receiver as a second delay time, a delay time of the clock from the other driving point at the other end of each said segment to said one receiver as a third delay time, and a delay time of the clock from said other dividing point to said other receiver as a fourth delay time;

(c) a procedure for comparing said first delay time with said second delay time to obtain a first delay difference and also comparing said third delay time with said fourth delay time to obtain a second delay difference, and determining, among said segments, one segment in which the sign of a resultant value of subtraction of said first delay difference from said second delay difference is inverted from positive to negative or vice versa, as an equal delay segment on which the tapping point is to be located; and (d) an equal delay branch point determining procedure for determining an equal delay branch point in said equal delay segment as the tapping point via which the external clock source is to be connected to the wiring.

18. (Amended) A recording medium for a wiring processing program in which a wiring program is stored, whereby a computer executes:

(a) a segment dividing procedure for dividing the wiring into three or more series segments by two or more dividing points in such a manner that each of said segments is substantially uniform in impedance per unit length segment along its entire length, the impedance per unit length of each segment being different from that of any adjacent;

(b) a procedure for obtaining a delay time of each of said segments;

(c) a propagation delay time determining procedure for obtaining a propagation delay time of the wiring based on said delay time of each said segment;

(d) a procedure for comparing said propagation delay time of the wiring with a preset target value; and (e) a wiring length adjusting procedure for determining if said propagation delay time does not coincide with said preset target value, and adjusting the wire length of an arbitrary one of said segments so as to conform said propagation delay time to said target value.

19. A recording medium for a wiring processing program in which a wiring program is stored, whereby a computer executes:

(a) a first segment dividing procedure for dividing the first wiring into three or more series first segments by two or more first dividing points in such a manner that each first segment is substantially uniform in impedance per unit length along its entire length, the impedance per unit length of each first segment being different from that of any adjacent first segment;

(b) a procedure for obtaining a delay time of the clock from one first dividing point at one end of each said first segment to one receiver as a first delay time, a delay time of the clock from said one first dividing point to the other receiver as a second delay time, a delay time of the clock from the other first dividing point at the other end of each said first segment to said one receiver as a third delay time, and a delay time of the clock from said other first dividing point to said other receiver as a fourth delay time;

(c) a propagation delay time determining procedure for comparing said first delay time with said second delay time to obtain a first delay difference and also comparing said third delay time with said fourth delay time to obtain a second delay difference, and determining, among said first segments, one first segment in which the sign of a resultant value of subtraction of said first delay difference from said second delay difference is inverted from positive to negative or vice versa, as an equal delay segment on which the tapping point is to be located;

(d) an equal delay branch point determining procedure for determining an equal delay branch point in said equal delay segment as the tapping point via which the external clock source is to be connected to the first wiring via the second wiring;

(e) a delay time determining procedure for obtaining a delay time from the equal delay branch point to each of the two receivers as a fifth delay time;

(f) a second segment dividing procedure for dividing the second wiring into three or more series second segments by two or more second dividing points in such a manner that each of said second segments is substantially uniform in impedance per unit length along its entire length, the impedance per unit length of each first segment being different from that of any adjacent first segment;

(g) a procedure for obtaining a sixth delay time of each of said second segments;

(h) a propagation delay time determining procedure for obtaining a propagation delay time of the second wiring based on said sixth delay time of each said second segment;

(i) a procedure for comparing said propagation delay time of the second wiring with a preset target value; and (j) a wiring length adjusting procedure for determining if said propagation delay time does not coincide with said preset target value, and adjusting the wire length of an arbitrary one of said second segments so as to confirm said propagation delay time to said target value.

20. A recording medium for a wiring processing program in which a wiring program is stored, whereby a computer executes:

(a) a procedure for dividing a wiring area of the circuit board into a grid by units of a minimum pitch of the wiring;

(b) a procedure for providing available flags one at each intersection of the grid for indicating whether an intersection of the grid is available for the wiring, arrival state flags one at each intersection of the grid for indicating whether a search segment has arrived at an intersection of the grid, and arrival direction flags one at each intersection of the grid for indicating a direction in which a search segment has arrived at an intersection of the grid;

(c) a forward searching procedure for carrying out forward search by, for every stage of generation search segments, (i) generating a search segment so as to cause (1) the arrival state flag of the adjoining intersection to indicate the arrival of the search segment and (2) the arrival direction flag of the same adjoining intersection to indicate the direction of the search, if the available flag of an intersection of the grid adjoining one intersection whose arrival state flag indicates the arrival of a search segment and disposed on a side opposite to the direction of arrival indicated by the arrival direction flag of said one intersection indicates that the adjoining intersection is available and if the available flag of the adjoining intersection indicates that a search segment has not yet arrived, and (ii) repeating these two flag processing procedures in parallel until none of the intersections whose flags each indicate the arrival of the search segment remains; and (d) a backward searching procedure for carrying out backward search by searching the target path of wiring backwardly from a desired intersection of the grid along the successive arrival direction flags.

21. A recording medium for a wiring processing program in which a wiring program is stored, whereby a computer executes:

(a) a procedure for dividing a wiring area of the circuit board into a grid by units of a minimum pitch of the wiring;

(b) a procedure for providing arrival direction flags one at each intersection of the grid for indicating two or more directions in which two or more search segments have arrived at an intersection of the grid;

(c) a forward search procedure for carrying out forward search by causing the arrival direction flag of each said intersection to indicate two or more directions of arrival of the search segments;

(d) a backward searching procedure for carrying out backward search by searching candidate paths backwardly from a desired intersection of the grid in accordance with the indicated directions of the arrival direction flags; and (e) an optimum wiring path determining procedure for selecting one path, among said two or more candidate paths, as the optimal target path of wiring.

* * * * *